United States Patent
Tsutsui

(10) Patent No.: US 10,445,227 B2
(45) Date of Patent: Oct. 15, 2019

(54) SEMICONDUCTOR DEVICE, SENSOR DEVICE, AND ELECTRONIC DEVICE

(71) Applicant: Semiconductor Energy Laboratory Co., Ltd., Atsugi-shi, Kanagawa-ken (JP)

(72) Inventor: Naoaki Tsutsui, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/950,210

(22) Filed: Apr. 11, 2018

(65) Prior Publication Data

US 2018/0232302 A1 Aug. 16, 2018

Related U.S. Application Data

(63) Continuation of application No. 14/971,636, filed on Dec. 16, 2015, now Pat. No. 10,019,348.

(30) Foreign Application Priority Data

Dec. 18, 2014 (JP) .................................. 2014-255693

(51) Int. Cl.
*G06F 12/02* (2006.01)
*H02J 1/00* (2006.01)
(Continued)

(52) U.S. Cl.
CPC ............... *G06F 12/02* (2013.01); *H02J 1/00* (2013.01); *H02J 13/0003* (2013.01);
(Continued)

(58) Field of Classification Search
CPC ......... G06F 12/02; H02J 13/0003; H02J 1/00; H01L 27/1156; H01L 27/1104; H01L 27/0688
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Hayashikoshi.M et al., "Normally-Off MCU Architecture for Low-power Sensor Node", The 19th Asia and South Pacific Design Automation Conference, Jan. 21, 2014.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
(Continued)

*Primary Examiner* — Ajay Ojha
(74) *Attorney, Agent, or Firm* — Fish & Richardson P.C.

(57) ABSTRACT

A novel semiconductor device or a semiconductor device whose power consumption can be reduced is provided. The semiconductor device includes a sensor portion, a memory portion, and a control portion. The memory portion has functions of storing multiple detection data and sending them to the control portion. Therefore, a certain amount of detection data acquired through sensing by the sensor portion can be held, and the detection data can be sent to the control portion at a desired timing. Accordingly, in the semiconductor device, the control portion does not need to operate every time information is acquired, and thus, the power supply to the control portion can be completely or partially stopped.

10 Claims, 30 Drawing Sheets

(51) Int. Cl.
*H02J 13/00* (2006.01)
*H01L 27/06* (2006.01)
*H01L 27/11* (2006.01)
*H01L 27/1156* (2017.01)

(52) U.S. Cl.
CPC ....... *H01L 27/0688* (2013.01); *H01L 27/1104* (2013.01); *H01L 27/1156* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,543,169 B2 | 6/2009 | Yamaji et al. |
| 7,603,577 B2 | 10/2009 | Yamaji et al. |
| 7,674,650 B2 | 3/2010 | Akimoto et al. |
| 7,732,819 B2 | 6/2010 | Akimoto et al. |
| 8,692,579 B2 | 4/2014 | Kato |
| 8,729,545 B2 | 5/2014 | Takahashi |
| 8,760,903 B2 | 6/2014 | Fujita |
| 8,787,102 B2 | 7/2014 | Ishizu |
| 8,914,551 B2 | 12/2014 | Mortensen et al. |
| 8,929,161 B2 | 1/2015 | Matsuzaki |
| 8,995,218 B2 | 3/2015 | Koyama |
| 9,001,549 B2 | 4/2015 | Onuki |
| 9,037,890 B2 | 5/2015 | De Caro et al. |
| 9,293,174 B2 | 3/2016 | Koyama |
| 9,310,878 B2 | 4/2016 | Watanabe et al. |
| 9,483,108 B2 | 11/2016 | De Caro et al. |
| 9,812,178 B2 | 11/2017 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0138454 A1 | 6/2005 | Darmawaskita et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0282101 A1 | 11/2008 | Adams |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0254878 A1 | 10/2012 | Nachman et al. |
| 2012/0294060 A1 | 11/2012 | Ohshima et al. |
| 2013/0297874 A1 | 11/2013 | Kurokawa |
| 2013/0301331 A1 | 11/2013 | Onuki et al. |
| 2013/0314976 A1 | 11/2013 | Onuki |
| 2014/0184165 A1 | 7/2014 | Takahashi et al. |
| 2014/0297928 A1 | 10/2014 | Moschopoulos et al. |
| 2015/0048362 A1 | 2/2015 | Endo |
| 2015/0256177 A1 | 9/2015 | Kozuma et al. |
| 2015/0347287 A1 | 12/2015 | Tripathi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-187300 A | 7/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2005-084803 A | 3/2005 |
| JP | 2005-284596 A | 10/2005 |
| JP | 2013-214296 A | 10/2013 |
| JP | 2014-052801 A | 3/2014 |
| TW | 201405566 | 2/2014 |
| WO | WO-2004/114391 | 12/2004 |
| WO | WO-2014/018074 | 1/2014 |

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 13, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and It's Bending Properties", SID DIGEST '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 DIGEST, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT",

(56) References Cited

OTHER PUBLICATIONS

SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO SYSTEMS [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW'08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

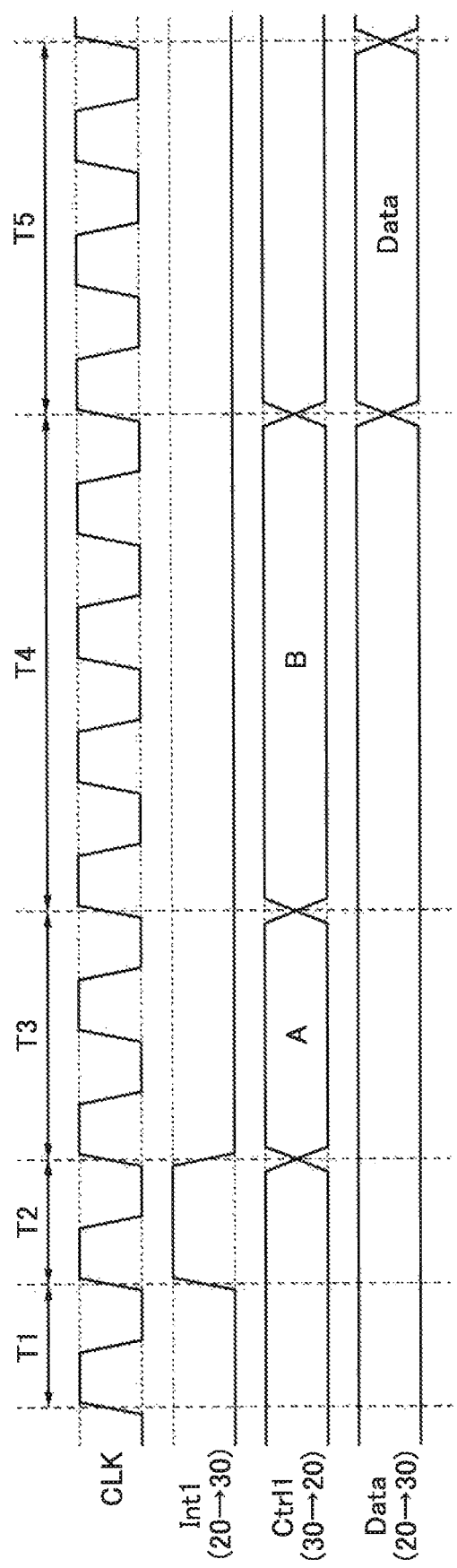

200

FIG. 25A
FIG. 25B
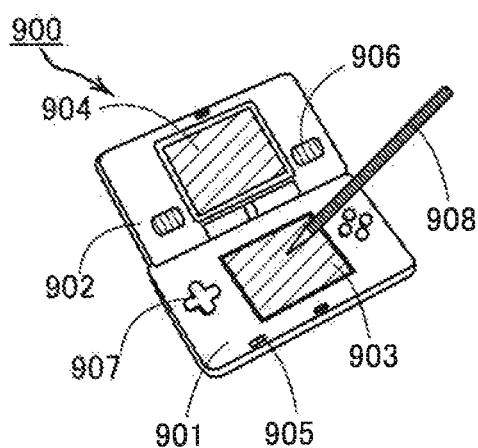
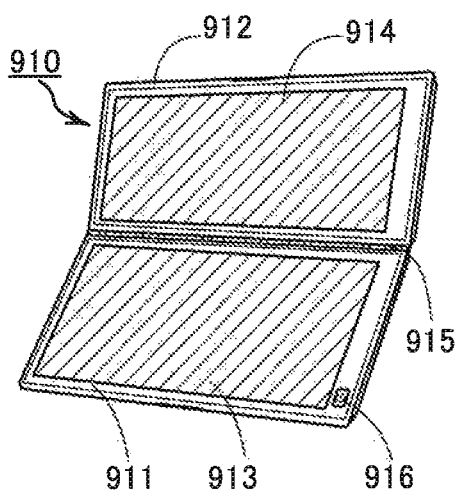
FIG. 25C
FIG. 25D
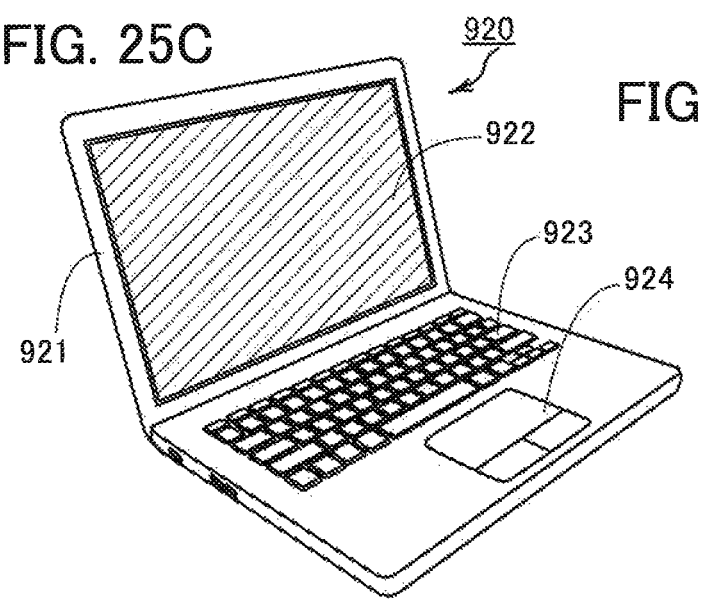
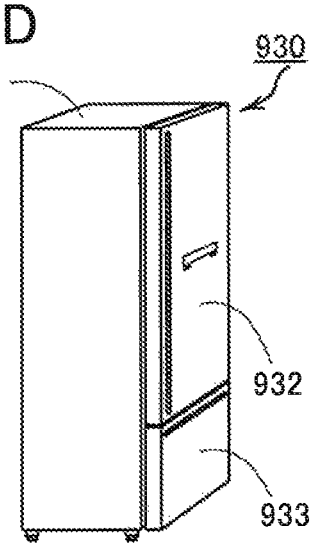
FIG. 25E
FIG. 25F
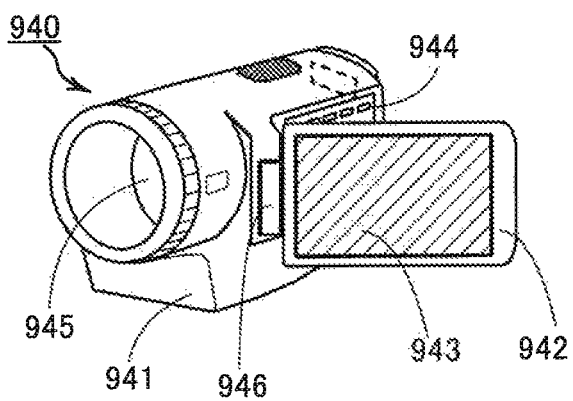
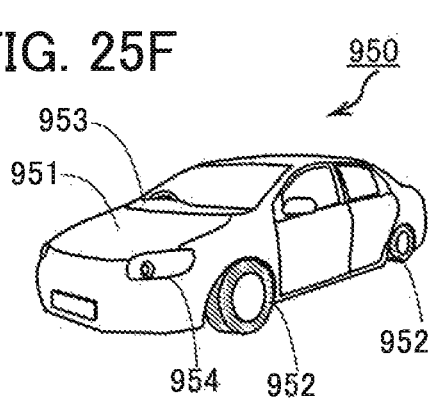

SEMICONDUCTOR DEVICE, SENSOR DEVICE, AND ELECTRONIC DEVICE

CROSS-REFERENCE TO RELATED APPLICATIONS

This application is a continuation of U.S. application Ser. No. 14/971,636, filed Dec. 16, 2015, now allowed, which claims the benefit of a foreign priority application filed in Japan as Serial No. 2014-255693 on Dec. 18, 2014, both of which are incorporated by reference.

BACKGROUND OF THE INVENTION

1. Field of the Invention

One embodiment of the present invention relates to a semiconductor device, a sensor device, and an electronic device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Another embodiment of the present invention relates to a semiconductor device, a display device, a light-emitting device, a power storage device, a memory device, a driving method thereof, or a manufacturing method thereof.

2. Description of the Related Art

In recent years, a variety of sensors for various applications have been provided, and these sensors are used in a wide range of electronic devices. A size reduction, a performance improvement, and the like of electronic devices have led to a growing demand for reducing the power consumption in information acquisition with sensors.

Patent Document 1 discloses a sensor device in which a sensor portion and a wireless transmitting portion are powered off in a predetermined period to reduce the power consumption.

REFERENCE

Patent Document

[Patent Document 1] Japanese Published Patent Application No. 2005-84803

SUMMARY OF THE INVENTION

To process data acquired by a sensor, a central processing unit (CPU) needs to extract the data from a sensor portion. However, the CPU needs to operate to extract data every time sensing is performed, resulting in an increase in the power consumption of the CPU.

Moreover, although the technique in Patent Document 1 attempts to reduce the power consumption of the sensor device by powering off the sensor portion and the wireless transmitting portion, a control portion including a CPU is not powered off. The power consumption of the CPU accounts for a large proportion of the power consumption of the entire sensor device; therefore, the above technique has only a limited effect in reducing the power consumption of the sensor device.

An object of one embodiment of the present invention is to provide a novel semiconductor device. Another object of one embodiment of the present invention is to provide a semiconductor device whose power consumption can be reduced. Another object of one embodiment of the present invention is to provide a highly reliable semiconductor device. Another object of one embodiment of the present invention is to provide a semiconductor device capable of highly accurate sensing.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

A semiconductor device of one embodiment of the present invention includes a first circuit, a second circuit, and a third circuit. The first circuit is configured to acquire information from the outside. The second circuit is configured to store data corresponding to the information acquired by the first circuit. The third circuit is configured to process the data. The third circuit is configured to be in a resting state in part of or the entire period in which the amount of data stored in the second circuit is below a reference value. The second circuit is configured to output the data to the third circuit when the amount of data stored in the second circuit reaches the reference value.

The semiconductor device of one embodiment of the present invention may have the following configuration. The second circuit includes a control circuit and a memory circuit. The control circuit is configured to control data writing to the memory circuit and data reading from the memory circuit. The memory circuit is configured to be in a resting state in part of or the entire period in which no data writing/reading is performed.

The semiconductor device of one embodiment of the present invention may have the following configuration. The memory circuit includes a memory region and a counter. The counter is configured to count the number of data sets stored in the memory region. The memory region includes a transistor and a capacitor. One of a source and a drain of the transistor is electrically connected to the capacitor. A channel formation region of the transistor includes an oxide semiconductor.

In the semiconductor device of one embodiment of the present invention, the third circuit may include a power management unit and a central processing unit.

A sensor device of one embodiment of the present invention includes the above semiconductor device.

An electronic device of one embodiment of the present invention includes the above semiconductor device or the above sensor device, and a lens, a display portion, or an operation key.

According to one embodiment of the present invention, a novel semiconductor device can be provided. According to another embodiment of the present invention, a semiconductor device whose power consumption can be reduced can be provided. According to another embodiment of the present invention, a highly reliable semiconductor device can be provided. According to another embodiment of the present invention, a semiconductor device capable of highly accurate sensing can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 3 is a timing chart illustrating an embodiment of the present invention.

FIGS. 25A to 25F each illustrate an embodiment of the present invention.

DETAILED DESCRIPTION OF THE INVENTION

Figure 1A:
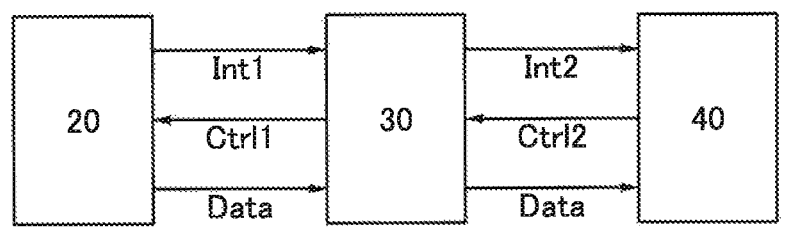
FIGS. 1A and 1B each illustrate an embodiment of the present invention.

Hereinafter, embodiments of the present invention will be described in detail with reference to the drawings. Note that the present invention is not limited to the description of the embodiments below, and it is easily understood by those skilled in the art that the mode and details can be variously changed without departing from the spirit and scope of the present invention. Therefore, the present invention should not be interpreted as being limited to the description of the embodiments below.

One embodiment of the present invention includes, in its category, devices including an integrated circuit, such as an imaging device, a radio frequency (RF) tag, and a display device. The display device includes, in its category, display devices including an integrated circuit, such as a liquid crystal display device, a light-emitting device in which a light-emitting element typified by an organic light-emitting element is provided in each pixel, electronic paper, a digital micromirror device (DMD), a plasma display panel (PDP), and a field emission display (FED).

In the description of the structures of the invention with reference to the drawings, the same reference numerals are used in common for the same portions in different drawings in some cases.

In this specification and the like, an explicit description "X and Y are connected" means that X and Y are electrically connected, X and Y are functionally connected, and X and Y are directly connected. Accordingly, without being limited to a predetermined connection relation, for example, a connection relation other than that shown in a drawing or text is also possible. Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) provided between X and Y.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase the signal amplitude, the amount of current, or the like, an operational amplifier, a differential amplifier circuit, a source follower circuit, or a buffer circuit; a signal generation circuit; a memory circuit; or a control circuit) can be connected between X and Y. For example, in the case where a signal output from X is transmitted to Y even when another circuit is provided between X and Y, X and Y are functionally connected. Note that the case where X and Y are functionally connected includes the case where X and Y are directly connected and the case where X and Y are electrically connected.

In this specification and the like, an explicit description "X and Y are electrically connected" means that X and Y are electrically connected (i.e., X and Y are connected with another element or another circuit provided therebetween), X and Y are functionally connected (i.e., X and Y are functionally connected with another circuit provided therebetween), and X and Y are directly connected (i.e., X and Y are connected without another element or another circuit provided therebetween). That is, in this specification and the like, the explicit description "X and Y are electrically connected" is the same as the explicit simple description "X and Y are connected".

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes, in its category, such a case where one conductive film has functions of a plurality of components.

Embodiment 1

In this embodiment, a configuration example of a semiconductor device of one embodiment of the present invention will be described.

<Configuration Example of Semiconductor Device>

FIG. 1A illustrates a configuration example of a semiconductor device 10 of one embodiment of the present invention. The semiconductor device 10 includes a sensor portion 20, a memory portion 30, and a control portion 40. The memory portion 30 is connected to the sensor portion 20 and the control portion 40. The semiconductor device 10 can be used as a sensor device.

The sensor portion 20 is a circuit which has a function of acquiring information from the outside. Specifically, a sensor which has a function of acquiring a predetermined physical or chemical quantity can be provided in the sensor portion 20.

Here, the physical quantity refers to temperature, pressure, flow rate, light, magnetism, sound wave, speed, acceleration, humidity, current, voltage, electric field, electric power, distance, angle, or the like. The chemical quantity refers to the amount of a gaseous chemical substance such as a gas, a liquid chemical substance such as an ion, or the like. The chemical quantity further includes the amount of an organic compound such as a certain biological material contained in blood, sweat, urine, or the like. In order to acquire a chemical quantity, the sensor portion 20 selectively detects a specific substance; therefore, a substance which reacts with the substance to be detected is preferably provided in the sensor portion 20 in advance. For example, in the case of detecting a biological material or a drug, it is preferable that an enzyme, an antibody molecule, a microbial cell, or the like which reacts with the biological material or drug to be detected be subjected to polymer immobilization or the like and provided in the sensor portion 20.

Examples of the sensor which can be provided in the sensor portion 20 include a temperature sensor, a humidity sensor, a strain sensor, a thermal flow sensor, a photosensor, a gas sensor, a pressure sensor, a displacement sensor, an acceleration sensor, a flow rate sensor, a rotation sensor, a density sensor, a gyroscope, an ultrasonic sensor, a fiber optic sensor, a biosensor, an odor sensor, a taste sensor, an iris sensor, a fingerprint sensor, a palm print sensor, and a vein sensor. Microelectromechanical systems (MEMS) may also be used for the sensor provided in the sensor portion 20.

The sensor portion 20 may have a function of acquiring biological information. Examples of the biological information include body temperature, blood pressure, pulse rate, the amount of sweat, lung capacity, blood sugar level, blood alcohol concentration, the number of white blood cells, the number of red blood cells, the number of platelets, hemoglobin concentration, hematocrit level, GOT(AST) level, GPT(ALT) level, γ-GTP level, LDL cholesterol level, HDL cholesterol level, and neutral fat level. The sensor portion 20 having a function of acquiring such biological information enables the semiconductor device 10 to be used as a healthcare system.

Note that the sensor portion may include two or more kinds of sensors.

The memory portion 30 has a function of storing data corresponding to the information acquired by the sensor portion 20 (hereinafter, such data is also referred to as detection data). Specifically, when the sensor portion 20 acquires information, an interrupt signal Int1 is sent from the sensor portion 20 to the memory portion 30. When the memory portion 30 receives the signal Int1, a control signal Ctrl1 is output from the memory portion 30 to the sensor portion 20. Then, in accordance with an instruction included in the signal Ctrl1, detection data Data is sent from the sensor portion 20 to the memory portion 30 and stored in the memory portion 30. Note that the signal Int1, the signal Ctrl1, and the detection data Data can be sent or received through a serial peripheral interface (SPI) or the like.

Here, the memory portion 30 has functions of storing multiple detection data and sending them to the control portion 40. Therefore, the memory portion 30 can hold a certain amount of detection data acquired through sensing by the sensor portion 20 and send it to the control portion 40 at a desired timing. Specifically, when the amount of detection data Data stored in the memory portion 30 reaches a predetermined reference value, an interrupt signal Int2 is sent from the memory portion 30 to the control portion 40. When the control portion 40 receives the signal Int2, a control signal Ctrl2 is output from the control portion 40 to the memory portion 30. Then, in accordance with an instruction included in the signal Ctrl2, the detection data Data is sent from the memory portion 30 to the control portion 40 and processed in the control portion 40. In this manner, the memory portion 30 has functions of accumulating and storing a certain amount of detection data Data and sending it as a batch to the control portion 40.

The control portion 40 is a circuit which has a function of performing various kinds of processing such as arithmetic operation with the use of the detection data which is acquired by the sensor portion 20 and input from the memory portion 30. The control portion 40 can include a CPU, a power management unit (PMU), a memory circuit, a clock signal generation circuit, and the like.

In the case where information acquired by the sensor portion 20 is directly sent to the control portion 40, the control portion 40 (e.g., the CPU in particular) needs to operate to extract detection data every time the sensor portion 20 acquires information. As a result, the power consumption of the control portion 40 is increased. In contrast, in one embodiment of the present invention, since a certain amount of detection data can be accumulated in the memory portion 30, the control portion 40 does not need to operate every time information is acquired; thus, a period in which the power supply to the control portion 40 is completely or partially stopped can be provided. Accordingly, the power consumption of the control portion 40 can be reduced. Hereinafter, the state in which the power supply to the control portion 40 is completely or partially stopped is also referred to as a resting state of the control portion 40, and the period in which the control portion 40 is in the resting state is also referred to as a resting period of the control portion 40.

Note that the resting period of the control portion 40 may be part of or the entire period in which the amount of detection data accumulated in the memory portion 30 is below a certain reference value.

Figure 1B:
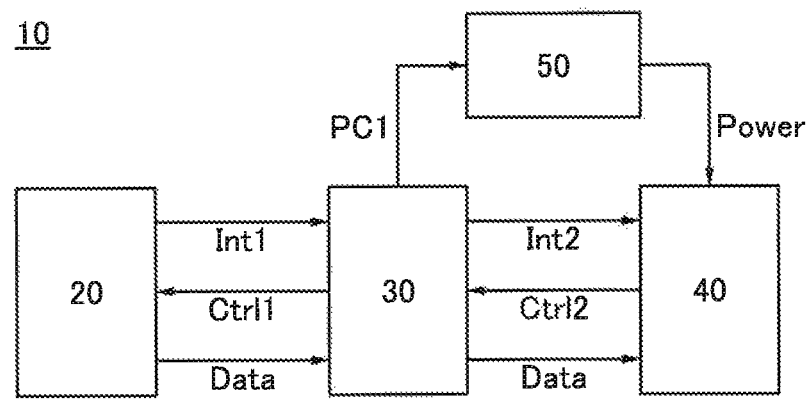

As illustrated in FIG. 1B, the semiconductor device 10 can be provided with a battery 50. The battery 50 has a function of supplying power to the control portion 40 in accordance with a control signal PC1 output from the memory portion 30.

<Configuration Example of Memory Portion>

Figure 2A:
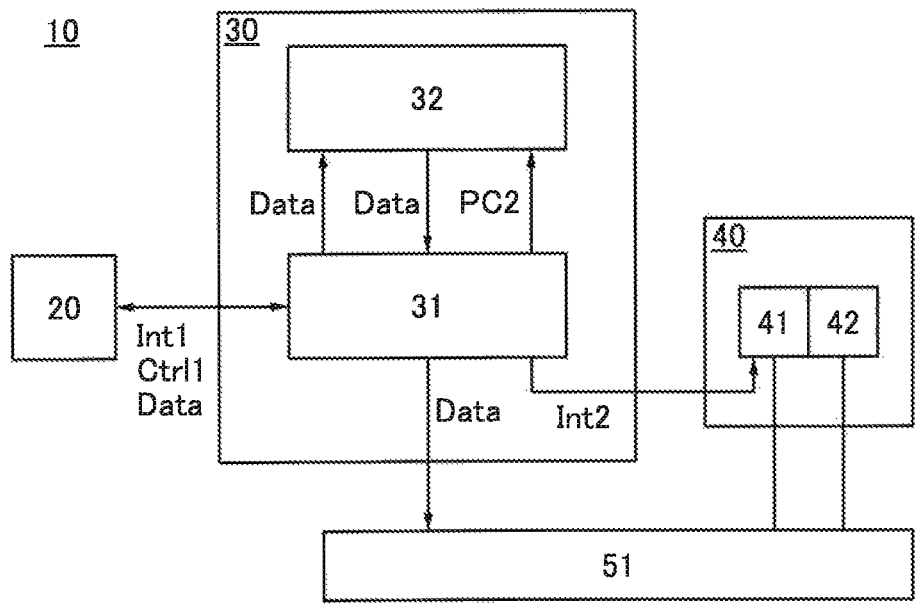
FIGS. 2A to 2D each illustrate an embodiment of the present invention.

FIG. 2A illustrates a specific configuration example of the memory portion 30 and the control portion 40. The memory portion 30 includes a control circuit 31 and a memory circuit 32. The control portion 40 includes a PMU 41 and a CPU 42. Note that the control circuit 31 is connected to the PMU 41 and the CPU 42 through a BUS 51.

The control circuit 31 has a function of reading out detection data. Specifically, the control circuit 31 has a function of reading out the detection data Data from the sensor portion 20 by outputting the signal Ctrl1 to the sensor portion 20 when receiving the signal Int1.

Furthermore, the control circuit 31 has a function of controlling the operation of the memory circuit 32. Specifically, the control circuit 31 has a function of writing the detection data Data from the sensor portion 20 to the memory circuit 32. In addition, the control circuit 31 has functions of reading out the detection data Data stored in the memory circuit 32 and outputting it to the control portion 40 through the BUS 51.

In the case where the amount of detection data Data stored in the memory circuit 32 is below the predetermined reference value, the detection data Data is accumulated in the memory circuit 32 without being read out. When the amount of detection data Data stored in the memory circuit 32 reaches the predetermined reference value, the detection data Data stored in the memory circuit 32 is read out by the control circuit 31 and output to the control portion 40.

Specifically, when the amount of detection data Data stored in the memory circuit 32 reaches the predetermined amount, the signal Int2 is input from the control circuit 31 to the PMU 41. When the interrupt signal Int2 is input to the PMU 41, power is supplied to the CPU 42. Then, the predetermined amount of detection data Data stored in the memory circuit 32 is read out by the control circuit 31 and output to the CPU 42 through the BUS 51. Note that the BUS 51 can be formed using a wiring, switch, and the like. Note that the signal Int2 may be input to the PMU 41 directly from the control circuit 31 or through the BUS 51.

The control circuit 31 may also have a function of controlling the power supply to the memory circuit 32. In the case where neither the sensing by the sensor portion 20 nor the reading of the detection data Data by the control circuit 31 is performed, no writing/reading operation is performed in the memory circuit 32. In such a period, it is preferable to supply a control signal PC2 from the control circuit 31 to the memory circuit 32 to stop the power supply to the memory circuit 32 completely or partially. Accordingly, the power consumption of the memory circuit 32 can be reduced. Hereinafter, the state in which the power supply to the memory circuit 32 is completely or partially stopped is also referred to as a resting state of the memory circuit 32, and the period in which the memory circuit 32 is in the resting state is also referred to as a resting period of the memory circuit 32.

Note that the resting period of the memory circuit 32 may be part of or the entire period in which no wiring/reading operation is performed in the memory circuit 32.

Figure 2B:
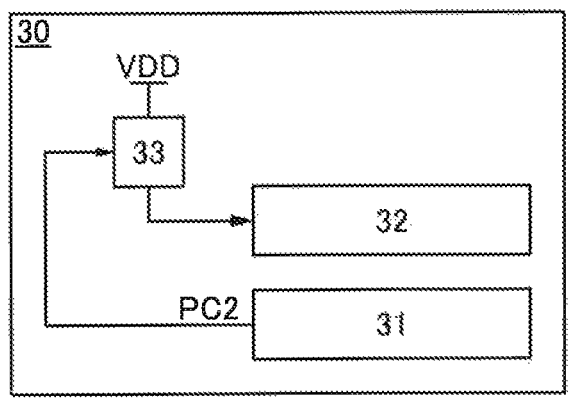

FIG. 2B illustrates a configuration in which a switch circuit 33 capable of stopping the power supply to the memory circuit 32 is provided. The control circuit 31 has a function of controlling the operation of the switch circuit 33. Specifically, the control circuit 31 has a function of controlling the conducting state of the switch circuit 33 by outputting the control signal PC2 to the switch circuit 33.

When the switch circuit 33 is turned on with the control signal PC2, a power supply potential is supplied from a power supply line VDD to the memory circuit 32 through the switch circuit 33. Thus, the writing/reading of detection data can be performed in the memory circuit 32. When the switch circuit 33 is turned off, the supply of the power supply potential to the memory circuit 32 is stopped. Thus, the memory circuit 32 can be brought into the resting state.

Figure 2C:
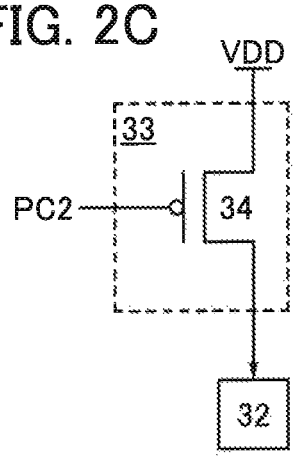
Figure 2D:
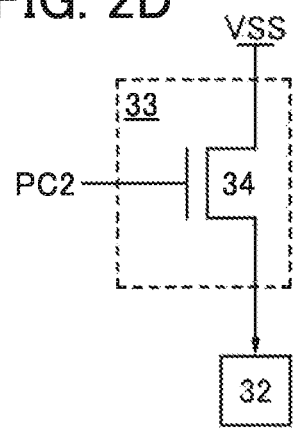

FIG. 2C illustrates an example in which the switch circuit 33 is formed using a transistor 34. In the example in FIG. 2C, the transistor 34 is a p-channel transistor, and the power supply line is a high-potential power supply line VDD; alternatively, as illustrated in FIG. 2D, the transistor 34 may be an n-channel transistor, and the power supply line may be a low-potential power supply line VSS.

A gate of the transistor 34 is connected to a wiring to which the control signal PC2 is input, one of a source and a drain of the transistor 34 is connected to the power supply line, and the other of the source and the drain of the transistor 34 is connected to the memory circuit 32. In FIG. 2C, when a high-level potential is supplied to the gate of the transistor 34 as the control signal PC2, the transistor 34 is turned off. In FIG. 2D, when a low-level potential is supplied to the gate of the transistor 34 as the control signal PC2, the transistor 34 is turned off. Thus, the power supply to the memory circuit 32 is stopped.

Note that a transistor whose channel formation region includes an oxide semiconductor (hereinafter also referred to as an OS transistor) can be used as the transistor 34. The OS transistor has much lower off-state current than a transistor whose channel formation region includes silicon (hereinafter also referred to as a Si transistor) or the like. Therefore, with the use of the OS transistor as the transistor 34, the power supplied to the memory circuit 32 in a period in which the transistor 34 is in the off state can be minimized, so that the power consumption can be reduced. Note that the OS transistor will be described in detail in Embodiments 2 to 4.

Note that the transistor 34 is not limited to the OS transistor. For example, a transistor whose channel formation region is formed in part of a substrate including a single crystal semiconductor can be used. As the substrate including a single crystal semiconductor, a single crystal silicon substrate, a single crystal germanium substrate, or the like can be used.

The transistor 34 can be a transistor whose channel formation region is formed in a semiconductor film including a material other than an oxide semiconductor. For example, a transistor whose channel formation region includes a semiconductor which is a non-single-crystal semiconductor and is not an oxide semiconductor can be used. Examples of such a non-single-crystal semiconductor include non-single-crystal silicon such as amorphous silicon, microcrystalline silicon, or polycrystalline silicon and non-single-crystal germanium such as amorphous germanium, microcrystalline germanium, or polycrystalline germanium.

Note that the transistors listed above can also be used as transistors in the following description.

The memory circuit 32 has a function of storing multiple detection data Data. The memory circuit 32 can have a simple configuration when a first-in, first-out (FIFO) memory circuit or the like is employed. When the amount of detection data Data accumulated in the memory circuit 32 reaches a certain amount, the detection data Data is output to the CPU 42 through the BUS 51.

Here, the memory circuit 32 is preferably formed using an OS transistor. In this case, leakage of data stored in the memory circuit 32 can be minimized, and the data can be held for a long time. Therefore, even in the resting period of the memory circuit 32, data stored in the memory circuit 32 can be held for a long time. Note that a specific configuration example of the memory circuit 32 including an OS transistor will be described in detail in Embodiment 2.

The PMU 41 has a function of controlling the power supply to the CPU 42. In the period in which the amount of detection data Data stored in the memory circuit 32 is below the predetermined reference value, the detection data Data is not sent to the CPU 42, and the CPU 42 does not process the detection data. Therefore, the power supply to the CPU 42 can be completely or partially stopped. When the amount of detection data stored in the memory circuit 32 reaches the predetermined reference value, the signal Int2 is output from the control circuit 31 to the PMU 41 to restart the power supply to the CPU 42. Hereinafter, the state in which the power supply to the CPU 42 is completely or partially stopped is also referred to as a resting state of the CPU 42, and the period in which the CPU 42 is in the resting state is also referred to as a resting period of the CPU 42.

Note that the resting period of the CPU 42 may be part of or the entire period in which the amount of detection data Data stored in the memory circuit 32 is below the reference value.

The CPU 42 has a function of performing various kinds of processing such as arithmetic operation with the use of the detection data. As the PMU 41 and the CPU 42, integrated circuits each of which includes a plurality of transistors can be used. Note that the plurality of transistors can be formed using a material similar to that of the transistor 34.

As described above, in one embodiment of the present invention, in the period in which the amount of detection data accumulated in the memory circuit 32 is below a certain amount, it is unnecessary to send the detection data from the memory circuit 32 to the control portion 40 through the control circuit 31; thus, a circuit in the control portion 40 (e.g., the CPU 42 in particular) can be in the resting state. Accordingly, the power consumption of the control portion 40 can be reduced.

<Operation Example of Semiconductor Device>

Figure 4:
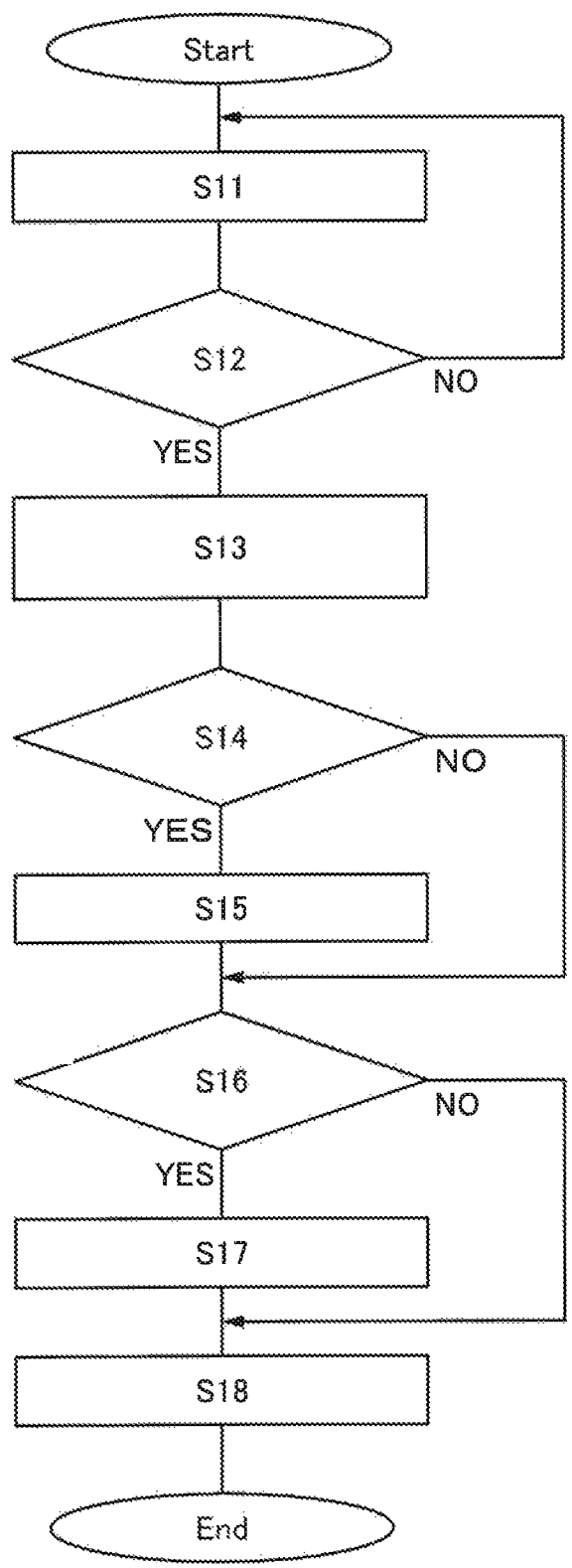
FIG. 4 is a flow chart illustrating an embodiment of the present invention.
Figure 5:
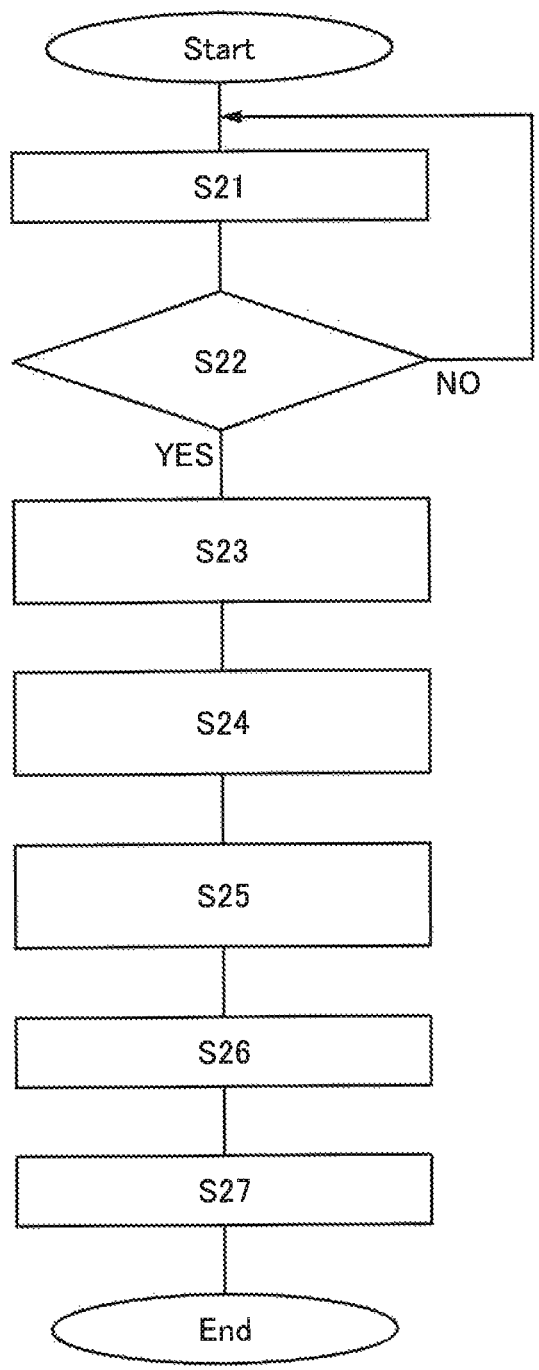
FIG. 5 is a flow chart illustrating an embodiment of the present invention.

Next, an operation example of the semiconductor device 10 in FIGS. 1A and 1B and FIG. 2A will be described with reference to FIG. 3, FIG. 4, and FIG. 5.

FIG. 3 is a timing chart illustrating the operation of the sensor portion 20 and the memory portion 30. As an example, the operation in the case where the signal transmission/reception between the sensor portion 20 and the memory portion 30 is performed through an SPI and a clock signal CLK is input to the sensor portion 20 will be described.

First, in Period T1, sensing by the sensor portion 20 is not performed, so that the signal Int1 is not output to the memory portion 30. In Period T1, the memory circuit 32 and the CPU 42 can be in the resting state.

Next, when the sensor portion 20 acquires information, the signal Int1 is output to the memory portion 30 (Period T2). When the memory portion 30 receives the signal Int1, the signal Ctrl1 is sent from the memory portion 30 to the sensor portion 20 (Period T3 and Period T4). Note that the following operation example is illustrated here: a control signal A for selecting information that is to be read out from among a plurality of pieces of information acquired by the sensor portion 20 is sent in Period T3, and a control signal B for specifying the address of the information that is to be read out from the sensor portion 20 is sent in Period T4.

After receiving the signal Ctrl1 including the control signal A and the control signal B, the sensor portion 20 sends the detection data Data to the memory portion 30 (Period T5). Thus, the detection data Data is stored in the memory portion 30.

Through the above operation, information acquired by the sensor portion 20 is accumulated in the memory portion 30.

Next, the operation of the control circuit 31 in FIGS. 2A and 2B will be described. FIG. 4 is a flow chart illustrating the operation of the control circuit 31 in the case where the detection data from the sensor portion 20 is written to the memory circuit 32.

First, the control circuit 31 is in the standby state until an interruption occurs (Step S11). When an interruption occurs and the signal Int1 is output from the sensor portion 20 (YES in Step S12), the control circuit 31 reads out the detection data Data from the sensor portion 20 (Step S13). The detection data Data is read out in accordance with the timing chart in FIG. 3. In the standby period (Step S11), in which no interruption occurs, the memory circuit 32 and the CPU 42 can be in the resting state.

Subsequently, the control circuit 31 determines whether the memory circuit 32 is in the resting state or not (Step S14). In the case where the memory circuit 32 is in the resting state, power is supplied to the memory circuit 32 to cancel the resting state (Step S15).

Subsequently, the control circuit 31 determines whether the amount of detection data stored in the memory circuit 32 has reached the predetermined reference value or not (or whether the memory circuit 32 is in a full state or not) (Step S16). In the case where the memory circuit 32 is in the full state, the full state is canceled (Step S17). To cancel the full state, for example, the detection data Data accumulated in the memory circuit 32 is output to the outside. Note that details of the operation for canceling the full state will be described with reference to FIG. 5. After the full state is canceled, the detection data Data is written to the memory circuit 32 (Step S18).

Note that the number of detection data sets stored in the memory circuit 32 can be counted by a counter or the like.

Through the above operation, the detection data can be written to the memory circuit 32.

Next, the operation of the control circuit 31 in the case where the detection data is sent from the memory circuit 32 to the CPU 42 will be described. FIG. 5 is a flow chart illustrating this operation.

First, until the memory circuit 32 reaches the full state, the control circuit 31 is in the standby state (Step S21). When the memory circuit 32 reaches the full state (YES in Step S22), the control circuit 31 outputs an interrupt signal (signal Int2) to the PMU 41 (Step S23). In the case where the CPU 42 is in the resting state at this time, power is supplied from the PMU 41 to the CPU 42 to cancel the resting state.

When the signal Int2 is input to the PMU 41, the CPU 42 requests the control circuit 31 to read out the detection data Data (Step S24). In response to this, the control circuit 31 reads out the detection data Data from the memory circuit 32 (Step S25), and the detection data Data read out by the control circuit 31 is sent to the CPU 42 through the BUS 51 (Step S26). When the detection data Data is sent to the CPU 42, the full state of the memory circuit 32 is canceled (Step S27).

Through the above operation, a certain amount of accumulated detection data is sent to the CPU 42, so that the full state is canceled.

As described above, in one embodiment of the present invention, since a certain amount of detection data can be accumulated in the memory portion 30, the control portion 40 does not need to operate every time information is acquired; thus, the control portion can be in the resting state. Accordingly, the power consumption of the semiconductor device can be reduced.

Moreover, in one embodiment of the present invention, the memory circuit 32 can be in the resting state in the period in which no writing/reading operation is performed in the memory circuit 32. Thus, the power consumption of the semiconductor device can be reduced.

Note that the configuration of one embodiment of the present invention is not limited to that described above. In other words, since various embodiments of the invention are described in this embodiment, one embodiment of the present invention is not limited to a particular embodiment. For example, although the semiconductor device including the memory portion 30 is described as one embodiment of the present invention, depending on the situation or circumstances, one embodiment of the present invention does not necessarily include the memory portion 30. In addition, in the semiconductor device of one embodiment of the present invention, data is transmitted to the control portion 40 when a certain amount of data is accumulated in the memory portion 30; depending on the situation or circumstances, in one embodiment of the present invention, the detection data may be transmitted to the control portion 40 every time the detection data is input to the memory portion 30.

This embodiment can be combined with any of the other embodiments as appropriate. Thus, a content (or part of the content) described in this embodiment can be applied to, combined with, or replaced by a different content (or part of the different content) described in this embodiment and/or a content (or part of the content) described in another embodiment or other embodiments. In each embodiment, a content described in the embodiment is a content described with reference to a variety of diagrams or a content described with text in the specification. By combining a diagram (or part of thereof) illustrated in one embodiment with another part of the diagram, a different diagram (or part of thereof) illustrated in the embodiment, and/or a diagram (or part of thereof) illustrated in another embodiment or other embodiments, much more diagrams can be created. This also applies to other embodiments.

Embodiment 2

In this embodiment, a specific configuration example of the memory portion 30 of one embodiment of the present invention will be described.

<Configuration Example of Control Circuit>

Figure 6:
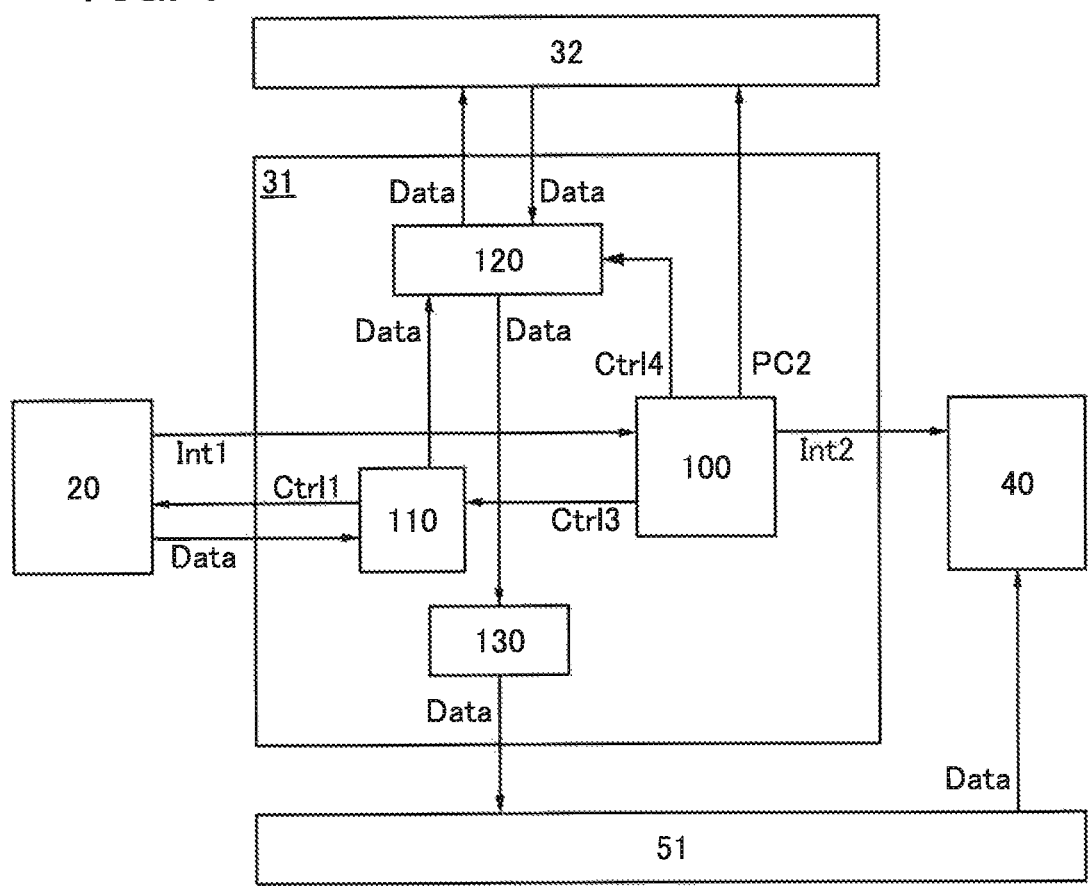
FIG. 6 illustrates an embodiment of the present invention.

FIG. 6 illustrates a configuration example of the control circuit 31. The control circuit 31 includes a control logic 100 and a plurality of interfaces (IF 110, IF 120, and IF 130).

The control logic 100 has a function of controlling the transmission/reception of signals to/from the sensor portion 20, the memory circuit 32, and the control portion 40. Specifically, the control logic 100 has a function of controlling the operation of the IF 110 which has functions of sending and receiving signals to and from the sensor portion 20. Furthermore, the control logic 100 has a function of controlling the operation of the IF 120 which has functions of sending and receiving signals to and from the memory circuit 32. Furthermore, the control logic 100 has functions of sending and receiving signals to and from the control portion 40.

The control logic 100 has a function of controlling the IF 110 as follows: when receiving the signal Int1 from the sensor portion 20, the control logic 100 outputs a control signal Ctrl3 to the IF 110, thereby controlling the reading of the detection data Data from the sensor portion 20.

The control logic 100 has a function of controlling the IF 120 by outputting a signal Ctrl4 to the IF 120, thereby controlling the writing of the detection data Data to the memory circuit 32 and the reading of the detection data Data from the memory circuit 32. The control logic 100 also has a function of controlling the power supply to the memory circuit 32 by outputting the control signal PC2 to the memory circuit 32.

The control logic 100 has a function of controlling the output of the detection data Data to the control portion 40 by outputting the signal Int2 to the control portion 40.

The IF 110 has a function of reading out the detection data Data from the sensor portion 20 by outputting the signal Ctrl1 to the sensor portion 20 in accordance with the instruction from the control logic 100. The IF 110 also has a function of outputting the read-out detection data Data to the IF 120.

The IF 120 has a function of outputting the detection data Data from the IF 110 to the memory circuit 32 in accordance with the instruction from the control logic 100. Thus, the detection data Data is written to the memory circuit 32. Furthermore, the IF 120 has a function of reading out the detection data Data stored in the memory circuit 32. The IF 120 also has a function of outputting the read-out detection data Data to the IF 130.

The IF 130 has a function of outputting the detection data Data from the IF 120 to the control portion 40 through the BUS 51.

<Configuration Example of Memory Circuit>

Figure 7:
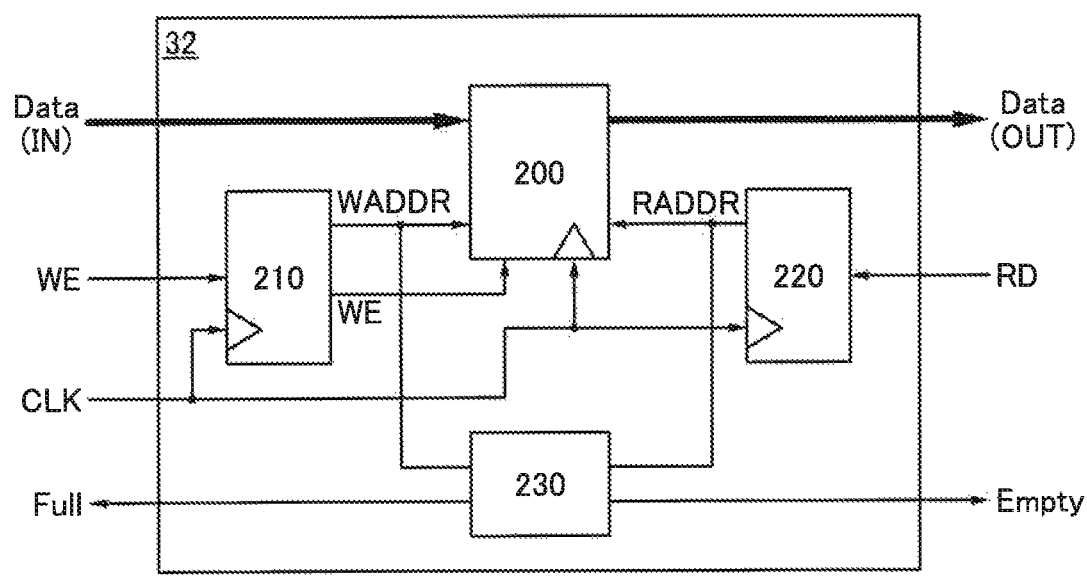
FIG. 7 illustrates an embodiment of the present invention.

FIG. 7 illustrates a configuration example of the memory circuit 32. The memory circuit 32 includes a memory region 200, a counter 210, a counter 220, and a comparator circuit 230.

The memory region 200 has a function of storing multiple detection data Data. The memory region 200 can be formed using any of a variety of memory circuits such as a flip-flop, a DRAM, and an SRAM.

The memory region 200 has a function of, when a signal WE is input, storing the detection data Data from the control circuit 31 at an address that is specified by a signal WADDR. The memory region 200 also has a function of outputting the detection data Data stored at an address that is specified by a signal RADDR to the control circuit 31. Note that the clock signal CLK may be input to the memory region 200.

The counter 210 has a function of counting the number of sets of detection data Data input from the control circuit 31. Specifically, the counter 210 has a function of, in the period in which the signal WE is input, counting the number of sets of detection data Data written to the memory region 200. When the number of detection data sets that is counted by the counter 210 exceeds a certain value, that is, when the memory circuit 32 reaches the full state, a signal Full is output from the comparator circuit 230.

The counter 220 has a function of counting the number of sets of detection data Data output to the control circuit 31. Specifically, the counter 220 has a function of, in a period in which a signal RD is input, counting the number of sets of detection data Data read out from the memory region 200. The comparator circuit 230 compares the number of counts obtained by the counter 210 with the number of counts obtained by the counter 220. When the numbers of counts of the counters satisfy certain conditions, a signal Empty is output from the comparator circuit 230.

The comparator circuit 230 has a function of outputting the signal Full or the signal Empty in accordance with the results of comparing the number of counts of the counter 210 with the number of counts of the counter 220.

Figure 8:
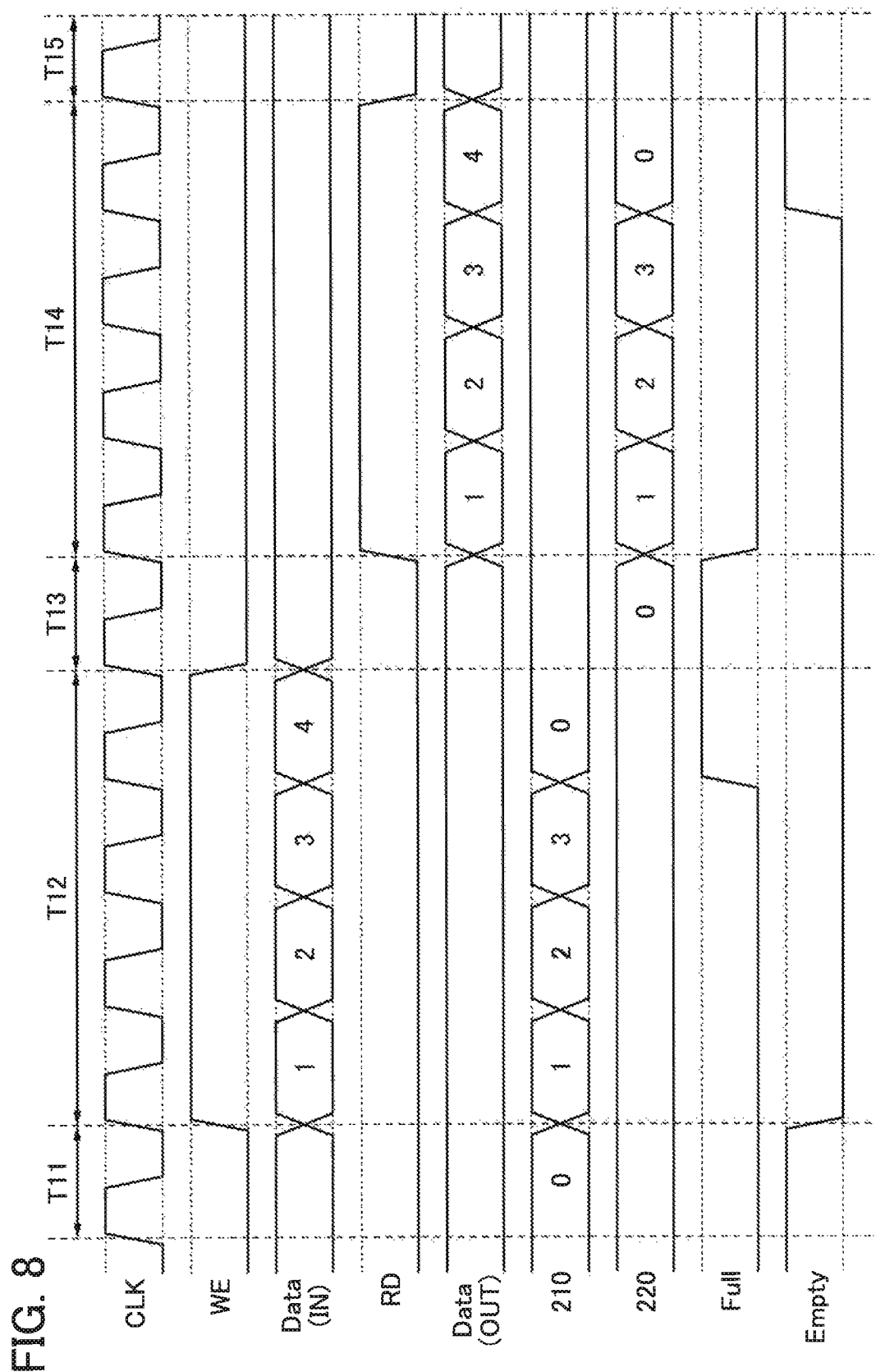
FIG. 8 is a timing chart illustrating an embodiment of the present invention.

Next, an operation example of the memory circuit 32 in FIG. 7 will be described. FIG. 8 is a timing chart illustrating the operation of the memory circuit 32. Described here is an example in which the counter 210 and the counter 220 are each a 2-bit counter.

In Period T11, the signal WE and the signal RD are at the low level, and no writing/reading of the detection data Data is performed. Therefore, the counter 210 and the counter 220 count "0".

Subsequently, in Period T12, the signal WE is set at the high level, and the detection data Data is written. In the period in which the signal WE is at the high level, the counter 210 counts the number of sets of detection data Data written to the memory region 200. When the number of written detection data sets reaches "4", the counter 210 counts "0", and the signal Full which indicates that the amount of detection data stored in the memory region 200 has reached a certain amount is output from the comparator circuit 230.

Subsequently, in Period T13, the signal WE is set at the low level, so that the writing of the detection data Data is finished.

Subsequently, in Period T14, the signal RD is set at the high level, and the detection data Data is read out. In the period in which the signal RD is at the high level, the counter 220 counts the number of sets of detection data Data read out from the memory region 200. When the number of detection data sets that have been read out reaches "4", the counter 220 counts "0", and the signal Empty which indicates that a certain amount of detection data Data stored in the memory region 200 has been read out is output from the comparator circuit 230. Note that the detection data Data that has been read out from the memory region 200 is output to the control portion 40 through the control circuit 31 and the BUS 51 (see FIG. 2A).

Subsequently, in Period T15, the signal RD is set at the low level, so that the reading of the detection data Data is finished.

In the above-described manner, the memory circuit 32 can accumulate a certain amount of detection data Data in the memory region 200 and then send it as a batch to the control circuit 31. Therefore, in the accumulation period of the detection data Data, the reading operation of the detection data Data stored in the memory region 200 can be omitted, which allows the control portion 40 (see FIG. 2A) to stop processing the detection data Data. Accordingly, the power consumption of the control portion 40 can be reduced.

Note that the memory region 200 is preferably formed using, but not particularly limited to, a memory circuit including an OS transistor. Since the OS transistor has low off-state current, the memory region 200 including the OS transistor can hold the detection data for a long time even in a period in which power is not supplied. Therefore, even in the resting period of the memory circuit 32, the detection data can be held for a long time. A configuration example of the memory region 200 including the OS transistor will be described below.

[Configuration Example 1 of Memory Region]

Figure 9:
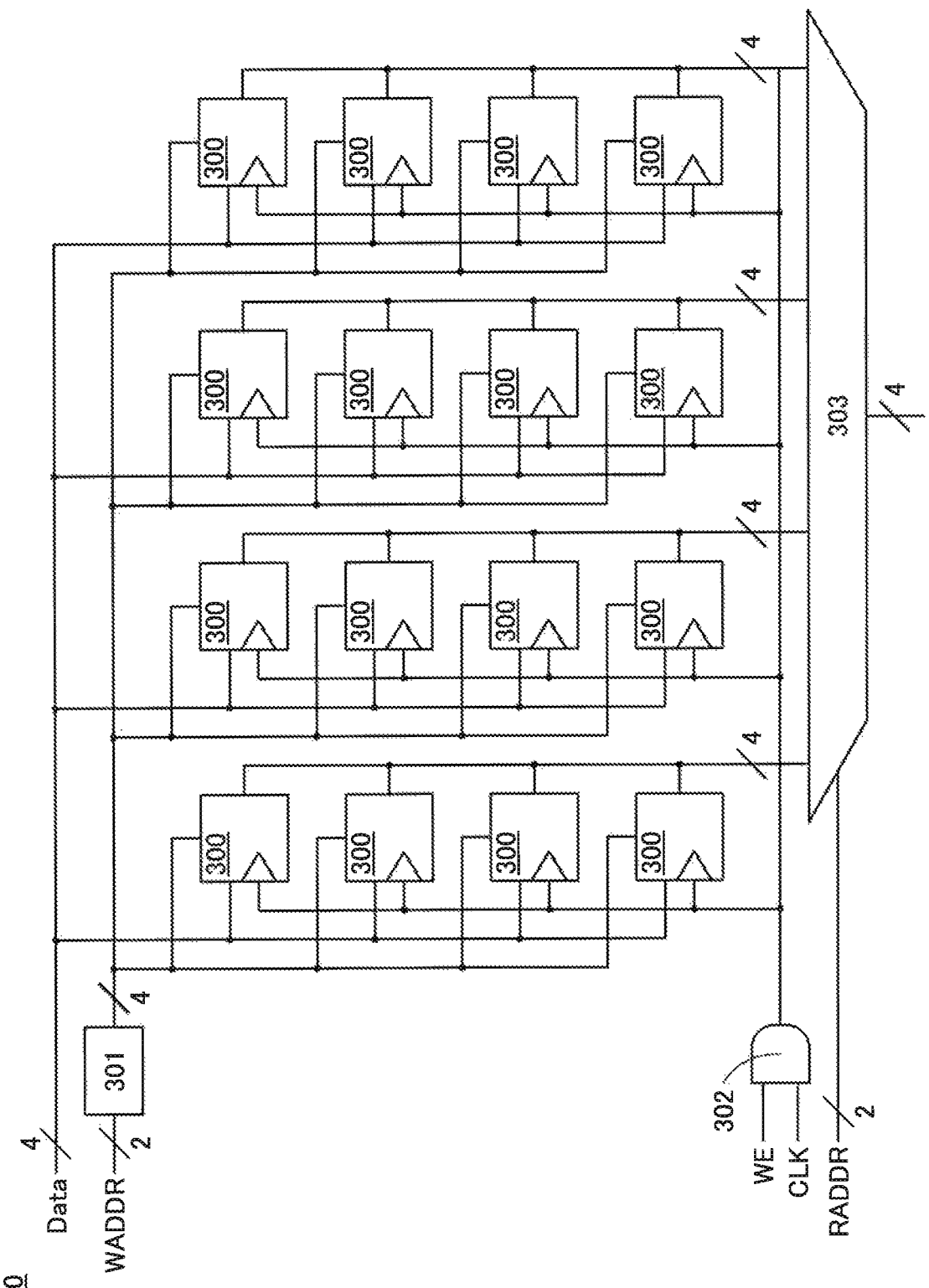
FIG. 9 is a circuit diagram illustrating an embodiment of the present invention.

FIG. 9 illustrates a configuration example of the memory region 200. The memory region 200 in FIG. 9 includes a plurality of flip-flops 300, a decoder 301, an AND circuit 302, and a multiplexer 303. In the configuration illustrated here, data of 4 bits×4 can be stored in the flip-flops 300 in 4 rows×4 columns; however, the number of flip-flops 300 is not limited thereto and may be a given number.

The decoder 301 has a function of outputting, in accordance with the external input signal WADDR, a signal for selecting the flip-flop 300 to which data is to be written. In the case where the signal WADDR is not coded and can be directly input to the flip-flop 300, the decoder 301 can be omitted.

The signal WE is input to a first input terminal of the AND circuit 302, and the signal CLK is input to a second input terminal of the AND circuit 302. When the signal WE is set at the high level, a clock signal is output from an output terminal of the AND circuit 302.

The detection data is written to the flip-flop 300 through the following operation. First, the signal WADDR is decoded by the decoder 301, and a flip-flop to which the detection data Data is to be written is selected. After that, the signal WE is set at the high level, so that the clock signal is input to the flip-flop 300. Thus, the detection data Data is stored in the predetermined flip-flop 300.

The detection data Data is read out from the flip-flop 300 in the following manner: the signal RADDR for specifying the address at which the reading of the detection data Data is to be performed is input to the multiplexer 303, so that a predetermined flip-flop 300 is selected, and the detection data is output from the selected flip-flop 300 through the multiplexer 303.

Figure 10:
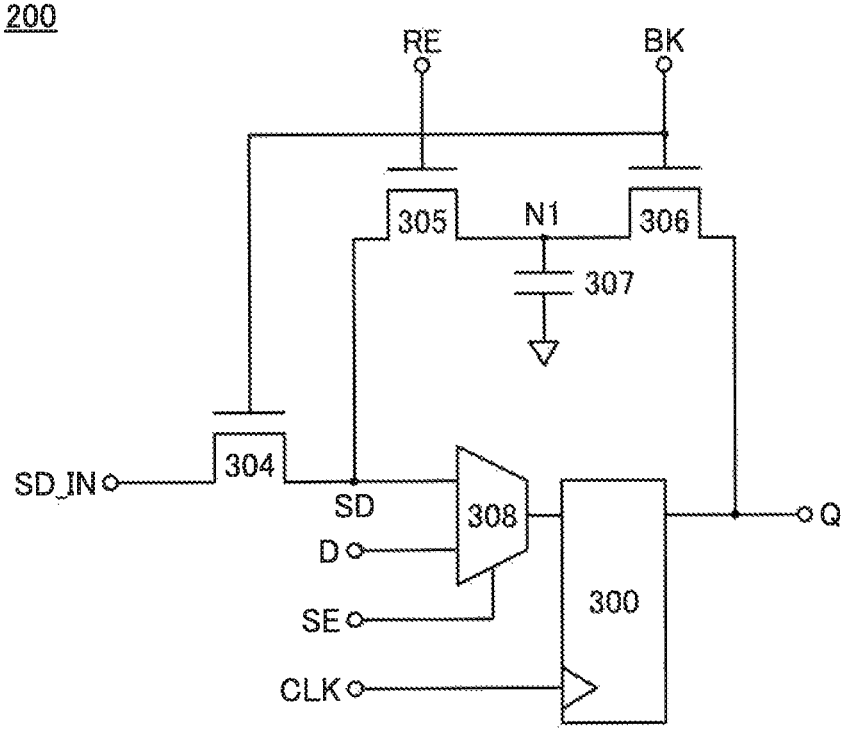
FIG. 10 is a circuit diagram illustrating an embodiment of the present invention.

Here, the memory region 200 which includes the flip-flop 300 in combination with an OS transistor can hold the detection data for a long time even in a period in which power is not supplied. FIG. 10 illustrates a configuration example in which an OS transistor is connected to the flip-flop 300.

The memory region 200 in FIG. 10 includes the flip-flop 300, a transistor 304, a transistor 305, a transistor 306, a capacitor 307, and a selection circuit 308. Here, the transistors 304 to 306 are OS transistors.

A gate of the transistor 304 is connected to a terminal BK, one of a source and a drain of the transistor 304 is connected to a terminal SD_IN, and the other of the source and the drain of the transistor 304 is connected to a node SD. A gate of the transistor 305 is connected to a terminal RE, one of a source and a drain of the transistor 305 is connected to a node N1, and the other of the source and the drain of the transistor 305 is connected to the node SD. A gate of the transistor 306 is connected to the terminal BK, one of a source and a drain of the transistor 306 is connected to the node N1, and the other of the source and the drain of the transistor 306 is connected to a terminal Q. One electrode of the capacitor 307 is connected to the node N1, and the other electrode of the capacitor 307 is connected to a terminal to which a predetermined potential is supplied. The selection circuit 308 is connected to the node SD, a terminal D, a terminal SE, and the flip-flop 300. An operation example of the flip-flop 300 in FIG. 10 will be described below.

<Normal Operation>

In normal operation of the flip-flop 300, a power supply potential and a clock signal are supplied to the flip-flop 300. When the detection data Data is written to the flip-flop 300, the detection data Data is input to the terminal D. Here, the potentials of the terminal RE and the terminal BK are at the low level; therefore, the transistors 304 to 306 are in the off state. The terminal SE is also at the low level, and the selection circuit 308 is conducting between the terminal D and the flip-flop 300. Note that the clock signal is input to the terminal CLK.

The detection data Data is read out in such a manner that the data stored in the flip-flop 300 is output through the terminal Q to the multiplexer 303 (see FIG. 9).

In this manner, in the period in which the data writing/reading is performed in the flip-flop 300, the flip-flop 300 is supplied with the power supply potential and the clock signal and operates normally. Hereinafter, the state in which the flip-flop 300 operates normally is also referred to as an active mode.

<Data Backup>

In a period in which no data writing/reading or the like is performed in the flip-flop 300, that is, a period in which the flip-flop 300 does not need to operate, the supply of the power supply potential or the clock signal is stopped in the following manner.

First, the potential of the terminal BK is set to the high level to turn on the transistor 306. Accordingly, electrical continuity is established between the terminal Q, which corresponds to an output terminal of the flip-flop 300, and the node N1. That is, output data of the flip-flop 300 is transmitted to the node N1. After that, the potential of the terminal BK is set to the low level to turn off the transistor 306. Accordingly, the node N1 is brought into the floating state, so that the output data of the flip-flop 300 is held at the node N1.

Thus, data can be backed up in such a manner that data stored in the flip-flop 300 is moved to the node N1 and held. Furthermore, in the period in which the data is stored at the node N1, the supply of the power supply potential or the clock signal to the flip-flop 300 can be stopped. Accordingly, the power consumption of the flip-flop 300 can be reduced. Hereinafter, the state in which the supply of the power supply potential or the clock signal to the flip-flop 300 is stopped is also referred to as a sleep mode.

Moreover, since the transistors 305 and 306 are OS transistors, their off-state current is extremely low. Therefore, in a period in which the potentials of the gates of the transistors 305 and 306 are at the low level, the potential of the node N1 can be held for a long time.

<Data Restoring>

In the case where the flip-flop 300 returns from the sleep mode to the active mode, the supply of the power supply potential, data restoring, and the supply of the clock signal are performed in the following manner.

First, the power supply potential is supplied to the flip-flop 300. After that, the potential of the terminal RE is set to the high level to turn on the transistor 305. Accordingly, electrical continuity is established between the node N1 and the node SD, so that the data that has been moved to the node N1 is transmitted to the node SD. The potential of the terminal SE is also set to the high level, so that electrical continuity is established between the node SD and an input terminal of the flip-flop 300 through the selection circuit 308; thus, the data that has been moved to the node N1 is input to the input terminal of the flip-flop 300.

Subsequently, the clock signal is supplied from the terminal CLK to the flip-flop 300 for a certain period of time. Consequently, data is written to the flip-flop 300, and the flip-flop 300 returns to the state immediately before the sleep mode. After that, the potentials of the terminal SE and the terminal RE are set to the low level. Accordingly, electrical continuity is established between the terminal D and the input terminal of the flip-flop 300. In addition, the transistor 305 is turned off, so that the node N1 is brought into the floating state.

After a certain period of time since the potentials of the terminal SE and the terminal RE have been set to the low level, the input of the clock signal is restarted to set the flip-flop 300 in the active mode.

In the above-described manner, the OS transistors connected to the flip-flop 300 make it possible to stop the supply of the power supply potential or the clock signal to the flip-flop 300.

In the case where the amount of power needed for the switching from the sleep mode to the active mode is larger than the amount of power which can be saved by stopping the supply of the power supply potential to the flip-flop 300, it is preferable, in the sleep mode, to stop only the supply of the clock signal and not to stop the supply of the power supply potential.

Moreover, when a plurality of circuits having the configuration of the memory region 200 in FIG. 10 is connected in series to form a scan chain, a scan test can be conducted. Specifically, the potential of the terminal RE is set to the low level to turn off the transistor 305, and the potential of the terminal BK is set to the high level to turn on the transistors 304 and 306. In addition, a high-level signal is supplied to the terminal SE to establish electrical continuity between the node SD and the input terminal of the flip-flop 300. Accordingly, the output data of the flip-flop 300 is input to the terminal SD_IN of the circuit in the next stage.

Subsequently, scan test data SCNIN is input to the terminal SD_IN of the circuit in the first stage of the scan chain. Shift operation in the scan chain is performed by inputting a clock signal, and SCNIN is written to the flip-flops 300 in the scan chain. Then, normal operation of the flip-flops 300 is performed, and output data of the logic circuit is held in the flip-flops 300. The mode is set to the scan mode again to perform the shift operation in the scan chain. Whether the logic circuit and the flip-flops 300 fail to operate properly can be determined from data output from the flip-flop 300 in the last stage.

[Configuration Example 2 of Memory Region]

Figure 11:
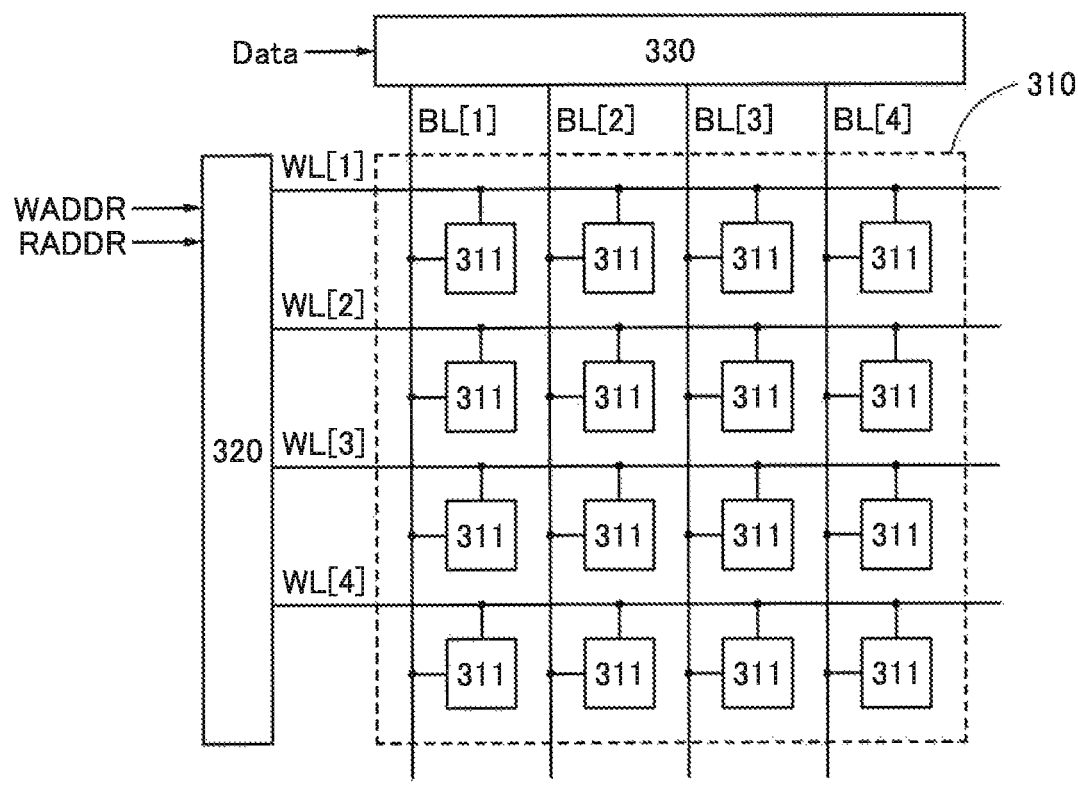
FIG. 11 illustrates an embodiment of the present invention.

FIG. 11 illustrates another configuration example of the memory region 200. In the memory region 200 in FIG. 11, a cell array 310 including a plurality of memory cells 311, a driver circuit 320, and a driver circuit 330 are provided. Note that a configuration in which the cell array 310 includes the memory cells 311 in 4 rows and 4 columns and can store data of 4 bits×4 is illustrated here as an example; however, the number of rows and the number of columns of the memory cells 311 can be set freely.

Each of the memory cells 311 is connected to a wiring WL and a wiring BL. Here, the wirings WL in the first to fourth rows are referred to as wirings WL[1] to WL[4], respectively, and the wirings BL in the first to fourth columns are referred to as wirings BL[1] to BL[4], respectively.

A signal for selecting the memory cells 311 in a predetermined row (hereinafter, this signal is also referred to as a selection signal) is supplied to the wiring WL, so that the memory cells 311 in the predetermined row are selected. Then, a potential corresponding to data which is to be written to the memory cell 311 (hereinafter, this potential is also referred to as a writing potential) is supplied to the wiring BL while the memory cells 311 in the predetermined row are selected, whereby the data can be written to the memory cell 311 in the predetermined row. In addition, the data stored in the memory cell 311 can be read out through the wiring BL. At this time, a potential corresponding to the data stored in the memory cell 311 (hereinafter, this potential is also referred to as a reading potential) is supplied to the wiring BL. In one embodiment of the present invention, the detection data Data is supplied to the wiring BL through the driver circuit 330.

The driver circuit 320 has a function of outputting the selection signal to the wiring WL in accordance with an address signal, namely, the signal WADDR or the signal RADDR. The driver circuit 320 can be formed using a decoder or the like.

The driver circuit 330 has a function of writing data to the memory cell 311 selected by the driver circuit 320. The driver circuit 330 also has a function of reading out the data stored in the memory cell 311 selected by the driver circuit 320. Specifically, the driver circuit 330 has functions of supplying the writing potential to the wiring BL and reading out the data stored in the memory cell 311 from the potential of the wiring BL. The driver circuit 330 may also have a function of precharging the wiring BL to a predetermined potential.

Here, the memory cell 311 is preferably formed using an OS transistor, in which case, even in a period in which the power supply potential is not supplied to the memory cell 311, the data stored in the memory cell 311 can be held for a long time. A configuration example of the memory cell 311 including the OS transistor will be described below.

<Configuration Example 1 of Memory Cell>

Figure 12A:
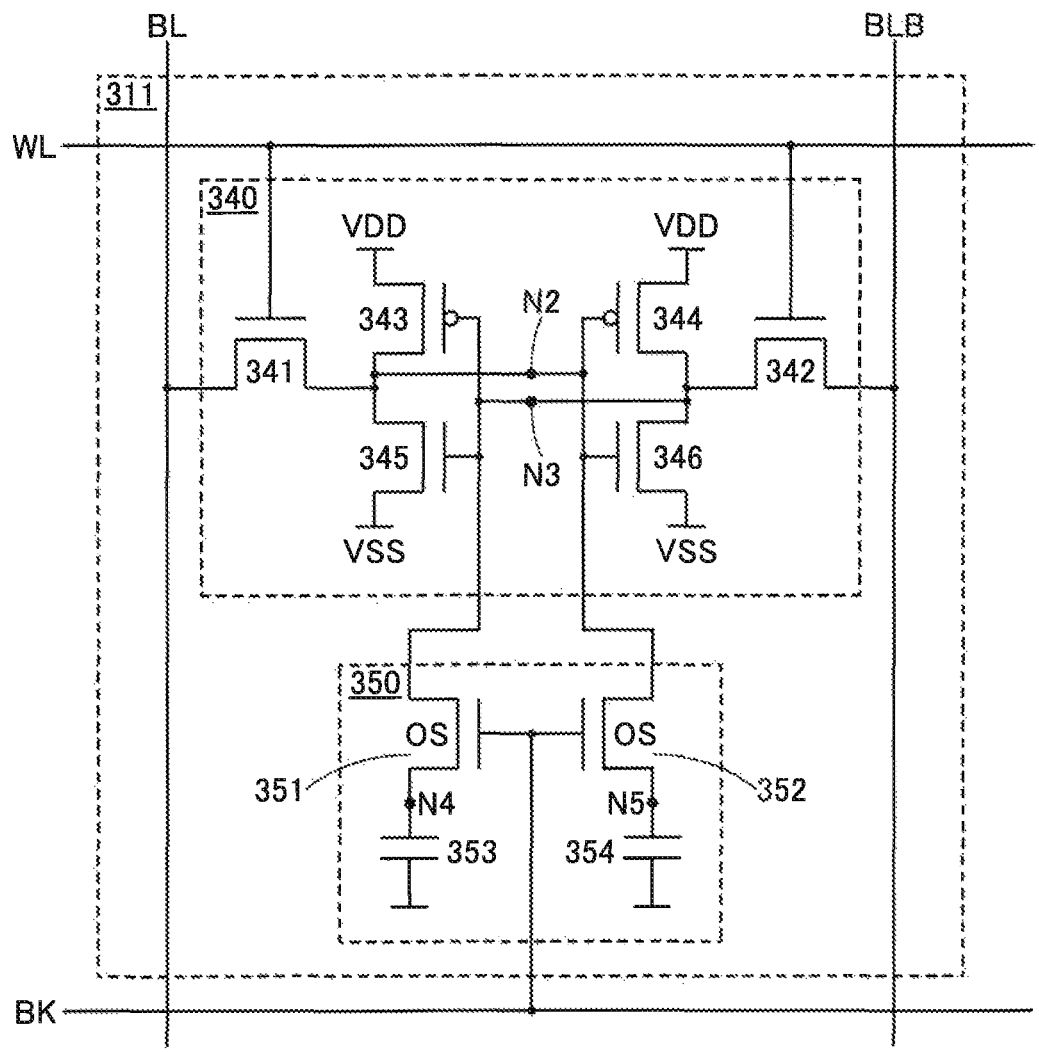
FIGS. 12A to 12C are circuit diagrams each illustrating an embodiment of the present invention.

FIG. 12A illustrates a configuration example of the memory cell 311. The memory cell 311 includes a circuit 340 and a circuit 350.

The circuit 340 includes transistors 341 to 346. The transistors 341, 342, 345, and 346 are n-channel transistors, and the transistors 343 and 344 are p-channel transistors. Note that the transistors 341 and 342 may each be either an n-channel transistor or a p-channel transistor.

A gate of the transistor 341 is connected to the wiring WL. One of a source and a drain of the transistor 341 is connected to one of a source and a drain of the transistor 343, one of a source and a drain of the transistor 345, a gate of the transistor 344, and a gate of the transistor 346. The other of the source and the drain of the transistor 341 is connected to the wiring BL. A gate of the transistor 342 is connected to the wiring WL. One of a source and a drain of the transistor 342 is connected to one of a source and a drain of the transistor 344, one of a source and a drain of the transistor 346, a gate of the transistor 343, and a gate of the transistor 345. The other of the source and the drain of the transistor 342 is connected to a wiring BLB. The other of the source and the drain of the transistor 343 and the other of the source and the drain of the transistor 344 are each connected to a power supply line (here, the high-potential power supply line VDD). The other of the source and the drain of the transistor 345 and the other of the source and the drain of the transistor 346 are each connected to a power supply line (here, the low-potential power supply line VSS). A node which is connected to the gate of the transistor 343 and the gate of the transistor 345 is referred to as a node N3, and a node which is connected to the gate of the transistor 344 and the gate of the transistor 346 is referred to as a node N2.

The wiring WL has a function of transmitting the selection signal, the wiring BL has a function of transmitting the writing potential or the reading potential, and the wiring BLB has a function of transmitting an inverted signal of the signal supplied to the wiring BL.

In this manner, the circuit 340 has the configuration of an SRAM cell, which is a volatile memory. Therefore, the node N2 and the node N3 each correspond to a node at which charge corresponding to the data written to the memory cell 311 is held.

The circuit 350 includes transistors 351 and 352 and capacitors 353 and 354. Here, the transistors 351 and 352 are OS transistors.

A gate of the transistor 351 is connected to a wiring BK, one of a source and a drain of the transistor 351 is connected to one electrode of the capacitor 353, and the other of the source and the drain of the transistor 351 is connected to the node N3. A gate of the transistor 352 is connected to the wiring BK, one of a source and a drain of the transistor 352 is connected to one electrode of the capacitor 354, and the other of the source and the drain of the transistor 352 is connected to the node N2. The other electrode of the capacitor 353 and the other electrode of the capacitor 354 are each connected to a wiring to which a predetermined potential is supplied. The wiring to which a predetermined potential is supplied may be either a high-potential power supply line or a low-potential power supply line (e.g., a ground line). Alternatively, potentials supplied to the wiring may be switched. A node which is connected to the one of the source and the drain of the transistor 351 and the one electrode of the capacitor 353 is referred to as a node N4, and a node which is connected to the one of the source and the drain of the transistor 352 and the one electrode of the capacitor 354 is referred to as a node N5.

The wiring BK has a function of selecting the memory cell 311 to which data is to be backed up. As for the signal supplied to the wiring WL and the signal supplied to the wiring BK, one signal may depend on the other signal, or they may be independent signals.

In the memory cell 311, the node N2 corresponding to the node at which data is held is connected to the node N5 through the OS transistor 352. Similarly, in the memory cell 311, the node N3 corresponding to the node at which data is held is connected to the node N4 through the OS transistor 351. Thus, the data held in the circuit 340, which has the configuration of an SRAM cell, can be moved to the node N4 and the node N5. Furthermore, the data that has been moved can be restored in the circuit 340.

Specifically, in a period in which no data writing/reading is performed in the circuit 340, the potential of the wiring BK is set to the high level to turn on the transistors 351 and 352, whereby the data held at the node N2 and the data held at the node N3 can be moved to the node N5 and the node N4, respectively. After that, the potential of the wiring BK is set to the low level to turn off the transistors 351 and 352, whereby the potentials of the nodes N4 and N5 are held. Then, the potential of the wiring BK is set to the high level again to turn on the transistors 351 and 352, whereby the data that has been moved to the nodes N4 and N5 can be restored at the nodes N2 and N3.

Here, the transistors 351 and 352 are OS transistors and have extremely low off-state current. Therefore, when the transistors 351 and 352 are in the off state, the potential of the node N4 and the potential of the node N5 can be held for a long time. Therefore, by moving the data held at the nodes N2 and N3 to the nodes N4 and N5 immediately before the power supply to the memory cell 311 is stopped, the data stored in the memory cell 311 can be held even when the power supply to the memory cell 311 is stopped. After the power supply to the memory cell 311 is restarted, the data held at the nodes N4 and N5 can be restored at the nodes N2 and N3.

Since the circuit 340 has the configuration of an SRAM cell, the transistors 341 to 346 are required to operate at high speed. Therefore, Si transistors or the like are preferably used as the transistors 341 to 346. Note that the transistors 341 to 346 are not limited to such transistors and may be OS transistors.

In addition, in a period in which power is supplied to the memory cell 311 and the circuit 340 operates as an SRAM cell, the transistors 351 and 352 are preferably in the off state. Thus, the high-speed operation of the circuit 340 can be prevented from being interrupted.

Although FIG. 12A illustrates an example in which the circuit 350 includes the transistors 351 and 352 and the capacitors 353 and 354, the transistor 351 and the capacitor 353 may be omitted, or the transistor 352 and the capacitor 354 may be omitted.

In FIG. 12A, an SRAM cell including six transistors, which is a volatile memory cell, is used as the circuit 340; however, the configuration is not limited thereto, and a different volatile memory cell may be used as the circuit 340. Also in the case where a different volatile memory cell is used, an OS transistor and a capacitor which are connected thereto as illustrated in FIG. 12A make it possible to move and restore the data.

In the above-described manner, in the memory cell 311, data stored in the circuit 340 is moved to the circuit 350 and held; thus, the data can be held even in a period in which power is not supplied to the memory cell 311. Furthermore, after the power supply is restarted, the data held in the circuit 350 can be restored in the circuit 340. Accordingly, the power supply to the memory cell 311 can be stopped in the data holding period, which can reduce the power consumption.

Moreover, as described later, an OS transistor can be stacked over a Si transistor. Therefore, the circuit 350 can be stacked over the circuit 340. Accordingly, an increase in the area of the memory cell 311 can be suppressed.

<Configuration Example 2 of Memory Cell>

Figure 12B:
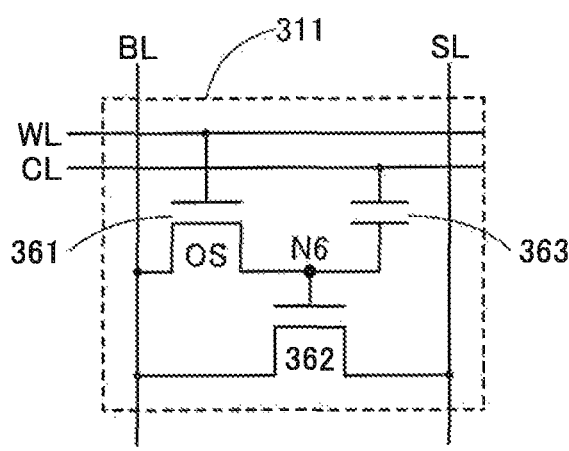

FIG. 12B illustrates another configuration example of the memory cell 311. The memory cell 311 in FIG. 12B includes a transistor 361, a transistor 362, and a capacitor 363. Note that the transistor 361 is an OS transistor. Although the transistors 361 and 362 are re-channel transistors here, the transistors 361 and 362 may each be a p-channel transistor.

A gate of the transistor 361 is connected to the wiring WL, one of a source and a drain of the transistor 361 is connected to a gate of the transistor 362 and one electrode of the capacitor 363, and the other of the source and the drain of the transistor 361 is connected to the wiring BL. One of a source and a drain of the transistor 362 is connected to a wiring SL, and the other of the source and the drain of the transistor 362 is connected to the wiring BL. The other electrode of the capacitor 363 is connected to a wiring CL. Here, a node which is connected to the one of the source and the drain of the transistor 361, the gate of the transistor 362, and the one electrode of the capacitor 363 is referred to as a node N6.

When an OS transistor is used as the transistor 361, the transistor 361 in the off state enables the potential of the node N6 to be held for an extremely long time.

Next, the operation of the memory cell 311 in FIG. 12B will be described. First, the potential of the wiring WL is set to a potential at which the transistor 361 is turned on, so that the transistor 361 is turned on. Accordingly, the potential of the wiring BL is supplied to the node N6. That is, predetermined charge is applied to the gate of the transistor 362 (data writing).

After that, the potential of the wiring WL is set to a potential at which the transistor 361 is turned off, so that the transistor 361 is turned off. This makes the node N6 floating, so that the potential of the node N6 is held (data holding).

Subsequently, the potential of the wiring SL is fixed to a constant potential, and then, the potential of the wiring CL is set to a predetermined potential (reading potential), so that the potential of the wiring BL varies depending on the amount of charge held at the node N6. This is because, in general, in the case where the transistor 362 is an n-channel transistor, an apparent threshold voltage $V_{th\_H}$ at the time when the potential of the gate of the transistor 362 is at the high level is lower than an apparent threshold voltage $V_{th\_L}$ at the time when the potential of the gate of the transistor 362 is at the low level. Here, the apparent threshold voltage refers to the potential of the wiring CL which is needed to turn on the transistor 362. Thus, by setting the potential of the wiring CL to a potential $V_0$ which is between $V_{th\_H}$ and $V_{th\_L}$, the potential of the node N6 can be determined. For example, in the case where the potential of the node N6 is at the high level, the transistor 362 is turned on when the potential of the wiring CL becomes $V_0$ ($>V_{th\_H}$). In the case where the potential of the node N6 is at the low level, the transistor 362 remains in the off state even when the potential of the wiring CL becomes $V_0$ ($<V_{th\_L}$). Thus, the data stored in the memory cell 311 can be read out by determining the potential of the wiring BL.

In the case where the data reading is not performed, a potential at which the transistor 362 is turned off regardless of the potential of the node N6, that is, a potential lower than $V_{th\_H}$ may be supplied to the wiring CL.

Although potentials at two levels (high level or low level) are held at the node N6 here, potentials at three or more levels may be held. Thus, the memory cell 311 can store multilevel data.

Data can be rewritten in a manner similar to that of the data writing and the data holding. Specifically, the potential of the wiring WL is set to a potential at which the transistor 361 is turned on, so that the transistor 361 is turned on. Accordingly, the potential of the wiring BL which corresponds to data to be newly written is supplied to the node N6. After that, the potential of the wiring WL is set to a potential at which the transistor 361 is turned off, so that the transistor 361 is turned off. This makes the node N6 floating, so that the potential corresponding to the newly written data is held at the node N6.

Since the transistor 361 is an OS transistor with extremely low off-state current, the potential of the node N6 can be maintained for a long time in the holding time. Therefore, even in a period in which the power supply to the memory cell 311 is stopped, data can be held for a long time.

Note that the one of the source and the drain of the transistor 361 is connected to the gate of the transistor 362, thereby having a function similar to that of a floating gate of a floating-gate transistor which is used as a non-volatile memory. Therefore, in FIG. 12B, a portion where the one of the source and the drain of the transistor 361 and the gate of the transistor 362 are connected to each other can also be called a floating gate portion FG. When the transistor 361 is in the off state, the floating gate portion FG can be regarded as being buried in an insulator, and charge is held in the floating gate portion FG. The off-state current of the transistor 361 is less than or equal to 1/100,000 of the off-state current of a Si transistor; thus, a loss of the charge accumulated in the floating gate portion FG due to leakage current of the transistor 361 is extremely small. Alternatively, a loss of the charge accumulated in the floating gate portion FG is negligible for a long time. As a result, with the OS transistor 361, a nonvolatile memory device or a memory device capable of holding data for a significantly long time without power supply can be realized.

In the memory cell 311 in FIG. 12B, data can be directly rewritten by another writing of data. For this reason, erasing operation which is necessary for a flash memory or the like is not needed, so that a decrease in operating speed caused by the erasing operation can be suppressed. That is, high-speed operation of the semiconductor device can be realized.

Furthermore, in this case, the problem of deterioration of a gate insulating film (tunnel insulating film), which is pointed out in a conventional floating-gate transistor, does not exist. That is, the problem of deterioration of a gate insulating film due to injection of electrons into a floating gate, which is a conventional problem, can be solved. This means that there is no limit on the number of times of writing in principle. In addition, a high voltage needed for writing or erasing in a conventional floating-gate transistor is not necessary.

Although FIG. 12B illustrates a configuration in which the data writing and the data reading are performed using the same wiring BL, the data writing and the data reading may be performed using different wirings. In other words, the other of the source and the drain of the transistor 361 and the other of the source and the drain of the transistor 362 may be connected to different wirings. In addition, the transistor 362 may be connected to the wiring BL through another transistor, or the transistor 362 may be connected to the wiring SL through another transistor.

Moreover, the transistor 361 and the transistor 362 can be stacked. For example, an insulating layer can be provided above the transistor 362, and the OS transistor 361 and the capacitor 363 can be provided above the insulating layer. Accordingly, the area of the memory cell 311 can be reduced.

<Configuration Example 3 of Memory Cell>

Figure 12C:
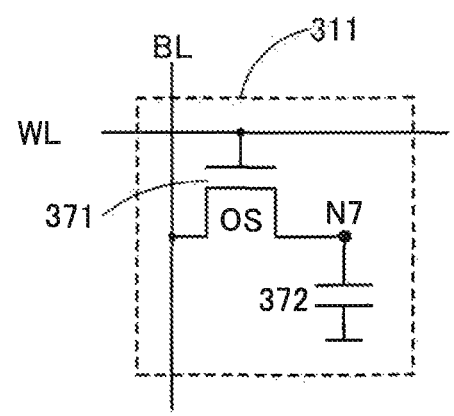

FIG. 12C illustrates another configuration example of the memory cell 311. The memory cell 311 in FIG. 12C includes a transistor 371 and a capacitor 372. Here, the transistor 371 is an n-channel OS transistor.

A gate of the transistor 371 is connected to the wiring WL, one of a source and a drain of the transistor 371 is connected to one electrode of the capacitor 372, and the other of the source and the drain of the transistor 371 is connected to the wiring BL. The other electrode of the capacitor 372 is connected to a wiring to which a predetermined potential is supplied. Here, a node which is connected to the one of the source and the drain of the transistor 371 and the one electrode of the capacitor 372 is referred to as a node N7. The operation of the memory cell 311 will be described below.

First, the potential of the wiring connected to the other electrode of the capacitor 372 is fixed to a constant level, and then, the potential of the wiring WL is set to a potential at which the transistor 371 is turned on, so that the transistor 371 is turned on. Accordingly, the potential of the wiring BL is supplied to the node N7 (data writing).

Next, the potential of the wiring WL is set to a potential at which the transistor 371 is turned off, so that the transistor 371 is turned off. This makes the node N7 floating, so that the potential of the node N7 is held (data holding). Since the transistor 371 is an OS transistor which has extremely low off-state current in the off state, the potential of the node N7 can be held for a long time.

Subsequently, the potential of the wiring connected to the other electrode of the capacitor 372 is fixed to a constant level, and then, the potential of the wiring WL is set to a potential at which the transistor 371 is turned on, so that the transistor 371 is turned on. Accordingly, the potential of the node N7 is supplied to the wiring BL. At this time, the potential of the wiring BL varies depending on the potential of the node N7. Thus, the data stored in the memory cell 311 can be read out by determining the potential of the wiring BL.

Data can be rewritten in a manner similar to that of the data writing and the data holding. Specifically, the potential of the wiring WL is set to a potential at which the transistor 371 is turned on, so that the transistor 371 is turned on. Accordingly, the potential of the wiring BL which corresponds to data to be newly written is supplied to the node N7. After that, the potential of the wiring WL is set to a potential at which the transistor 371 is turned off, so that the transistor 371 is turned off. This makes the node N7 floating, so that the potential corresponding to the newly written data is held at the node N7.

Since the transistor 371 is an OS transistor with extremely low off-state current, the potential of the node N7 can be maintained for a long time in the holding time. Consequently, operation in which another writing is performed at predetermined intervals (refresh operation) is unnecessary or the frequency of the refresh operation can be extremely low. Moreover, even in a period in which the power supply to the memory cell 311 is stopped, data can be held for a long time.

This embodiment can be combined with any of the other embodiments as appropriate.

Embodiment 3

In this embodiment, an example of the cross-sectional structure of a semiconductor device of one embodiment of the present invention will be described.

Structure Example 1

Figure 13:
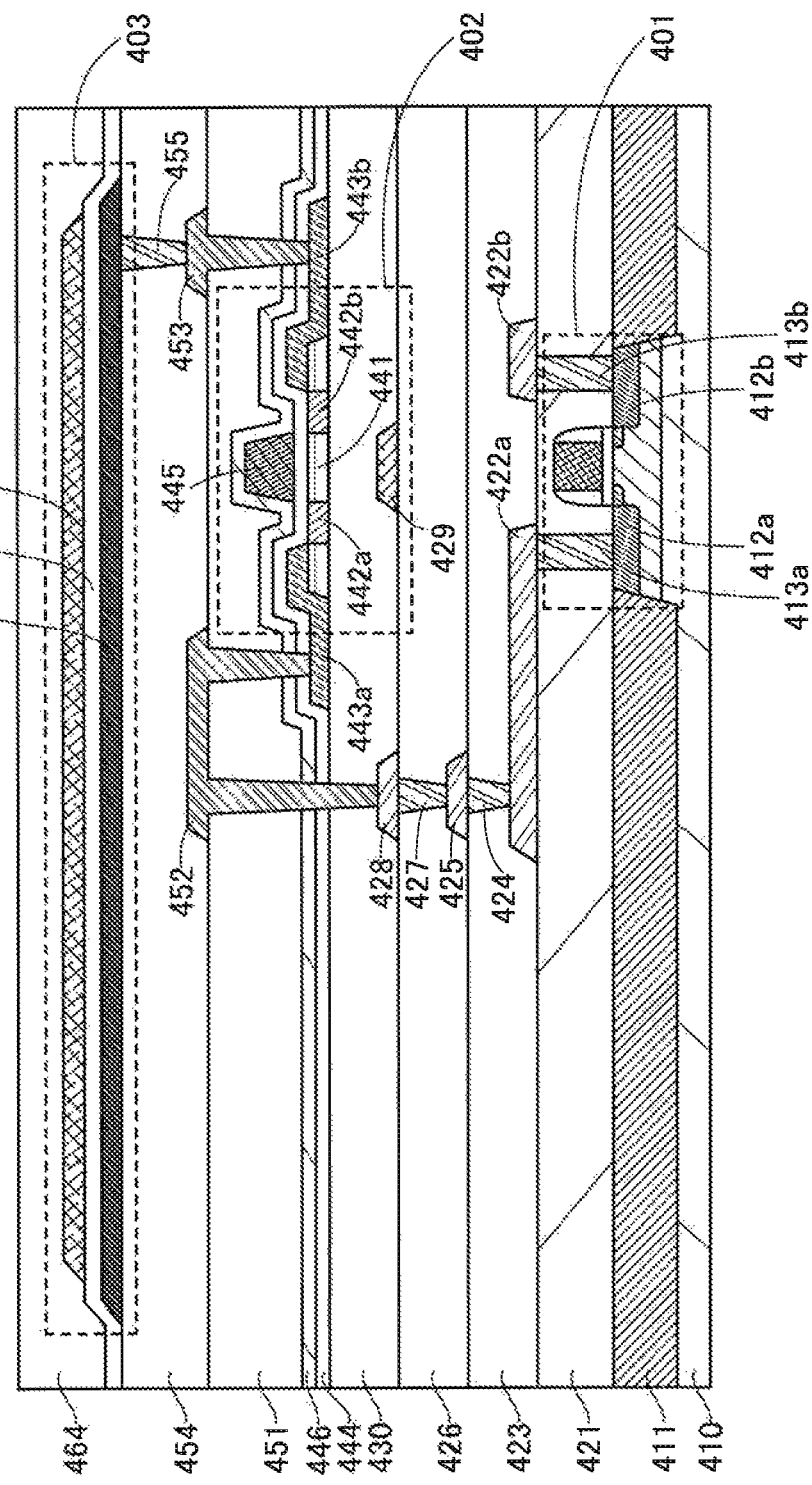
FIG. 13 illustrates an embodiment of the present invention.

FIG. 13 is a cross-sectional view illustrating a transistor 401, a transistor 402, and a capacitor 403. Note that the transistor 402 can be used as the OS transistors described in the above embodiments and the transistor 401 can be used as a transistor other than the OS transistors. In addition, the capacitor 403 can be used as the capacitors and the like described in the above embodiments. For example, the transistor 401 can be used as the transistors 341 to 346 and 362 in FIGS. 12A and 12B. The transistor 402 can be used as the transistors 304 to 306 in FIG. 10, the transistors 351, 352, 361, and 371 in FIGS. 12A to 12C, and the like. The capacitor 403 can be used as the capacitor 307 in FIG. 10, the capacitors 353, 354, 363, and 372 in FIGS. 12A to 12C, and the like.

FIG. 13 illustrates an example of the cross-sectional structure of the semiconductor device in which the transistor 401 having a channel formation region in a single crystal semiconductor substrate is positioned in a first layer, the OS transistor 402 is positioned in a second layer over the first layer, and the capacitor 403 is positioned in a third layer over the second layer.

The transistor 401 may have the channel formation region in a semiconductor film or a semiconductor substrate of silicon, germanium, or the like in an amorphous, microcrystalline, polycrystalline, or single crystal state. In the case where the transistor 401 is formed using a thin silicon film, any of the following materials can be used for the thin film: amorphous silicon formed by a sputtering method or a vapor deposition method such as a plasma CVD method, polycrystalline silicon obtained by crystallization of amorphous silicon by treatment such as laser irradiation, single crystal silicon obtained by separation of a surface portion of a single crystal silicon wafer by implantation of hydrogen ions or the like into the silicon wafer, and the like.

A semiconductor substrate 410 where the transistor 401 is formed can be, for example, a silicon substrate, a germanium substrate, or a silicon germanium substrate. In FIG. 13, a single crystal silicon substrate is used as the semiconductor substrate 410.

The transistor 401 is electrically isolated by an element isolation method. As the element isolation method, a local oxidation of silicon (LOCOS) method, a trench isolation method (shallow trench isolation (STI) method), or the like can be employed. FIG. 13 illustrates an example in which the trench isolation method is used to electrically isolate the transistor 401. Specifically, in FIG. 13, the transistor 401 is electrically isolated by element isolation using an element isolation region 411 formed in the following manner: an insulator containing silicon oxide or the like is buried in a trench formed in the semiconductor substrate 410 by etching or the like.

The transistor 401 includes an impurity region 412a and an impurity region 412b. The impurity regions 412a and 412b function as a source and a drain of the transistor 401.

An insulating film 421 is provided over the transistor 401, and openings are formed in the insulating film 421. A conductive layer 413a connected to the impurity region 412a and a conductive layer 413b connected to the impurity region 412b are formed in the openings. The conductive layer 413a is connected to a conductive layer 422a formed over the insulating film 421, and the conductive layer 413b is connected to a conductive layer 422b formed over the insulating film 421.

An insulating film 423 is provided over the conductive layers 422a and 422b, and an opening is formed in the insulating film 423. A conductive layer 424 connected to the conductive layer 422a is formed in the opening. The conductive layer 424 is connected to a conductive layer 425 formed over the insulating film 423.

An insulating film 426 is provided over the conductive layer 425, and an opening is formed in the insulating film 426. A conductive layer 427 connected to the conductive layer 425 is formed in the opening. The conductive layer 427 is connected to a conductive layer 428 formed over the insulating film 426.

The OS transistor 402 is provided over the insulating film 426. The transistor 402 includes an oxide semiconductor layer 441 over an insulating film 430, a conductive layer 443a and a conductive layer 443b over the oxide semiconductor layer 441, an insulating film 444 over the oxide semiconductor layer 441 and the conductive layers 443a and 443b, and a conductive layer 445 which is positioned over the insulating film 444 and overlaps with the oxide semiconductor layer 441. Note that the conductive layers 443a and 443b function as a source electrode and a drain electrode of the transistor 402, the insulating film 444 functions as a gate insulating film of the transistor 402, and the conductive layer 445 functions as a gate electrode of the transistor 402.

The oxide semiconductor layer 441 includes a region 442a between a region overlapping with the conductive layer 443a and a region overlapping with the conductive layer 445. The oxide semiconductor layer 441 includes a region 442b between a region overlapping with the conductive layer 443b and the region overlapping with the conductive layer 445. Argon or an impurity imparting p-type or n-type conductivity to the oxide semiconductor layer 441 is added to the regions 442a and 442b with the conductive layers 443a, 443b, and 445 used as masks; thus, in the oxide semiconductor layer 441, the resistivity of the regions 442a and 442b can be lower than that of the region overlapping with the conductive layer 445.

An insulating film 446 and an insulating film 451 are provided over the insulating film 444 and the conductive layer 445. Over the insulating film 451, a conductive layer 452 and a conductive layer 453 are provided. The conductive layer 452 is connected to the conductive layer 428 through an opening provided in the insulating films 430, 444, 446, and 451 and to the conductive layer 443a through an opening provided in the insulating films 444, 446, and 451. The conductive layer 453 is connected to the conductive layer 443b through an opening provided in the insulating films 444, 446, and 451. The conductive layer 452 functions as the wiring BL in FIGS. 12A to 12C or as a conductive layer connected to the wiring BL.

An insulating film 454 is provided over the conductive layers 452 and 453. Over the insulating film 454, the capacitor 403 is provided.

The capacitor 403 includes a conductive layer 461 over the insulating film 454, an insulating film 462 over the conductive layer 461, and a conductive layer 463 overlapping with the conductive layer 461 with the insulating film 462 positioned therebetween. Over the conductive layer 463, an insulating film 464 is provided. The conductive layer 461 is connected to the conductive layer 453 through a conductive layer 455 provided in an opening in the insulating film 454. The conductive layers 461 and 463 function as electrodes of the capacitor 403, and the insulating film 462 functions as a dielectric of the capacitor 403.

In the semiconductor device in FIG. 13, the conductive layers 422a, 424, 425, 427, 428, and 452 which connect the conductive layer 413a functioning as a source electrode or a drain electrode of the transistor 401 to the conductive layer 443a functioning as the source electrode or the drain electrode of the transistor 402 function as the wiring BL in FIGS. 12A to 12C. In addition to these conductive layers, the conductive layer 413a or the conductive layer 443a can also function as the wiring BL.

In FIG. 13, the transistor 402 includes the conductive layer 445 on at least one side of the oxide semiconductor layer 441. Alternatively, a pair of gate electrodes may be provided with the oxide semiconductor layer 441 positioned therebetween. For example, a conductive layer 429 functioning as a backgate of the transistor 402 is formed over the insulating film 426, whereby a pair of gate electrodes can be provided in the transistor 402.

In FIG. 13, the transistor 402 has a structure in which one channel formation region corresponding to one conductive layer 445 is provided. However, the transistor 402 may have a multi-gate structure in which a plurality of connected gate electrodes is provided so that a plurality of channel formation regions is included in the oxide semiconductor layer 441.

The transistor 401, the transistor 402, and the capacitor 403 are stacked in this manner, whereby the area of the semiconductor device can be reduced. In particular, when the capacitor 403 is provided in a position overlapping with the transistor 402, the area of the memory cell 311 in FIGS. 12A to 12C can be reduced while a sufficient capacitance of the memory cell 311 is secured.

Note that the capacitor 403 preferably overlaps with the transistor 402. For example, when the conductive layer 461 or the conductive layer 463 overlaps with the oxide semiconductor layer 441 or the conductive layer 445, the area of the memory cell can be further reduced.

In the case where the structure in FIG. 13 in which, for example, the channel length of the transistor 401 is 65 nm, the channel length of the transistor 402 is 60 nm, and the capacitor 403 is stacked over the transistor 402 is employed for the memory cell 311 in FIG. 11, the area of the memory cell can be 0.54 $\mu m^2$ or smaller.

Structure Example 2

Figure 14:
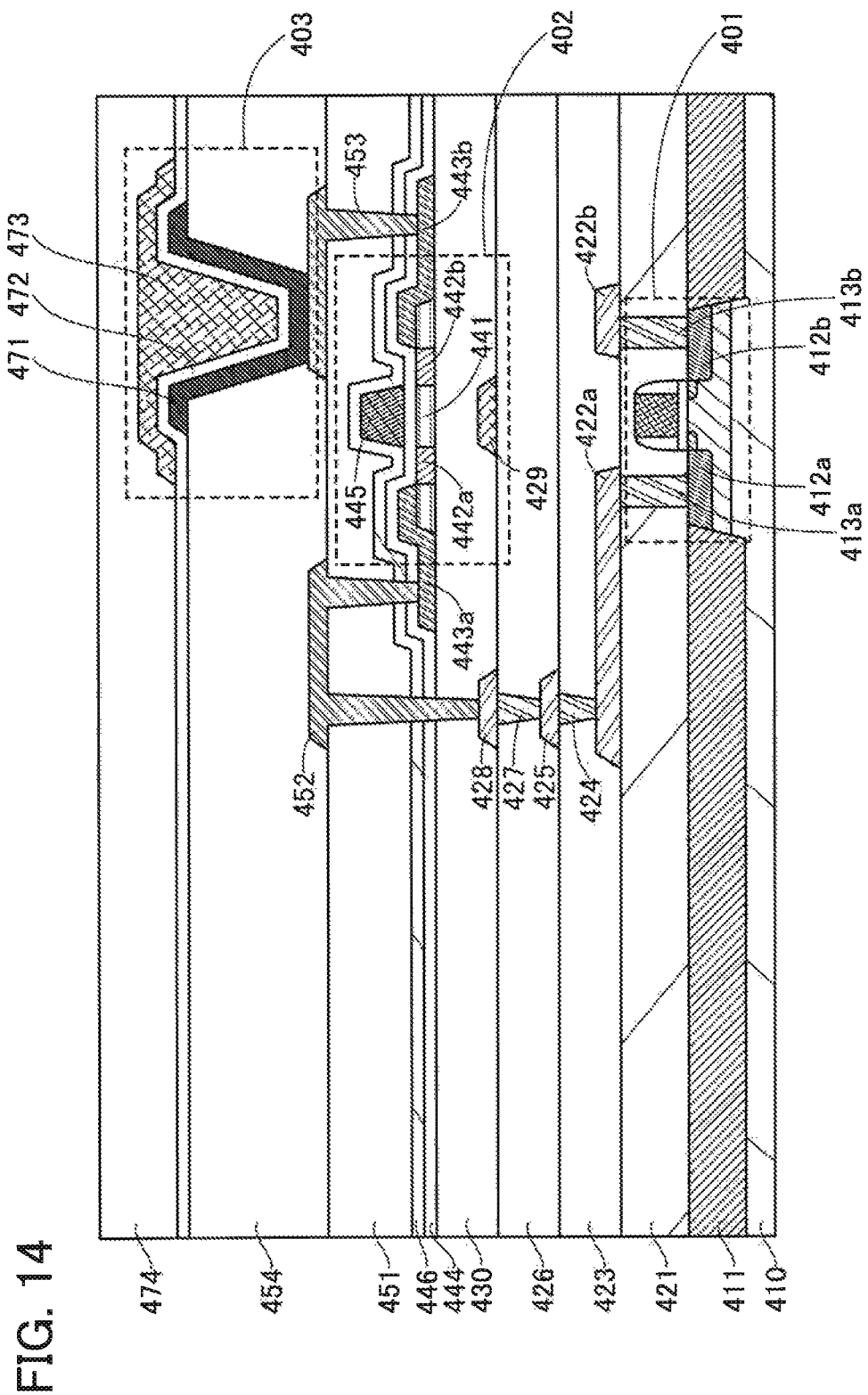
FIG. 14 illustrates an embodiment of the present invention.

FIG. 14 is a cross-sectional view of a semiconductor device which is different from the semiconductor device in FIG. 13. FIG. 14 is different from FIG. 13 only in the structure of the capacitor 403 described below; the structure in FIG. 13 can be employed for the other components.

The capacitor 403 in FIG. 14 includes a conductive layer 471, an insulating film 472 over the conductive layer 471, and a conductive layer 473 overlapping with the conductive layer 471 with the insulating film 472 positioned therebetween. Over the conductive layer 473, an insulating film 474 is provided. The conductive layers 471 and 473 function as electrodes of the capacitor 403, and the insulating film 472 functions as a dielectric of the capacitor 403. The capacitor 403 in FIG. 13 is a planar capacitor, whereas the capacitor 403 in FIG. 14 is a cylindrical capacitor.

The conductive layer 471 is formed over the insulating film 454 and in an opening provided in the insulating film 454 and is connected to the conductive layer 453. Therefore, the conductive layer 471 includes a first region in contact with the conductive layer 453, a second region in contact with a top surface of the insulating film 454, and a third region in contact with a side surface of the insulating film 454. The insulating film 472 is provided in contact with the conductive layer 471.

The conductive layer 473 is provided over the insulating film 454 and in the opening in the insulating film 454 and overlaps with the conductive layer 471 with the insulating film 472 positioned therebetween. Accordingly, capacitance is formed on a side surface portion of the opening in the insulating film 454 in addition to over the insulating film 454 and on a bottom portion of the opening in the insulating film 454. Therefore, by increasing the thickness of the insulating film 454 and forming a deep opening, the capacitance of the capacitor 403 can be increased.

When the capacitor 403 is a cylindrical capacitor as described above, the area of the capacitor 403 can be reduced while its capacitance is maintained. Consequently, the area of the memory cell can be further reduced.

Note that the capacitor 403 preferably overlaps with the transistor 402. For example, when the conductive layer 471 or the conductive layer 473 overlaps with the oxide semiconductor layer 441 or the conductive layer 445, the area of the memory cell can be further reduced.

In the case where the structure in FIG. 14 in which, for example, the channel length of the transistor 401 is 65 nm, the channel length of the transistor 402 is 60 nm, and the capacitor 403 is stacked over the transistor 402 is employed for the memory cell 311 in FIG. 11, the area of the memory cell 311 can be 0.17 $\mu m^2$ or smaller.

The structures and methods described in this embodiment can be combined with any of the structures and methods described in the other embodiments as appropriate.

Embodiment 4

In this embodiment, a structure example of an OS transistor that can be used for one embodiment of the present invention will be described.

Structure Example 1

Figure 15A:
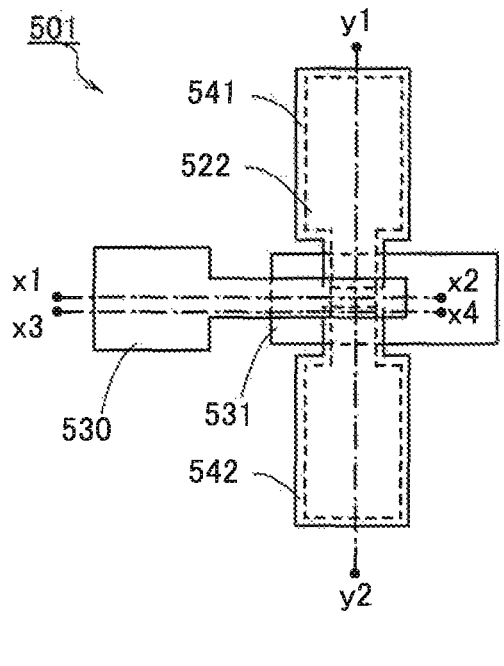
FIGS. 15A to 15D illustrate a structure example of a transistor.
Figure 15B:
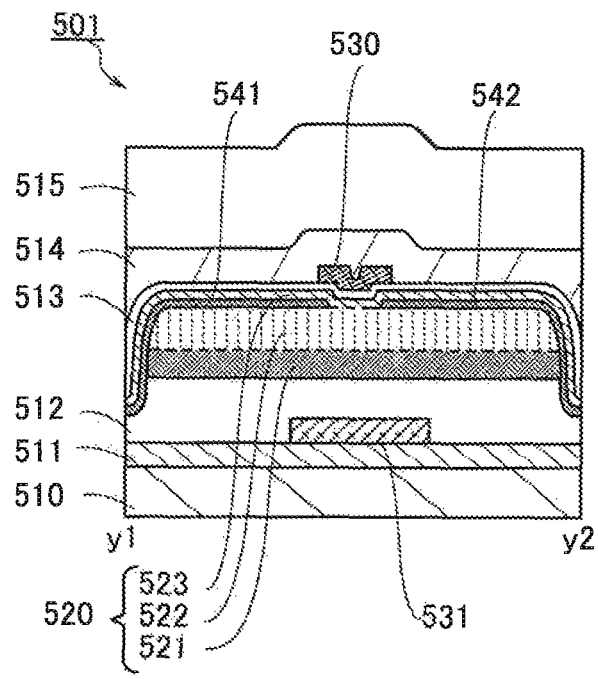
Figure 15C:
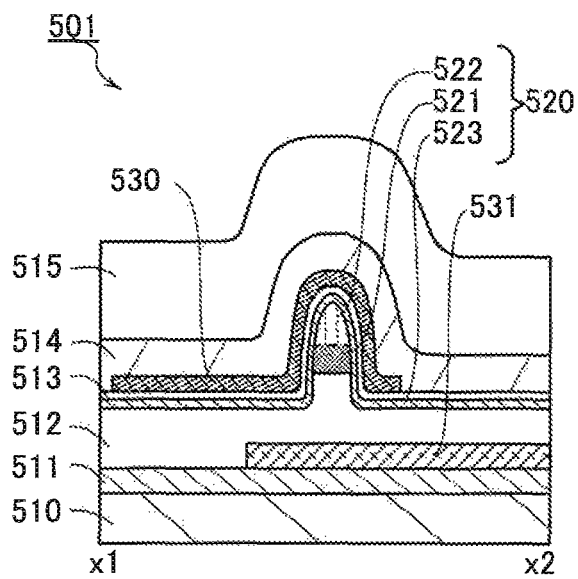
Figure 15D:
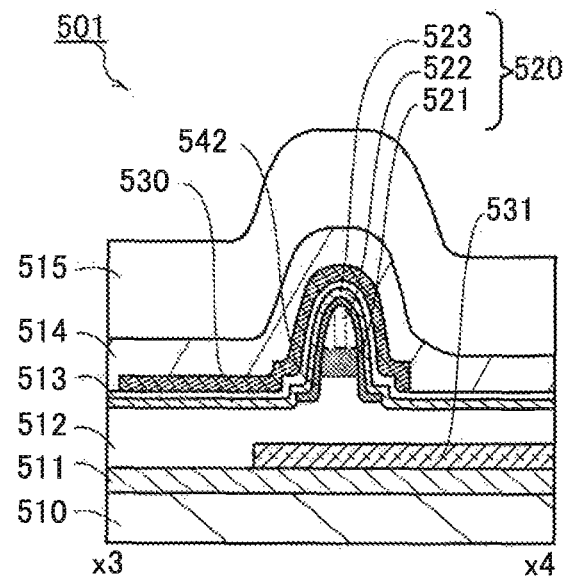

FIGS. 15A to 15D illustrate a structure example of an OS transistor. FIG. 15A is a top view illustrating a structure example of the OS transistor. FIG. 15B is a cross-sectional view along the line y1-y2, FIG. 15C is a cross-sectional view along the line x1-x2, and FIG. 15D is a cross-sectional view along the line x3-x4. Here, in some cases, the direction of the line y1-y2 is referred to as a channel length direction, and the direction of the line x1-x2 is referred to as a channel width direction. Accordingly, FIG. 15B illustrates a cross-sectional structure of the OS transistor in the channel length direction, and FIGS. 15C and 15D each illustrate a cross-sectional structure of the OS transistor in the channel width direction. To clarify the device structure, FIG. 15A does not illustrate some components.

An OS transistor 501 in FIGS. 15A to 15D includes a backgate. The OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 can be regarded as components of the OS transistor 501. The OS transistor 501 includes an insulating layer 512, an insulating layer 513, an oxide semiconductor layer 521, an oxide semiconductor layer 522, an oxide semiconductor layer 523, a conductive layer 530, a conductive layer 531, a conductive layer 541, and a conductive layer 542. Here, the oxide semiconductor layers 521 to 523 are collectively referred to as an oxide semiconductor layer 520.

The insulating layer 513 includes a region functioning as a gate insulating layer. The conductive layer 530 functions as a gate electrode (first gate electrode). The conductive layer 531 functions as a backgate electrode (second gate electrode). The conductive layers 541 and 542 function as a source electrode and a drain electrode. Note that the conductive layer 531 is not necessarily provided (the same applies hereinafter).

As illustrated in FIGS. 15B and 15C, the oxide semiconductor layer 520 includes a region in which the oxide semiconductor layers 521 to 523 are stacked in this order. The insulating layer 513 covers this stacked region. The conductive layer 531 overlaps with the stacked region of the oxide semiconductor layer with the insulating layer 512 positioned therebetween. The conductive layers 541 and 542 are provided over the stacked film including the oxide semiconductor layers 521 and 522 and in contact with a top surface of the stacked film and its side surfaces in the channel length direction. In the example in FIGS. 15A to 15D, the conductive layers 541 and 542 are also in contact with the insulating layer 512. The oxide semiconductor layer 523 is formed to cover the oxide semiconductor layers 521 and 522 and the conductive layers 541 and 542. A bottom surface of the oxide semiconductor layer 523 is in contact with a top surface of the oxide semiconductor layer 522.

The conductive layer 530 is formed so that the region in which the oxide semiconductor layers 521 to 523 in the oxide semiconductor layer 520 are stacked is surrounded by the conductive layer 530 in the channel width direction with the insulating layer 513 positioned therebetween (see FIG. 15C). Therefore, both a gate electric field in the vertical direction and a gate electric field in the lateral direction are applied to this stacked region. In the OS transistor 501, the gate electric field refers to an electric field generated by voltage applied to the conductive layer 531 (gate electrode layer). Accordingly, the whole region in which the oxide semiconductor layers 521 to 523 are stacked can be electrically surrounded by the gate electric fields, so that a channel is formed in the whole oxide semiconductor layer 522 (bulk) in some cases. Thus, the OS transistor 501 can have high on-state current characteristics.

In this specification, such a transistor structure in which a semiconductor is electrically surrounded by a gate electric field is referred to as a surrounded channel (s-channel) structure. The OS transistor 501 has the s-channel structure. With the s-channel structure, a large amount of current can flow between the source and the drain of the transistor, so that high drain current in the on state (high on-state current) can be achieved.

When the OS transistor 501 has the s-channel structure, the channel formation region can be easily controlled by a gate electric field applied to the side surface of the oxide semiconductor layer 522. In the preferable structure in which the conductive layer 530 extends deeper than the oxide semiconductor layer 522 and faces the side surface of the oxide semiconductor layer 521, higher controllability can be achieved. Consequently, the subthreshold swing (S value) of the OS transistor 501 can be made small, so that a short-channel effect can be suppressed. Therefore, the structure of the OS transistor 501 is suitable for miniaturization.

An OS transistor with a three-dimensional device structure similar to that of the OS transistor 501 in FIGS. 15A to 15D can have a channel length of less than 100 nm. By miniaturization of the OS transistor, the circuit area can be made small. The channel length of the OS transistor is preferably less than 65 nm, further preferably less than or equal to 30 nm or less than or equal to 20 nm.

Note that an oxide semiconductor such as an In—Ga—Zn oxide has lower thermal conductivity than silicon. Therefore, when an oxide semiconductor is used for the oxide semiconductor layer 520, heat is easily generated especially at a drain-side end portion of the channel formation region of the oxide semiconductor layer 520. However, since the transistor 501 in FIG. 15B has regions in which the conductive layers 541 and 542 overlap with the conductive layer 530, the conductive layers 541 and 542 are located in the vicinity of the channel formation region of the oxide semiconductor layer 520. Accordingly, heat generated in the channel formation region of the oxide semiconductor layer 520 is conducted to the conductive layers 541 and 542. That is, the conductive layers 541 and 542 can be used to dissipate heat from the channel formation region.

A conductor functioning as a gate of a transistor is referred to as a gate electrode. A conductor functioning as a source of the transistor is referred to as a source electrode. A conductor functioning as a drain of the transistor is referred to as a drain electrode. A region functioning as a source of the transistor is referred to as a source region. A region functioning as a drain of the transistor is referred to as a drain region. In this specification, a gate electrode is referred to as a gate, a drain electrode or a drain region is referred to as a drain, and a source electrode or a source region is referred to as a source in some cases.

The channel length refers to, for example, in a top view of a transistor, the distance between a source and a drain in a region in which a semiconductor (or a portion of the semiconductor in which current flows when the transistor is in the on state) and a gate overlap each other or in a region in which a channel is formed. The channel length of a transistor is not necessarily constant in all regions. In other words, the channel length of a transistor is not limited to one value in some cases. Therefore, in this specification, the channel length is any one value, the maximum value, the minimum value, or the average value in a region in which a channel is formed.

The channel width refers to, for example, the length of a portion in which a source and a drain face each other in a region in which a semiconductor (or a portion of the semiconductor in which current flows when a transistor is in the on state) and a gate overlap with each other or in a region in which a channel is formed. The channel width of a transistor is not necessarily constant in all regions. In other words, the channel width of a transistor is not limited to one value in some cases. Therefore, in this specification, the channel width is any one value, the maximum value, the minimum value, or the average value in a region in which a channel is formed.

Depending on the transistor structure, the channel width in a region in which a channel is actually formed (hereinafter referred to as an effective channel width) is different from the channel width shown in a top view of the transistor (hereinafter referred to as an apparent channel width) in some cases. For example, in a transistor having a three-dimensional structure, the effective channel width is larger than the apparent channel width shown in a top view of the transistor, and an influence of the effective channel width cannot be ignored in some cases. For example, in a miniaturized transistor having a three-dimensional structure, the proportion of a channel region formed on a side surface of a semiconductor is high in some cases. In this case, the effective channel width obtained when a channel is actually formed is larger than the apparent channel width shown in a top view.

In this specification, the simple term "channel width" may denote the apparent channel width. Alternatively, in this specification, the simple term "channel width" may denote the effective channel width. Note that the values of the channel length, the channel width, the effective channel width, the apparent channel width, the surrounded channel width, and the like can be determined by obtaining and analyzing a cross-sectional TEM image and the like.

Structure Example 2

Figure 16A:
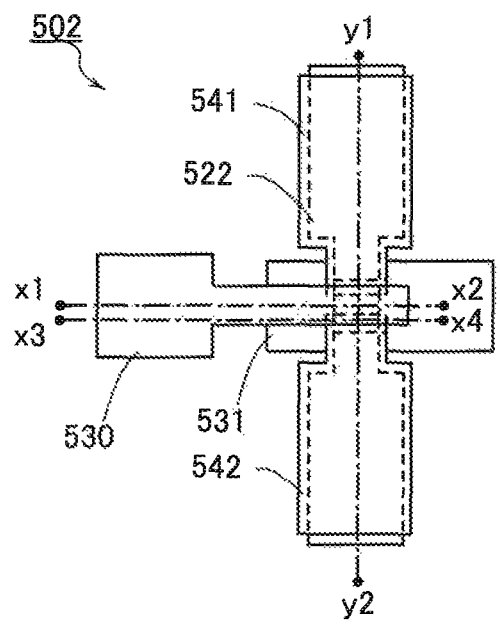
FIGS. 16A to 16D illustrate a structure example of a transistor.
Figure 16B:
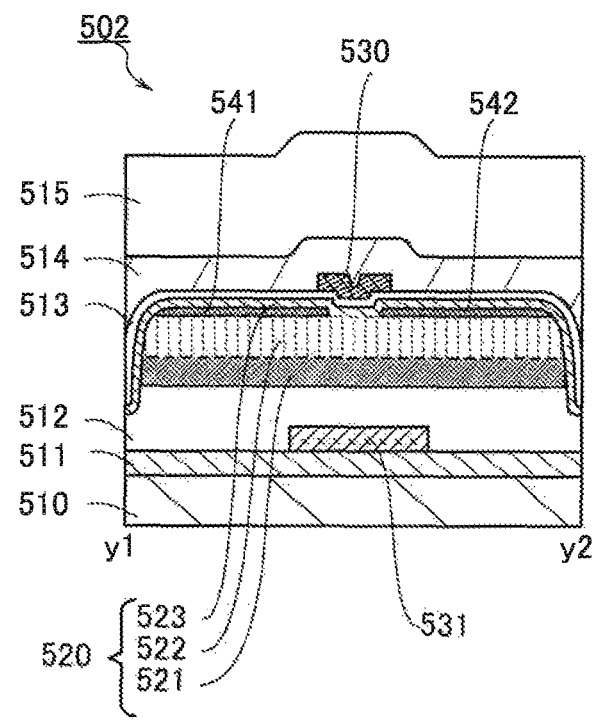
Figure 16C:
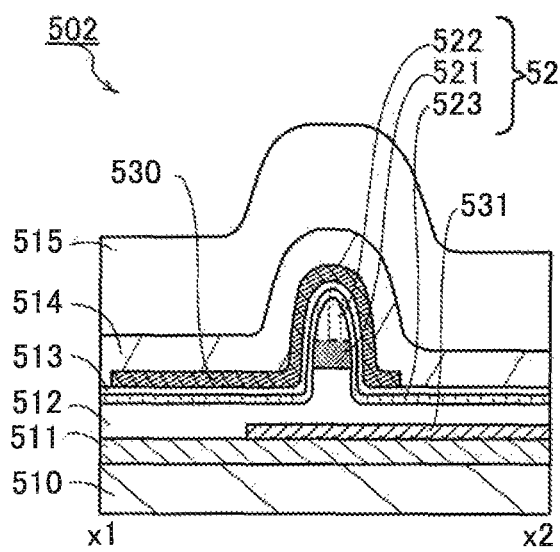
Figure 16D:
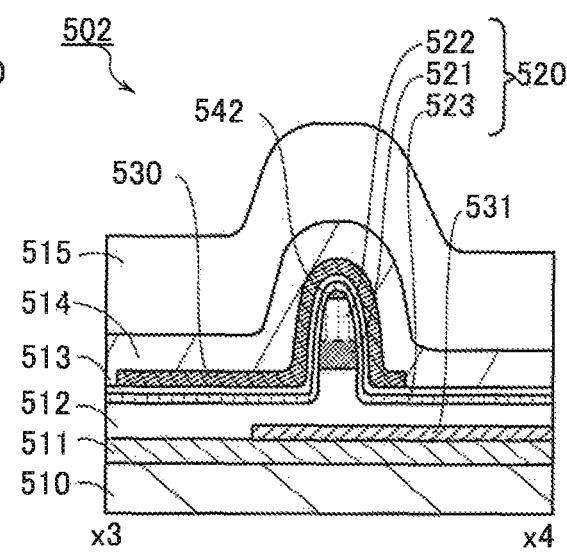
Figure 17A:
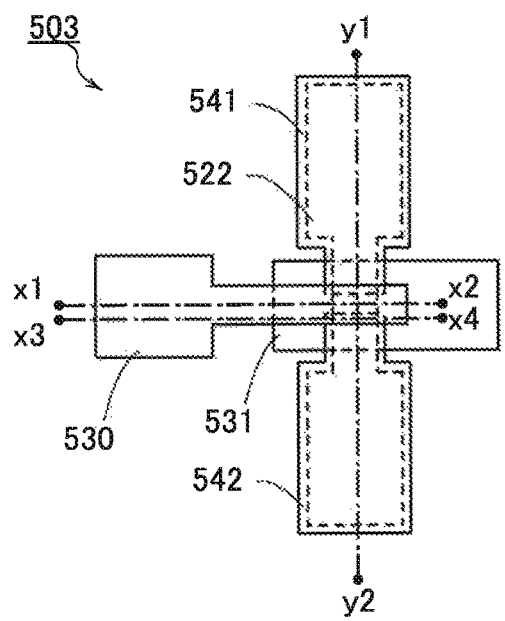
FIGS. 17A to 17D illustrate a structure example of a transistor.
Figure 17B:
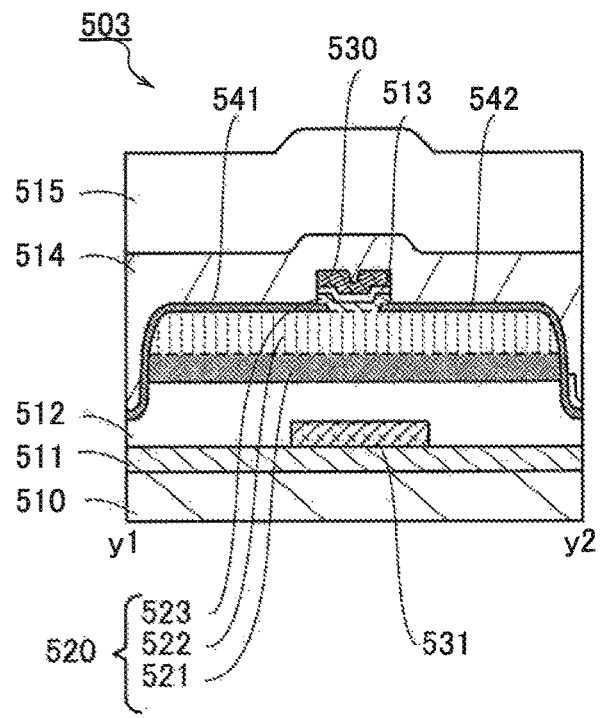
Figure 17C:
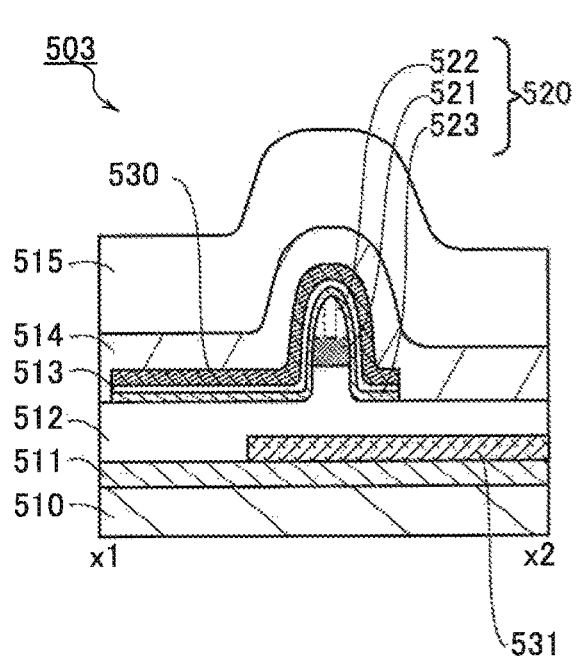
Figure 17D:
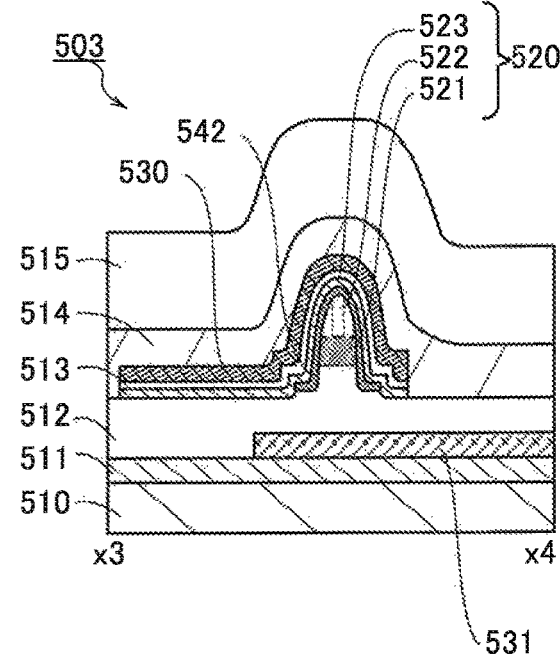
Figure 18A:
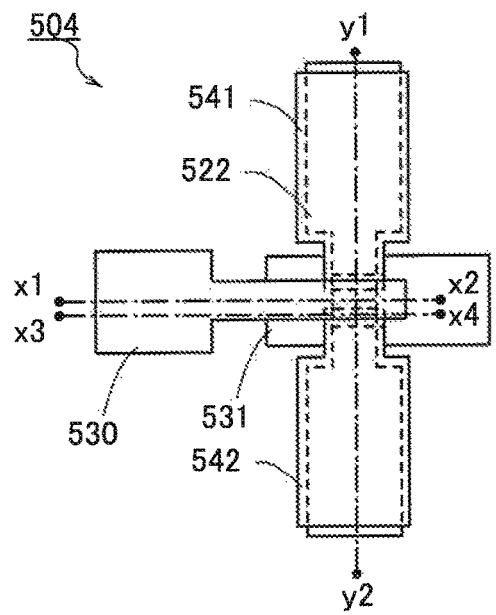
FIGS. 18A to 18D illustrate a structure example of a transistor.
Figure 18B:
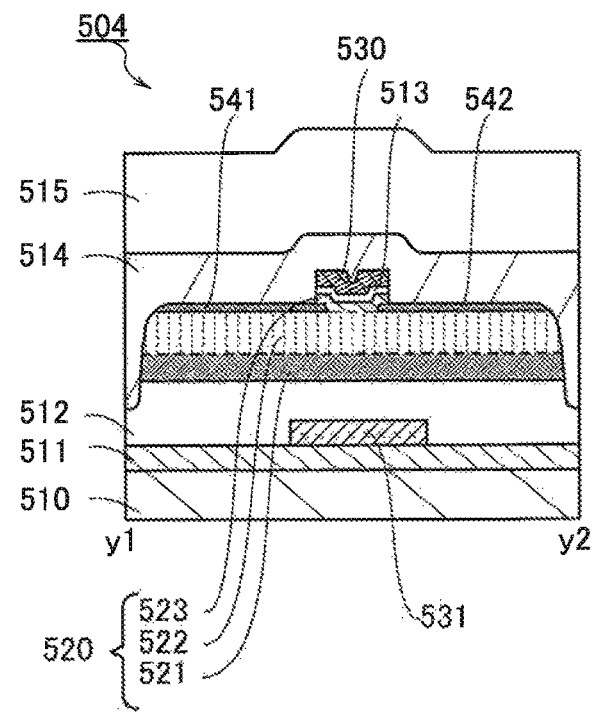
Figure 18C:
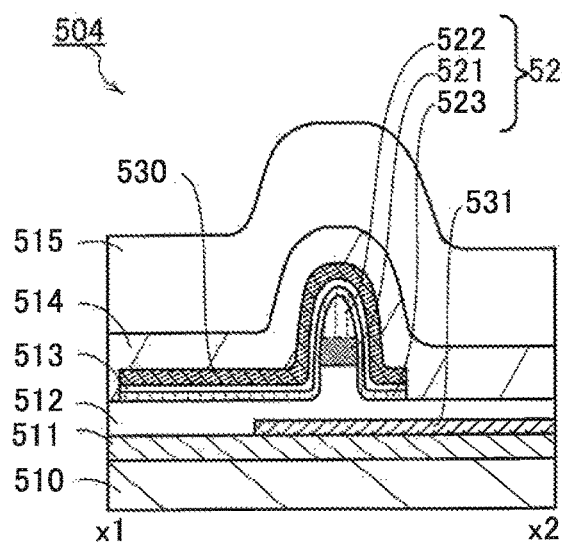
Figure 18D:
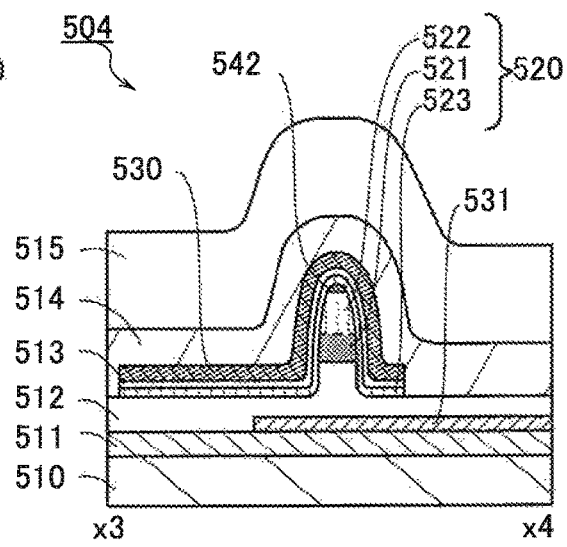
Figure 19A:
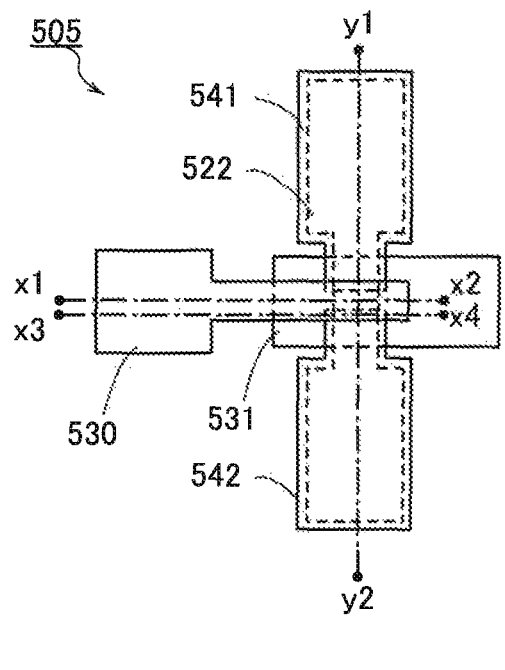
FIGS. 19A to 19D illustrate a structure example of a transistor.
Figure 19B:
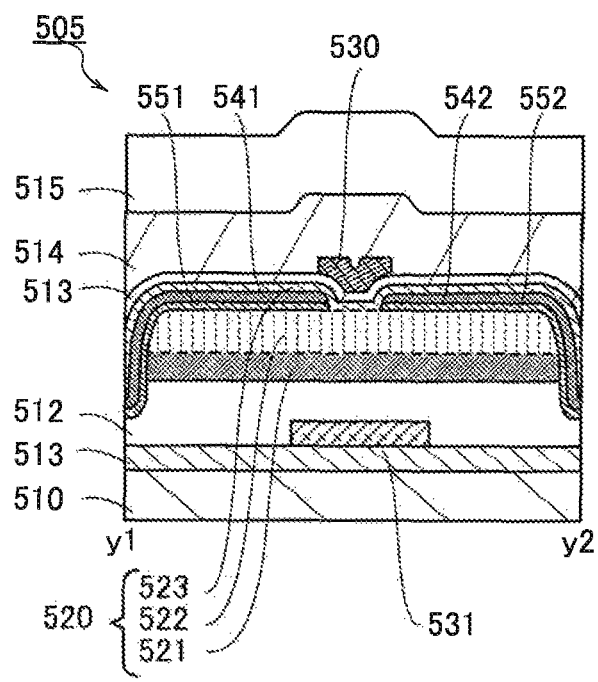
Figure 19C:
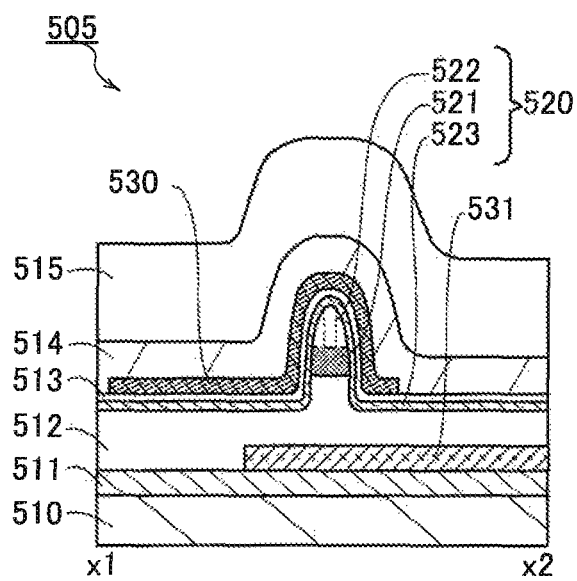
Figure 19D:
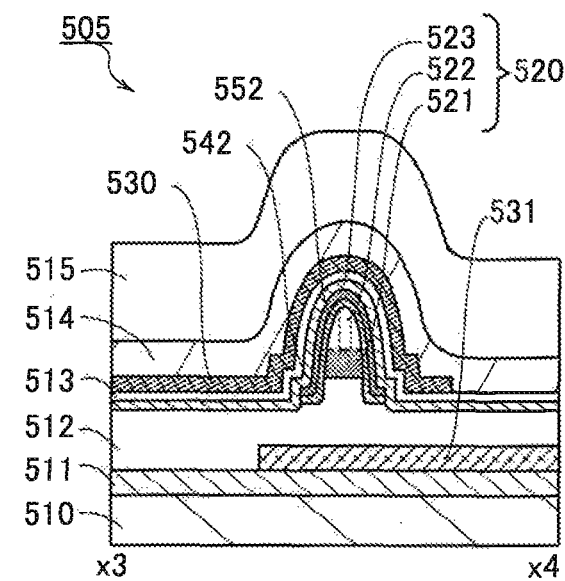
Figure 20A:
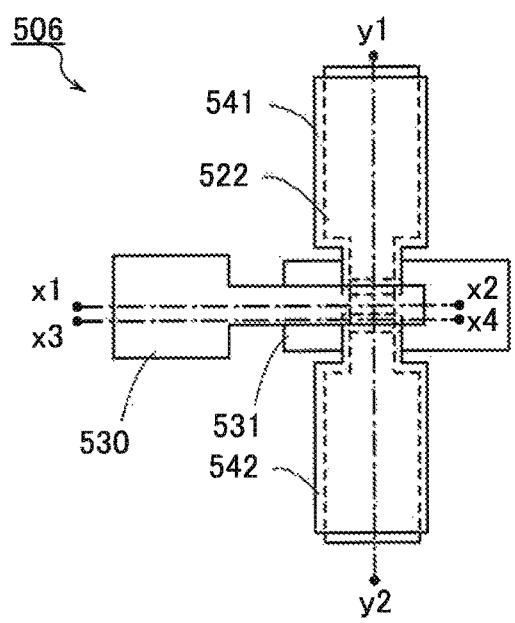
FIGS. 20A to 20D illustrate a structure example of a transistor.
Figure 20B:
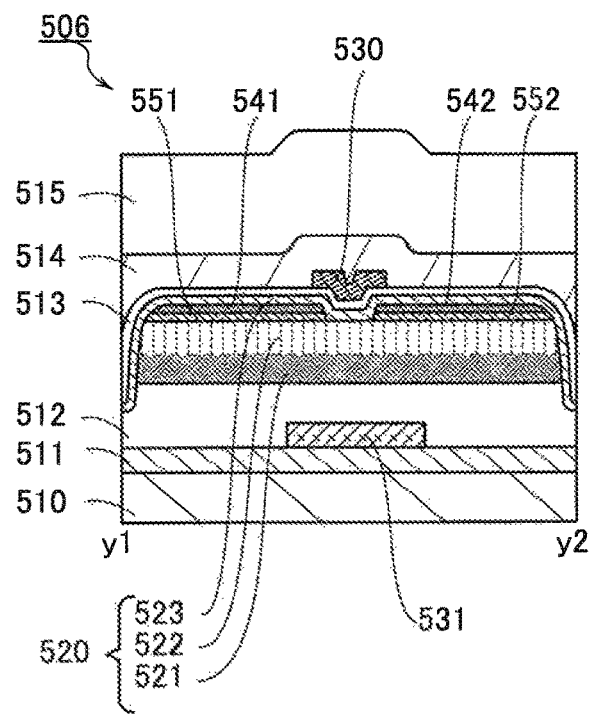
Figure 20C:
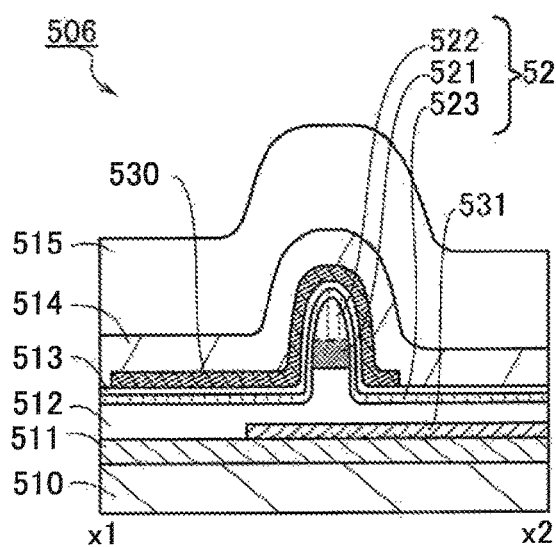
Figure 20D:
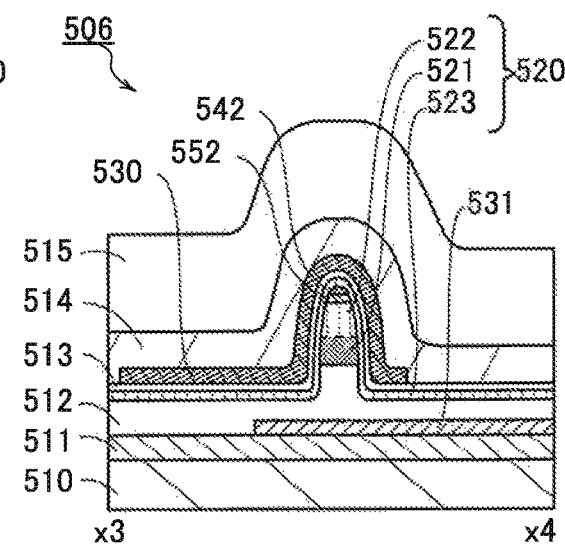

An OS transistor 502 illustrated in FIGS. 16A to 16D is a modification example of the OS transistor 501. FIG. 16A is a top view of the OS transistor 502. FIG. 16B is a cross-sectional view along the line y1-y2, FIG. 16C is a cross-sectional view along the line x1-x2, and FIG. 16D is a cross-sectional view along the line x3-x4. To clarify the device structure, FIG. 16A does not illustrate some components.

Like the OS transistor 501, the OS transistor 502 in FIGS. 16A to 16D also has the s-channel structure. The OS transistor 502 is different from the OS transistor 501 in the shapes of the conductive layers 541 and 542. The conductive layers 541 and 542 of the OS transistor 502 are formed from a hard mask used for forming the stacked film of the oxide semiconductor layers 521 and 522. Therefore, the conductive layers 541 and 542 are not in contact with the side surfaces of the oxide semiconductor layers 521 and 522 (see FIG. 16D).

Through the following steps, the oxide semiconductor layers 521 and 522 and the conductive layers 541 and 542 can be formed. A two-layer oxide semiconductor film to be the oxide semiconductor layers 521 and 522 is formed. A single-layer or multi-layer conductive film is formed over the oxide semiconductor film. This conductive film is etched to form a hard mask. With the use of this hard mask, the two-layer oxide semiconductor film is etched to form the stacked film of the oxide semiconductor layers 521 and 522. Then, the hard mask is etched to form the conductive layers 541 and 542.

Structure Examples 3 and 4

An OS transistor 503 illustrated in FIGS. 17A to 17D is a modification example of the OS transistor 501. An OS transistor 504 illustrated in FIGS. 18A to 18D is a modification example of the OS transistor 502. In each of the OS transistors 503 and 504, the oxide semiconductor layer 523 and the insulating layer 513 are etched using the conductive layer 530 as a mask. Thus, an edge of the oxide semiconductor layer 523 and an edge of the insulating layer 513 are substantially aligned with an edge of the conductive layer 530.

Structure Examples 5 and 6

An OS transistor 505 illustrated in FIGS. 19A to 19D is a modification example of the OS transistor 501, and an OS transistor 506 illustrated in FIGS. 20A to 20D is a modification example of the OS transistor 502. The OS transistors 505 and 506 each include a layer 551 between the oxide semiconductor layer 522 and the conductive layer 541 and a layer 552 between the oxide semiconductor layer 522 and the conductive layer 542.

The layers 551 and 552 can be formed using a layer of a transparent conductor, an oxide semiconductor, a nitride semiconductor, or an oxynitride semiconductor, for example. The layers 551 and 552 can be formed using an n-type oxide semiconductor layer or a conductive layer which has a higher resistance than the conductive layers 541 and 542. The layers 551 and 552 may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, or a layer containing titanium and niobium. These layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress variation in electrical characteristics of the transistor due to stray light.

As each of the layers 551 and 552, a layer which does not form a Schottky barrier with the oxide semiconductor layer 523 is preferably used. Thus, on-state characteristics of the OS transistors 505 and 506 can be improved.

The layers 551 and 552 preferably have higher resistance than the conductive layers 541 and 542. The resistance of the layers 551 and 552 is preferably lower than the channel resistance of the transistor. For example, the layers 551 and 552 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having a resistivity within the above range can reduce electric field concentration in a boundary portion between the channel and the drain. Therefore, variation in electrical characteristics of the transistor can be reduced. In addition, punch-through current generated by an electric field from the drain can be reduced. Thus, even a transistor with a small channel length can have favorable saturation characteristics. Note that in a circuit configuration in which the source and the drain do not interchange, only one of the layers 551 and 552 (e.g., the layer on the drain side) is preferably provided according to circumstances.

Structure Example 7

Figure 30A:
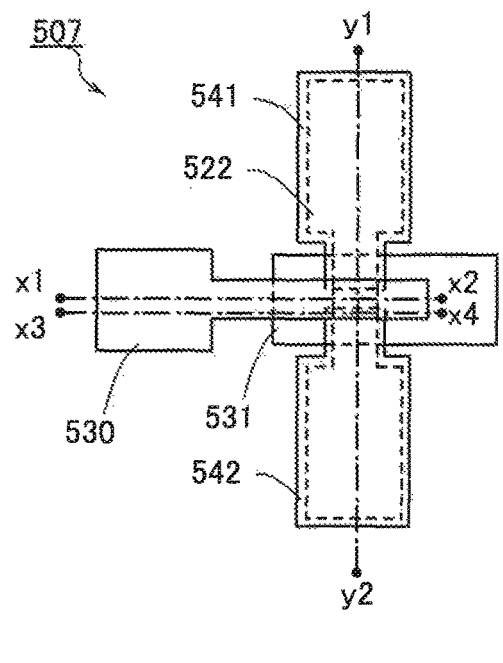
FIGS. 30A to 30D illustrate a structure example of a transistor.
Figure 30B:
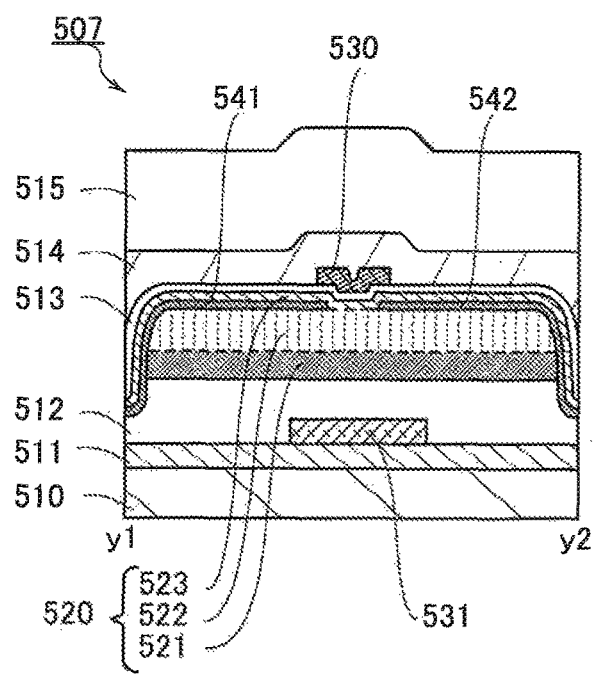
Figure 30C:
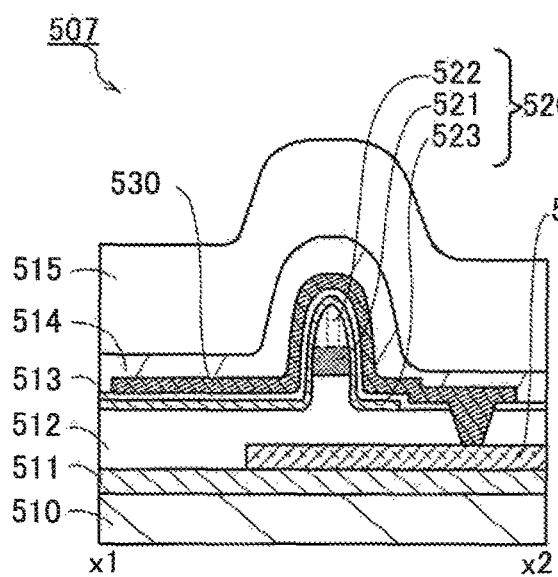
Figure 30D:
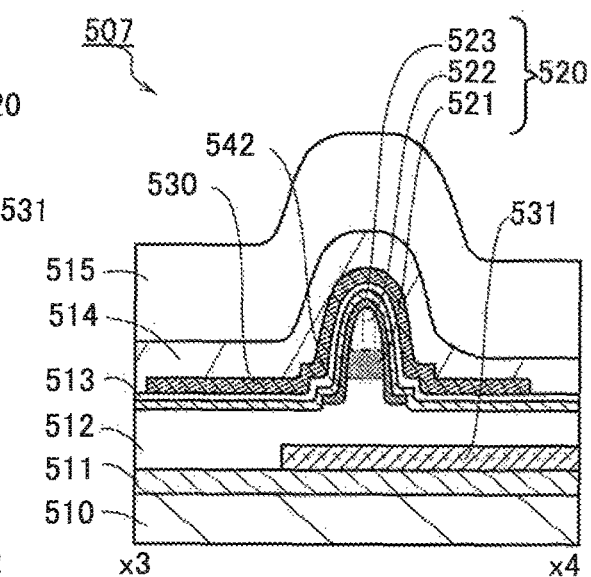

An OS transistor 507 illustrated in FIGS. 30A to 30D is a modification example of the OS transistor 503. As illustrated in FIG. 30C, the conductive layer 530 is connected to the conductive layer 531 through an opening provided in the insulating layers 512 and 513. Thus, the gate and the backgate of the OS transistor 507 can be connected to each other.

Next, the components of the OS transistors 501 to 507 will be described.

<Oxide Semiconductor Layer>

As a semiconductor material of the oxide semiconductor layers 521 to 523, typically, an In—Ga oxide, an In—Zn oxide, or an In-M-Zn oxide (M is Ga, Y, Zr, La, Ce, or Nd) is used. In addition, the oxide semiconductor layers 521 to 523 are not limited to the oxide layers containing indium. The oxide semiconductor layers 521 to 523 can each be a Zn—Sn oxide layer, a Ga—Sn oxide layer, or a Zn—Mg oxide layer, for example. The oxide semiconductor layer 522 is preferably formed using an In-M-Zn oxide. Each of the oxide semiconductor layers 521 and 523 can be formed using a Ga oxide.

The case where the oxide semiconductor layers 521 to 523 are formed using In-M-Zn oxide films formed by a sputtering method will be described. The atomic ratio of metal elements in a target for the deposition of an In-M-Zn oxide that is used for forming the oxide semiconductor layer 522 is In:M:Zn=$x_1$:$y_1$:$z_1$. The atomic ratio of metal elements in a target that is used for forming the oxide semiconductor layers 521 and 523 is In:M:Zn=$x_2$:$y_2$:$z_2$.

For forming the oxide semiconductor layer 522, a polycrystalline target of an In-M-Zn oxide in which $x_1/y_1$ is greater than or equal to ⅓ and less than or equal to 6, or greater than or equal to 1 and less than or equal to 6, and $z_1/y_1$ is greater than or equal to ⅓ and less than or equal to 6, or greater than or equal to 1 and less than or equal to 6 is preferably used. When $z_1/y_1$ is greater than or equal to 1 and less than or equal to 6, a c-axis aligned crystalline oxide semiconductor (CAAC-OS) film is easily formed. Typical examples of the atomic ratio of metal elements in the target include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. Note that the CAAC-OS is an oxide semiconductor including a c-axis aligned crystal part and will be described later. It is preferable that the CAAC-OS film have no spinel crystal structure in particular. Thus, the reliability and electrical characteristics of the transistor including the CAAC-OS film can be improved.

In the target used for forming the oxide semiconductor layers 521 and 523, $x_2/y_2$ is preferably smaller than $x_1/y_1$, and $z_2/y_2$ is preferably greater than or equal to ⅓ and less than or equal to 6, further preferably greater than or equal to 1 and less than or equal to 6. When $z_2/y_2$ is greater than or equal to 1 and less than or equal to 6, a CAAC-OS film is easily formed. Typical examples of the atomic ratio of metal elements in the target include In:M:Zn=1:3:2, In:M:Zn=1:3:4, In:M:Zn=1:3:6, In:M:Zn=1:3:8, InM:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the In-M-Zn oxide film, the proportions of atoms in the atomic ratio vary within a range of ±40% as an error. For example, the atomic ratio of metal elements contained in an oxide semiconductor film formed using an oxide target of In:M:Zn=4:2:4.1 is approximately In:M:Zn=4:2:3.

[Energy Band]

Figure 21A:
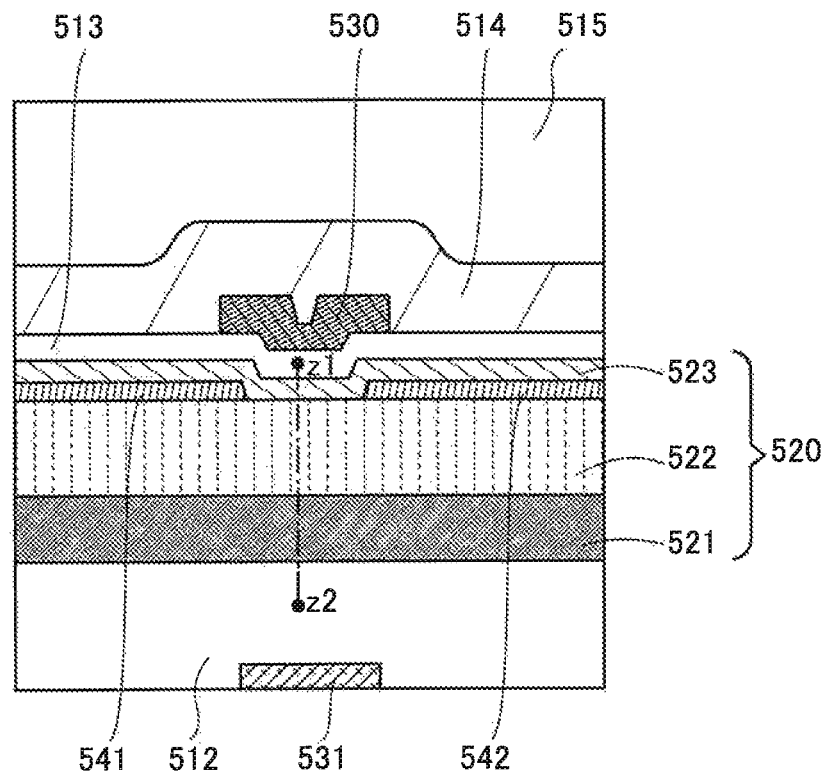
FIGS. 21A and 21B illustrate a structure example of a transistor.
Figure 21B:
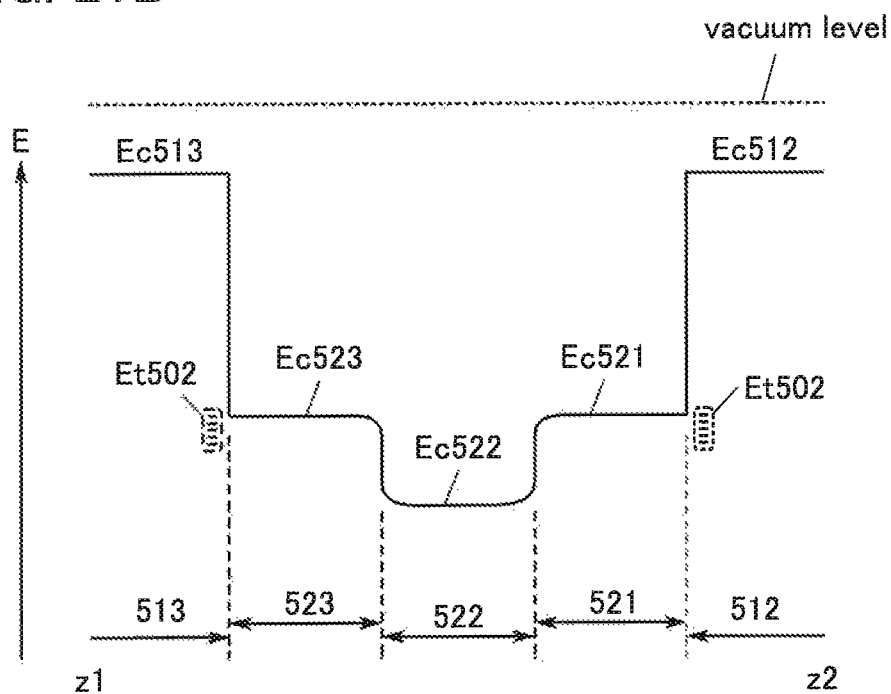

Next, a function and an effect of the oxide semiconductor layer 520 in which the oxide semiconductor layers 521 to 523 are stacked will be described using an energy band diagram in FIG. 21B. FIG. 21A is an enlarged view of a channel region of the OS transistor 502 in FIG. 16B. FIG. 21B shows the energy band structure of a portion along the dashed-dotted line z1-z2 in FIG. 21A (channel formation region of the OS transistor 502). The OS transistor 502 is described below as an example, but the same applies to the OS transistors 501 and 503 to 507.

In FIG. 21B, Ec512, Ec521, Ec522, Ec523, and Ec513 denote the energy of the conduction band minimum of the insulating layer 512, the oxide semiconductor layer 521, the oxide semiconductor layer 522, the oxide semiconductor layer 523, and the insulating layer 513, respectively.

Here, the energy difference between the vacuum level and the conduction band minimum (the energy difference is also referred to as an electron affinity) corresponds to a value obtained by subtracting an energy gap from the energy difference between the vacuum level and the valence band maximum (the energy difference is also referred to as an ionization potential). Note that the energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectrometer (UPS) (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating layers 512 and 513 are insulators, Ec512 and Ec513 are closer to the vacuum level than Ec521 to Ec523 (i.e., the insulating layers 512 and 513 each have a smaller electron affinity than the oxide semiconductor layers 521 to 523).

Ec521 is closer to the vacuum level than Ec522. Specifically, Ec521 is preferably closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the oxide semiconductor layer 521 and the oxide semiconductor layer 522 and the interface between the oxide semiconductor layer 522 and the oxide semiconductor layer 523; thus, the energy of the conduction band minimum changes continuously. In other words, no state or few states exist at these interfaces.

Accordingly, electrons transfer mainly through the oxide semiconductor layer 522 in the stacked-layer structure having the above energy band structure. Therefore, even if a state exists at the interface between the oxide semiconductor layer 521 and the insulating layer 512 or the interface between the oxide semiconductor layer 523 and the insulating layer 513, the state hardly influences the transfer of electrons. In addition, since no state or few states exist at the interface between the oxide semiconductor layer 521 and the oxide semiconductor layer 522 and the interface between the oxide semiconductor layer 523 and the oxide semiconductor layer 522, the transfer of electrons is not interrupted in the region. Consequently, the OS transistor 502 including the above stacked oxide semiconductors can have high field-effect mobility.

Although trap states Et502 due to impurities or defects might be formed in the vicinity of the interface between the oxide semiconductor layer 521 and the insulating layer 512 and the interface between the oxide semiconductor layer 523 and the insulating layer 513 as illustrated in FIG. 21B, the oxide semiconductor layer 522 can be separated from the trap states owing to the existence of the oxide semiconductor layers 521 and 523.

In the OS transistor 502, in the channel width direction, the top surface and side surfaces of the oxide semiconductor layer 522 are in contact with the oxide semiconductor layer 523, and the bottom surface of the oxide semiconductor layer 522 is in contact with the oxide semiconductor layer 521 (see FIG. 16C). Surrounding the oxide semiconductor layer 522 with the oxide semiconductor layers 521 and 523 in this manner can further reduce the influence of the trap states.

However, when the energy difference between Ec522 and Ec521 or Ec523 is small, an electron in the oxide semiconductor layer 522 might reach the trap state by passing over the energy difference. When the electron is trapped by the trap state, negative fixed charge is generated at the interface with the insulating film, causing the threshold voltage of the transistor to shift in the positive direction.

Therefore, each of the energy differences between Ec521 and Ec522 and between Ec522 and Ec523 is preferably 0.1 eV or more, further preferably 0.15 eV or more, in which case a change in the threshold voltage of the transistor can be reduced and the transistor can have favorable electrical characteristics.

The band gap of each of the oxide semiconductor layers 521 and 523 is preferably wider than that of the oxide semiconductor layer 522.

For the oxide semiconductor layers 521 and 523, a material containing Ga Y, Zr, La, Ce, or Nd with a higher atomic ratio than that used for the oxide semiconductor layer 522 can be used, for example. Specifically, the atomic ratio of the above metal elements in the oxide semiconductor layers 521 and 523 is 1.5 times or more, preferably 2 times or more, further preferably 3 times or more as large as that in the oxide semiconductor layer 522. The above metal element is strongly bonded to oxygen and thus has a function of suppressing generation of an oxygen vacancy in the oxide semiconductor. That is, an oxygen vacancy is less likely to be generated in the oxide semiconductor layers 521 and 523 than in the oxide semiconductor layer 522.

When the oxide semiconductor layers 521 to 523 are In-M-Zn oxides containing at least indium, zinc, and M (M is Ga, Y, Zr, La, Ce, or Nd) and the atomic ratio of In to M and Zn in the oxide semiconductor layer 521 is $x_1:y_1:z_1$, that in the oxide semiconductor layer 522 is $x_2:y_2:z_2$, and that in the oxide semiconductor layer 523 is $x_3:y_3:z_3$, $y_1/x_1$ and $y_3/x_3$ are preferably larger than $y_2/x_2$. Furthermore, $y_1/x_1$ and $y_3/x_3$ are 1.5 times or more, preferably 2 times or more, further preferably 3 times or more as large as $y_2/x_2$. In this case, the transistor can have stable electrical characteristics when $y_2$ is greater than or equal to $x_2$ in the oxide semiconductor layer 522. However, when $y_2$ is three times or more as large as $x_2$, the field-effect mobility of the transistor is decreased; accordingly, $y_2$ is preferably smaller than 3 times $x_2$.

An In-M-Zn oxide film satisfying the above conditions can be formed using an In-M-Zn oxide target satisfying the above atomic ratio of metal elements.

In the case where Zn and O are not taken into consideration, the proportion of In and the proportion of M in the oxide semiconductor layers 521 and 523 are preferably lower than 50 atomic % and higher than 50 atomic %, respectively, further preferably lower than 25 atomic % and higher than 75 atomic %, respectively. In the case where Zn and O are not taken into consideration, the proportion of In and the proportion of M in the oxide semiconductor layer 522 are preferably higher than 25 atomic % and lower than 75 atomic %, respectively, further preferably higher than 34 atomic % and lower than 66 atomic %, respectively.

Furthermore, at least one of the oxide semiconductor layers 521 and 523 does not necessarily contain indium in some cases. For example, the oxide semiconductor layer 521 and/or the oxide semiconductor layer 523 can be formed using a gallium oxide film.

The thickness of each of the oxide semiconductor layers 521 and 523 is greater than or equal to 3 nm and less than or equal to 100 nm, preferably greater than or equal to 3 nm and less than or equal to 50 nm. The thickness of the oxide semiconductor layer 522 is greater than or equal to 3 nm and less than or equal to 200 nm, preferably greater than or equal to 3 nm and less than or equal to 100 nm, further preferably greater than or equal to 3 nm and less than or equal to 50 nm.

The oxide semiconductor layer 523 is preferably thinner than the oxide semiconductor layers 521 and 522.

In order that an OS transistor in which a channel is formed in an oxide semiconductor have stable electrical characteristics, it is effective to make the oxide semiconductor intrinsic or substantially intrinsic by reducing the impurity concentration in the oxide semiconductor. The term "substantially intrinsic" refers to the state in which an oxide semiconductor has a carrier density of lower than $8\times10^{11}/cm^3$, preferably lower than $1\times10^{11}/cm^3$, further preferably lower than $1\times10^{10}/cm^3$ and higher than or equal to $1\times10^{-9}/cm^3$.

In the oxide semiconductor, hydrogen, nitrogen, carbon, silicon, and a metal element other than main components are impurities. For example, hydrogen and nitrogen form donor levels to increase the carrier density, and silicon forms impurity levels in the oxide semiconductor. The impurity level serves as a trap, which might deteriorate the electrical characteristics of the transistor. Therefore, it is preferable to reduce the impurity concentration in the oxide semiconductor layers 521 to 523 and at interfaces between the oxide semiconductor layers.

In order to make the oxide semiconductor intrinsic or substantially intrinsic, for example, the silicon concentration at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, further preferably lower than $1\times10^{18}$ atoms/cm$^3$. The hydrogen concentration at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The nitrogen concentration at a certain depth of the oxide semiconductor or in a region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor includes a crystal, high concentration of silicon or carbon might decrease the crystallinity of the oxide semiconductor. In order to prevent the decrease in the crystallinity of the oxide semiconductor, for example, the silicon concentration at a certain depth of the oxide semiconductor or in a region of the oxide semiconductor may be lower than $1\times10^{19}$ atoms/cm$^3$, preferably lower than $5\times10^{18}$ atoms/cm$^3$, further preferably lower than $1\times10^{18}$ atoms/cm$^3$. Furthermore, the carbon concentration at a certain depth of the oxide semiconductor or in a region of the oxide semiconductor may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above highly purified oxide semiconductor is used for a channel formation region has extremely low off-state current. In the case where the voltage between a source and a drain is set to approximately 0.1 V, 5 V, or 10 V, for example, the off-state current standardized on the channel width of the transistor can be as low as several yoctoamperes per micrometer to several zeptoamperes per micrometer.

[Off-State Current]

Unless otherwise specified, the off-state current in this specification refers to drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to drain current that flows when the gate-source voltage $V_{gs}$ is lower than the threshold voltage $V_{th}$.

The off-state current of a transistor depends on $V_{gs}$ in some cases. Thus, in some cases, "the off-state current of a transistor is I or lower" means that the off-state current of the transistor is I or lower at a certain $V_{gs}$. The off-state current of a transistor may refer to off-state current at given $V_{gs}$, at $V_{gs}$ in a given range, or at $V_{gs}$ at which sufficiently low off-state current is obtained.

As an example, an assumption is made that an n-channel transistor has a threshold voltage $V_{th}$ of 0.5 V and a drain current of $1\times10^{-9}$ A at $V_{gs}$ of 0.5 V, $1\times10^{-13}$ A at $V_{gs}$ of 0.1 V, $1\times10^{-19}$ A at $V_{gs}$ of –0.5 V, and $1\times10^{-22}$ A at $V_{gs}$ of –0.8 V. The drain current of the transistor is $1\times10^{-19}$ A or lower at $V_{gs}$ of –0.5 V or at $V_{gs}$ in the range of –0.8 V to –0.5 V; therefore, it can be said that the off-state current of the transistor is $1\times10^{-19}$ A or lower. Since the drain current of the transistor is $1\times10^{-22}$ A or lower at a certain $V_{gs}$, it can be said that the off-state current of the transistor is $1\times10^{-22}$ A or lower.

In this specification, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.) is I or lower at a certain $V_{gs}$.

The off-state current of a transistor depends on the voltage Vas between its drain and source in some cases. Unless otherwise specified, the off-state current in this specification may be off-state current at Vas of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vas at which the reliability of a semiconductor device or the like including the transistor is ensured or at Vas used in the semiconductor device or the like including the transistor. The state where the off-state current of a transistor is I or lower may indicate that the off-state current of the transistor at Vas of 0.1 V, 0.8 V, 1 V, 1.2 V, 1.8 V, 2.5 V, 3 V, 3.3 V, 10 V, 12 V, 16 V, or 20 V, at Vas at which the reliability of a semiconductor device or the like including the transistor is ensured, or at Vas used in the semiconductor device or the like including the transistor is I or lower at a certain $V_{gs}$.

In the above description of the off-state current, a drain may be replaced with a source. That is, the off-state current sometimes refers to current that flows through a source of a transistor in the off state.

In this specification, the term "leakage current" sometimes expresses the same meaning as "off-state current".

In this specification, the off-state current sometimes refers to current that flows between a source and a drain when a transistor is in the off state, for example.

[Crystal Structure of Oxide Semiconductor Film]

The structure of an oxide semiconductor film that forms the oxide semiconductor layer 520 will be described. In this specification, trigonal and rhombohedral crystal systems are included in a hexagonal crystal system.

An oxide semiconductor film is roughly classified into a single-crystal oxide semiconductor film and a non-single-crystal oxide semiconductor film. The non-single-crystal oxide semiconductor film refers to a CAAC-OS film, a polycrystalline oxide semiconductor film, a microcrystalline oxide semiconductor film, an amorphous oxide semiconductor film, or the like.

<CAAC-OS Film>

A CAAC-OS film is one of oxide semiconductor films and has a plurality of c-axis aligned crystal parts.

In an image which is obtained by the combined analysis of a bright-field image and a diffraction pattern of a CAAC-OS film taken with a transmission electron microscope (TEM) (such an image is also referred to as a high-resolution TEM image), a plurality of crystal parts can be observed. However, even in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in the direction substantially parallel to a sample surface, metal atoms are arranged in a layered manner in the crystal parts. Each metal atom layer has a morphology reflecting a surface over which the CAAC-OS film is formed (also referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in the direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when a CAAC-OS film including an $InGaZnO_4$ crystal is analyzed by an out-of-plane method, a peak may appear when the diffraction angle (2θ) is around 31°. This peak is derived from the (009) plane of the $InGaZnO_4$ crystal, which indicates that crystals in the CAAC-OS film have c-axis alignment and that the c-axes are aligned in the direction substantially perpendicular to the formation surface or the top surface of the CAAC-OS film.

When the CAAC-OS film including an $InGaZnO_4$ crystal is analyzed by an out-of-plane method, a peak may also be observed when 2θ is around 36°, in addition to the peak at 2θ of around 31°. The peak of 2θ at around 36° indicates that a crystal having no c-axis alignment is included in part of the CAAC-OS film. It is preferable that in the CAAC-OS film, a peak appear when 2θ is around 31° and no peak appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a constituent metal element of the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus, it disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, an oxygen vacancy in the oxide semiconductor film serves as a carrier trap or a carrier generation source when hydrogen is captured therein.

The state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources and thus can have a low carrier density. Thus, a transistor including the oxide semiconductor film rarely has negative threshold voltage (is rarely normally on). In addition, the highly purified intrinsic or substantially highly purified intrinsic oxide semiconductor film has few carrier traps. Accordingly, the transistor including the oxide semiconductor film has little variation in electrical characteristics and is highly reliable. Charge trapped by the carrier traps in the oxide semiconductor film takes a long time to be released and might behave like fixed charge. Thus, the transistor which includes the oxide semiconductor film having a high impurity concentration and a high density of defect states has unstable electrical characteristics in some cases.

In an OS transistor including the CAAC-OS film, variation in electrical characteristics due to irradiation with visible light or ultraviolet light is small.

<Microcrystalline Oxide Semiconductor Film>

A high-resolution TEM image of a microcrystalline oxide semiconductor film has a region in which a crystal part is observed and a region in which a crystal part is not clearly observed. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or greater than or equal to 1 nm and less than or equal to 3 nm is specifically referred to as a nanocrystal (nc). An oxide semiconductor film including a nanocrystal is referred to as a nanocrystalline oxide semiconductor (nc-OS) film. In a high-resolution TEM image of the nc-OS film, for example, a grain boundary cannot be clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed.

Accordingly, in some cases, the nc-OS film cannot be distinguished from an amorphous oxide semiconductor film depending on the analysis method. For example, when the nc-OS film is subjected to structural analysis by an out-of-plane method with an XRD apparatus using an X-ray having a diameter larger than that of a crystal part, a peak indicating a crystal plane does not appear. Furthermore, a diffraction pattern like a halo pattern is observed in a selected-area electron diffraction pattern of the nc-OS film which is obtained using an electron beam having a probe diameter (e.g., 50 nm or larger) larger than the diameter of a crystal part. Meanwhile, spots are observed in a nanobeam electron diffraction pattern of the nc-OS film which is obtained using an electron beam having a probe diameter close to or smaller than the diameter of a crystal part. Furthermore, in a nanobeam electron diffraction pattern of the nc-OS film, regions with high luminance in a circular (ring) pattern are observed in some cases. In a nanobeam electron diffraction pattern of the nc-OS film, a plurality of spots is also observed in a ring-like region in some cases.

The nc-OS film is an oxide semiconductor film that has higher regularity than an amorphous oxide semiconductor film. Therefore, the nc-OS film has a lower density of defect states than an amorphous oxide semiconductor film. However, there is no regularity of crystal orientation between different crystal parts in the nc-OS film. Hence, the nc-OS film has a higher density of defect states than the CAAC-OS film.

<Amorphous Oxide Semiconductor Film>

An amorphous oxide semiconductor film has disordered atomic arrangement and no crystal part. For example, the amorphous oxide semiconductor film does not have a specific state like quartz glass.

In a high-resolution TEM image of the amorphous oxide semiconductor film, crystal parts cannot be observed. When the amorphous oxide semiconductor film is subjected to structural analysis by an out-of-plane method with an XRD apparatus, a peak indicating a crystal plane does not appear. A halo pattern is observed in an electron diffraction pattern of the amorphous oxide semiconductor film. Furthermore, a halo pattern is observed but no spot is observed in a nanobeam electron diffraction pattern of the amorphous oxide semiconductor film.

An oxide semiconductor film may have a structure with physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, the high-resolution TEM image has a region in which a crystal part is clearly observed and a region in which no crystal part is observed. In some cases, the a-like OS film is crystallized by a slight amount of electron beam used for TEM observation, and the growth of the crystal part is observed. In contrast, crystallization by a slight amount of electron beam used for TEM observation is hardly observed in an nc-OS film having good quality.

The size of a crystal part in the a-like OS film and the nc-OS film can be measured using high-resolution TEM images. For example, an $InGaZnO_4$ crystal has a layered structure in which two Ga—Zn—O layers are positioned between In—O layers. A unit cell of the $InGaZnO_4$ crystal has a structure in which nine layers, namely three In—O layers and six Ga—Zn—O layers, are stacked in the c-axis direction. Accordingly, the spacing between these adjacent layers is equivalent to the lattice spacing on the (009) plane (also referred to as d value). The value is calculated to 0.29 nm from crystal structure analysis. Thus, focusing on the lattice fringes in the high-resolution TEM image, each of the lattice fringes between which the spacing is greater than or equal to 0.28 nm and less than or equal to 0.30 nm corresponds to the a-b plane of the InGaZnO$_4$ crystal.

The film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition. For example, the film density of an a-like OS film is higher than or equal to 78.6% and lower than 92.3% of the film density of a single crystal oxide semiconductor film having the same composition. For example, the film density of an nc-OS film and the film density of a CAAC-OS film are each higher than or equal to 92.3% and lower than 100% of the film density of a single crystal oxide semiconductor film having the same composition. Note that it is difficult to form an oxide semiconductor film having a film density of lower than 78% of the film density of a single crystal oxide semiconductor film having the same composition.

Specific examples of the above description will be given. For example, in the case of an oxide semiconductor film having an atomic ratio of In:Ga:Zn=1:1:1, the film density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the film density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the film density of the nc-OS film and the film density of the CAAC-OS film are each higher than or equal to 5.9 g/cm$^3$ and lower than 6.3 g/cm$^3$.

Note that there is a possibility that an oxide semiconductor film having a certain composition cannot exist in a single crystal structure. In this case, single crystal oxide semiconductor films with different compositions are combined in an adequate ratio to calculate the film density equivalent to that of a single crystal oxide semiconductor film having the desired composition. The film density of the single crystal oxide semiconductor film having the desired composition can be calculated using a weighted average with respect to the combination ratio of the single crystal oxide semiconductor films with different compositions. Note that it is preferable to calculate the film density by combining as few kinds of single crystal oxide semiconductor films as possible.

Note that an oxide semiconductor film may be a stacked film including two or more of an amorphous oxide semiconductor film, an a-like OS film, a microcrystalline oxide semiconductor film, and a CAAC-OS film, for example.

<Substrate>

The substrate 510 is not limited to a simple supporting substrate and may be a substrate where a device such as a transistor is formed. In this case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the oxide semiconductor layer 520. For this reason, the insulating layer 512 is preferably an insulating film containing oxygen, further preferably an insulating film which contains a higher proportion of oxygen than the stoichiometric composition. For example, a film from which oxygen molecules are released at 1.0×10$^{18}$ molecules/cm$^3$ or more in thermal desorption spectroscopy (TDS) at a surface temperature of the film of higher than or equal to 100° C. and lower than or equal to 700° C., or higher than or equal to 100° C. and lower than or equal to 500° C. is used. When the substrate 510 is a substrate where a device is formed, the insulating layer 511 is preferably subjected to planarization treatment such as chemical mechanical polishing (CMP) so as to have a flat surface.

The insulating layers 511 and 512 can be formed using an insulating material such as aluminum oxide, aluminum oxynitride, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, silicon nitride, or aluminum nitride oxide or a mixed material of any of these materials. In this specification, an oxynitride refers to a material which contains more oxygen than nitrogen, and a nitride oxide refers to a material which contains more nitrogen than oxygen.

<Gate Electrode>

The conductive layer 530 is preferably formed using a single low-resistant material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt), an alloy of any of these materials, or a compound containing any of these materials as its main component.

The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. In particular, a Cu—Mn alloy film is preferably used because it has low electrical resistance and can prevent Cu diffusion by forming manganese oxide at the interface with an insulating film containing oxygen.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

Here, when a transistor T has a pair of gates between which a semiconductor film is positioned as in the case of the transistors 501 to 507, one of the gates may be supplied with a signal A, and the other gate may be supplied with a fixed potential Vb.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling the threshold voltage $V_{thA}$ of the transistor T. The fixed potential $V_b$ may be the potential $V_1$ or the potential $V_2$. In this case, no additional potential generation circuit is necessary to generate the fixed potential $V_b$, which is preferable. The fixed potential $V_b$ may be a potential different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor T can be reduced in some cases. The fixed potential $V_b$ may be, for example, lower than the low power supply potential. When the fixed potential $V_b$ is high, the threshold voltage $V_{thA}$ can be low in some cases. As a result, the drain current flowing when the gate-source voltage $V_{gs}$ is $V_{DD}$ and the operating speed of the circuit including the transistor T can be increased in some cases. The fixed potential $V_b$ may be, for example, higher than the low power supply potential.

Alternatively, one of the gates of the transistor T may be supplied with the signal A, and the other gate may be supplied with a signal B. The signal B is, for example, a signal for controlling the on/off state of the transistor T. The signal B may be a digital signal with two kinds of potentials, a potential $V_3$ and a potential $V_4$ ($V_3 > V_4$). For example, the potential $V_3$ may be a high power supply potential, and the potential $V_4$ may be a low power supply potential. The signal B may be an analog signal.

When both the signal A and the signal B are digital signals, the signal B may have the same digital value as the signal A. In this case, the on-state current of the transistor T and the operating speed of the circuit including the transistor T can be increased in some cases. Here, the potential $V_1$ of the signal A may be different from the potential $V_3$ of the signal B. Furthermore, the potential $V_2$ of the signal A may be different from the potential $V_4$ of the signal B. For example, if a gate insulating film for the gate to which the signal B is input is thicker than a gate insulating film for the gate to which the signal A is input, the potential amplitude of the signal B ($V_3-V_4$) may be larger than the potential amplitude of the signal A ($V_1-V_2$). In this manner, the influence of the signal A and that of the signal B on the on/off state of the transistor T can be substantially the same in some cases.

When both the signal A and the signal B are digital signals, the signal B may have a digital value different from that of the signal A. In this case, the signal A and the signal B can separately control the transistor T, and thus, higher performance can be achieved. The transistor T which is, for example, an n-channel transistor can function by itself as a NAND circuit, a NOR circuit, or the like in the following case: the transistor T is turned on only when the signal A has the potential $V_1$ and the signal B has the potential $V_3$, or the transistor T is turned off only when the signal A has the potential $V_2$ and the signal B has the potential $V_4$. The signal B may be a signal for controlling the threshold voltage $V_{thA}$. For example, the potential of the signal B in a period in which the circuit including the transistor T operates may be different from the potential of the signal B in a period in which the circuit does not operate. The potential of the signal B may vary depending on the operation mode of the circuit.

In this case, the potential of the signal B is not necessarily changed as frequently as the potential of the signal A.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor T and the operating speed of the circuit including the transistor T. The signal B may have an analog value different from that of the signal A. In this case, the signal A and the signal B can separately control the transistor T, and thus, higher performance can be achieved.

The signal A may be a digital signal, and the signal B may be an analog signal. Alternatively, the signal A may be an analog signal, and the signal B may be a digital signal.

Alternatively, one of the gates of the transistor T may be supplied with a fixed potential $V_a$, and the other gate may be supplied with the fixed potential $V_b$. When both of the gates of the transistor T are supplied with the fixed potentials, the transistor T can function as an element equivalent to a resistor in some cases. For example, when the transistor T is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

<Gate Insulating Layer>

The insulating layer 513 is formed using an insulating film having a single-layer structure or a stacked-layer structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. Note that the insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, or hafnium, for example. Specifically, the insulating layer 513 preferably contains hafnium oxide, silicon oxide, or silicon oxynitride.

Hafnium oxide has a higher dielectric constant than silicon oxide and silicon oxynitride. Therefore, the insulating layer 513 containing hafnium oxide can have a larger thickness than the insulating layer 513 containing silicon oxide or silicon oxynitride, so that leakage current due to tunnel current can be reduced. That is, a transistor with low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

<Source Electrode, Drain Electrode, Backgate Electrode>

The conductive layers 541 and 542 and the conductive layer 531 can be formed in a manner similar to that of the conductive layer 530. A Cu—Mn alloy film is preferably used for the conductive layers 541 and 542 because it has low electrical resistance and can prevent Cu diffusion by forming manganese oxide at the interface with the oxide semiconductor layer 520.

<Protective Insulating Film>

The insulating layer 514 preferably has a function of blocking oxygen, hydrogen, water, alkali metal, alkaline earth metal, and the like. The insulating layer 514 can prevent outward diffusion of oxygen from the oxide semiconductor layer 520 and entry of hydrogen, water, and the like into the oxide semiconductor layer 520 from the outside. The insulating layer 514 can be a nitride insulating film, for example. The nitride insulating film is formed using silicon nitride, silicon nitride oxide, aluminum nitride, aluminum nitride oxide, or the like. Instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities, such as hydrogen and moisture, which cause variation in electrical characteristics of the transistor, into the oxide semiconductor layer 520, preventing release of oxygen, which is the main component of the oxide semiconductor layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film having a single-layer structure or a stacked-layer structure. The insulating film can contain at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Film Formation Method>

A sputtering method and a plasma CVD method are typical examples of a method of forming an insulating film, a conductive film, a semiconductor film, and the like included in a semiconductor device. These films can be formed by another method, for example, a thermal CVD method. A metal organic chemical vapor deposition (MOCVD) method or an atomic layer deposition (ALD) method can be employed as a thermal CVD method, for example.

A thermal CVD method has an advantage that no defect due to plasma damage is generated since it does not utilize plasma for forming a film. Deposition by a thermal CVD method may be performed in the following manner: the pressure in a chamber is set to an atmospheric pressure or a reduced pressure, and a source gas and an oxidizer are supplied to the chamber at the same time, react with each other in the vicinity of the substrate or over the substrate, and are deposited on the substrate.

Deposition by an ALD method may be performed in the following manner: the pressure in a chamber is set to an atmospheric pressure or a reduced pressure, source gases for reaction are sequentially introduced into the chamber, and then, the sequence of the gas introduction is repeated. For example, two or more kinds of source gases are sequentially supplied to the chamber by switching respective switching valves (also referred to as high-speed valves). In this case, a first source gas is introduced, an inert gas (e.g., argon or nitrogen) or the like is introduced at the same time as the first source gas or after the first source gas is introduced so that the source gases are not mixed, and then, a second source gas is introduced. In the case where the first source gas and the inert gas are introduced at the same time, the inert gas serves as a carrier gas, and the inert gas may also be introduced at the same time as the second source gas. Alternatively, the first source gas may be exhausted by vacuum evacuation instead of the introduction of the inert gas, and then, the second source gas may be introduced. The first source gas is adsorbed on the surface of the substrate to form a first single-atomic layer; then, the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, so that a thin film with excellent step coverage can be formed. The thickness of the thin film can be adjusted by the number of times the sequence of the gas introduction is repeated; therefore, an ALD method makes it possible to accurately adjust thickness and thus is suitable for manufacturing a minute FET.

The conductive films and the semiconductor films which are described in the above embodiments can be formed by a thermal CVD method such as an MOCVD method or an ALD method. For example, in the case where an $InGaZnO_X$ (X>0) film is formed, trimethylindium, trimethylgallium, and diethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then, a $WF_6$ gas and an $H_2$ gas are sequentially introduced plural times to form a tungsten film. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are sequentially introduced plural times to form a GaO layer, and then, a $Zn(CH_3)_2$ gas and an $O_3$ gas are sequentially introduced plural times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Although an $H_2O$ gas which is obtained by bubbling with an inert gas such as Ar may be used instead of an $O_3$ gas, it is preferable to use an $O_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

The structures and methods described in this embodiment can be combined with any of the structures and methods described in the other embodiments as appropriate.

Embodiment 5

Figure 22A:
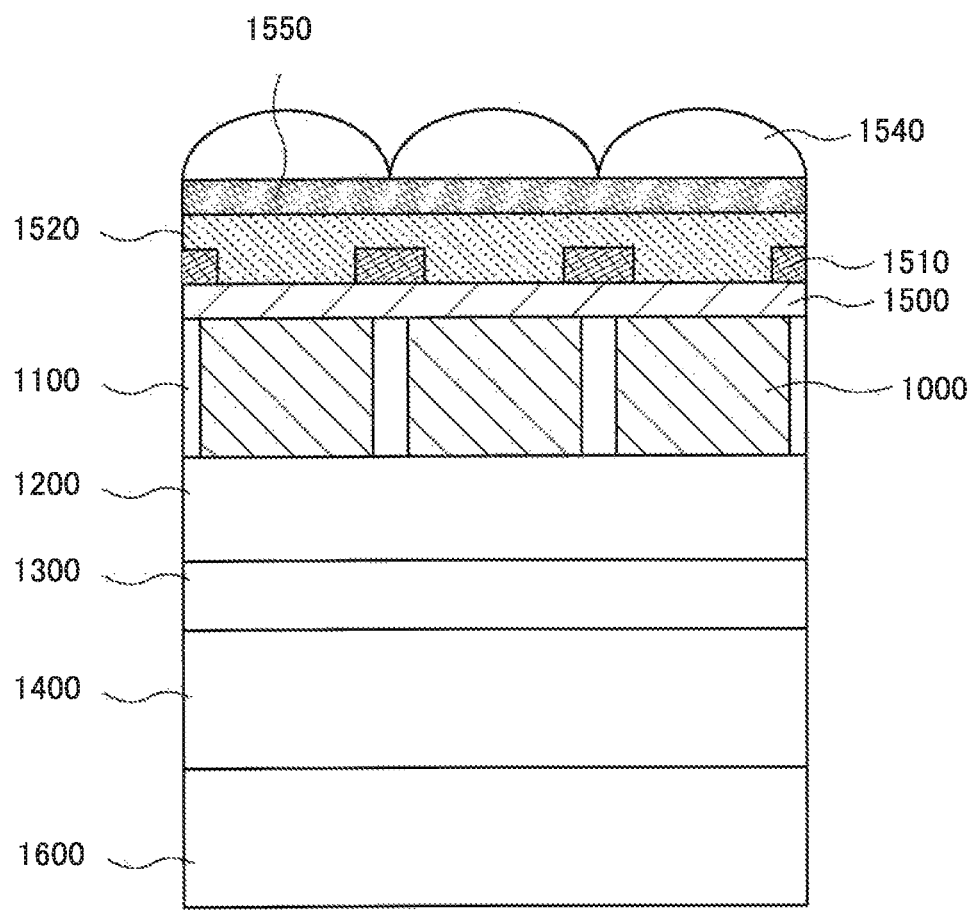
FIGS. 22A and 22B each illustrate an embodiment of the present invention.
Figure 22B:
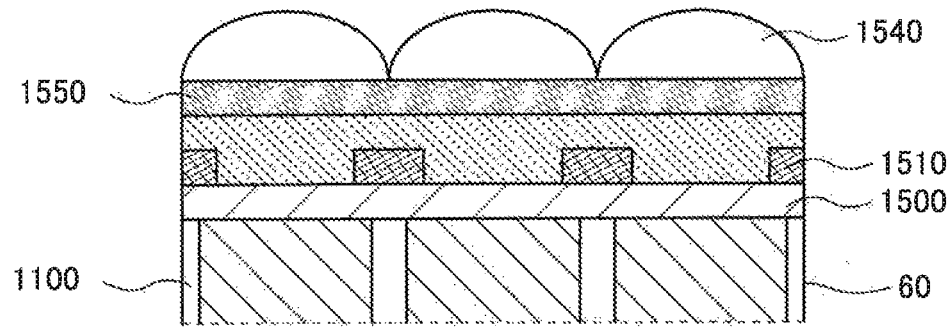
Figure 23A:
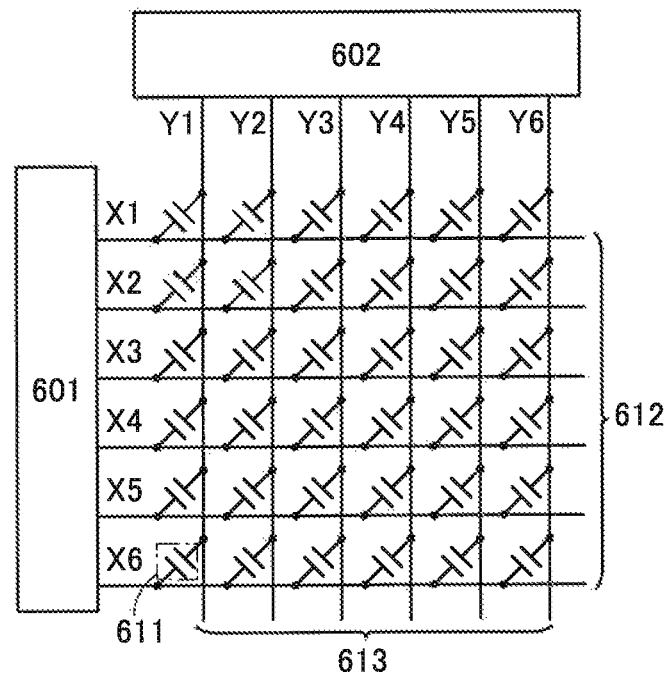
FIGS. 23A and 23B illustrate an embodiment of the present invention.
Figure 23B:
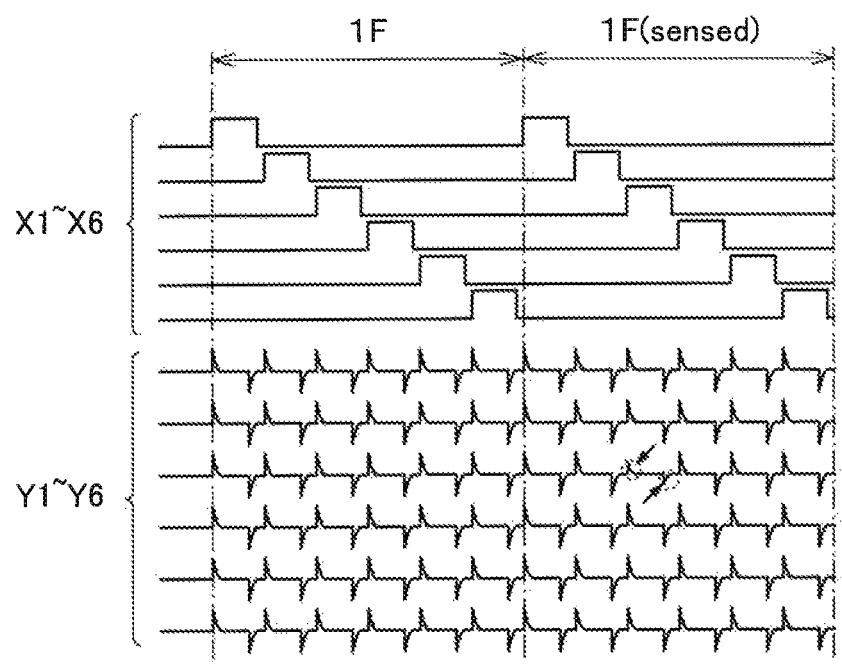

In this embodiment, a structure example of a sensor device in which the semiconductor device of one embodiment of the present invention is used will be described. FIGS. 22A and 22B illustrate an example of a photosensor, and FIGS. 23A and 23B illustrate an example of a touch sensor.

The photosensor in FIG. 22A includes a layer 1100 which includes a Si transistor and a photoelectric conversion element 1000, a layer 1200 which is provided in contact with the layer 1100 and includes a wiring layer, a layer 1300 which is provided in contact with the layer 1200 and includes an OS transistor, and a layer 1400 which is provided in contact with the layer 1300 and includes a wiring layer. An insulating layer 1500 is formed over the photoelectric conversion element 1000 in the layer 1100. A supporting substrate 1600 is provided in contact with the layer 1400. Note that the layers 1200, 1300, and 1400 can be omitted as illustrated in FIG. 22B.

A light-blocking layer 1510 is formed over the insulating layer 1500. An organic resin layer 1520 is formed as a planarization film over the insulating layer 1500 and the light-blocking layer 1510. An optical conversion layer 1550 is formed over the organic resin layer 1520. A microlens array 1540 is provided over the optical conversion layer 1550, so that light penetrating a lens is delivered through the photoelectric conversion layer 1550 directly below the lens to the photoelectric conversion element 1000. Note that the layers over the insulating layer 1500, that is, the light-blocking layer 1510, the organic resin layer 1520, the optical conversion layer 1550, and/or the microlens array 1540 can be omitted.

Note that the OS transistor included in the layer 1300 may be provided in the same layer as another transistor of the semiconductor device. In this case, reduction in cost or size can be achieved because the sensor circuit and the semiconductor device can be manufactured in the same process.

FIG. 23A is a block diagram illustrating the structure of a mutual capacitive touch sensor. FIG. 23A illustrates a pulse voltage output circuit 601 and a current detection circuit 602. In FIG. 23A, six wirings X1 to X6 represent wirings 612 to which pulse voltage is applied, and six wirings Y1 to Y6 represent wirings 613 for detection of changes in current. FIG. 23A also illustrates a capacitor 611 formed using the wirings 612 and 613 overlapping with each other.

The pulse voltage output circuit 601 is a circuit for sequentially applying pulse voltage to the wirings X1 to X6. By application of the pulse voltage to the wirings X1 to X6, an electric field is generated between the wirings 612 and 613 that form the capacitor 611. When the electric field between the wirings is shielded, for example, a change occurs in the mutual capacitance of the capacitor 611. Proximity or contact of an object can be sensed by utilizing the change.

The current detection circuit 602 is a circuit for detecting changes in the current flowing through the wirings Y1 to Y6 caused by the change in the mutual capacitance of the capacitor 611. No change in current value is detected in the wirings Y1 to Y6 when there is no proximity or contact of an object, whereas a decrease in current value is detected when the mutual capacitance is decreased owing to proximity or contact of an object. Note that an integrator circuit or the like may be used for measuring the current.

FIG. 23B is a timing chart of input and output waveforms in the mutual capacitive touch sensor in FIG. 23A. In FIG. 23B, sensing an object is performed in all the rows and columns in one frame period (1F). FIG. 23B illustrates a period in which an object is sensed and a period in which no object is sensed. For the wirings Y1 to Y6, measured current values are shown as voltage waveforms.

Pulse voltage is sequentially applied to the wirings X1 to X6, and waveforms of the wirings Y1 to Y6 change in accordance with the pulse voltage. When there is no proximity or contact of an object, the waveforms of the wirings Y1 to Y6 change in accordance with changes in the voltage of the wirings X1 to X6. When there is proximity or contact of an object, the current value is decreased at the point of proximity or contact of the object, and accordingly, the voltage waveform changes.

By detecting a change in mutual capacitance in this manner, proximity or contact of an object can be sensed. The configuration is not limited to that in FIGS. 23A and 23B, and another touch sensor may be used.

This embodiment can be implemented in combination with any of the other embodiments as appropriate.

Embodiment 6

In this embodiment, an electronic component and an electronic device or the like including the electronic component will be described as examples of a semiconductor device.

Figure 24A:
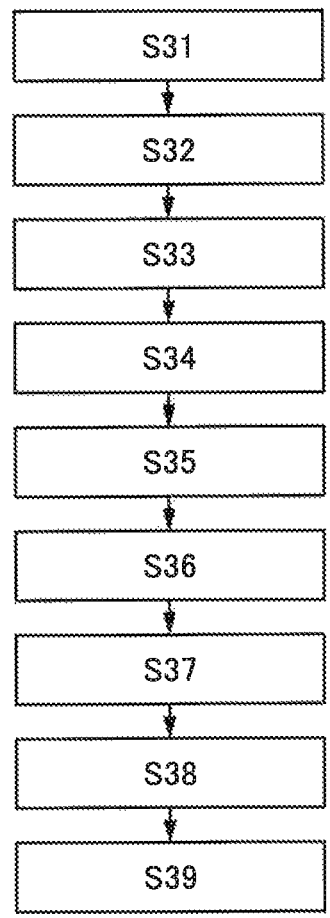
FIGS. 24A and 24B illustrate an embodiment of the present invention.

FIG. 24A is a flow chart showing an example of a method for manufacturing an electronic component. The electronic component is also referred to as a semiconductor package, an IC package, or a package. This electronic component has various standards and names corresponding to the direction and the shape of terminals. Therefore, an example of the electronic component will be described in this embodiment.

A semiconductor device including a transistor is completed by integrating detachable components on a printed board through an assembly process (post-process). The post-process can be completed through the steps in FIG. 24A. Specifically, after an element substrate is completed in a pre-process (Step S31), a dicing step in which the substrate is divided into a plurality of chips is performed (Step S32). Before the substrate is divided into plural pieces, the substrate is thinned to reduce warpage or the like of the substrate caused in the pre-process and to reduce the size of the component.

The chip is picked up, mounted on a lead frame, and bonded thereto in a die bonding step (Step S33). In the die bonding step, the chip may be bonded to the lead frame with a resin or a tape. As the bonding method, a method suitable for the product may be selected. In the die bonding step, the chip may be mounted on an interposer and bonded thereto. In a wire bonding step, a lead of the lead frame and an electrode on the chip are electrically connected to each other with a metal wire (Step S34). As the metal wire, a silver wire or a gold wire can be used. The wire bonding may be either ball bonding or wedge bonding.

A molding step is performed to seal the wire-bonded chip with an epoxy resin or the like (Step S35). After being plated, the lead of the lead frame is cut and processed (Step S36). The plating process prevents rust of the lead and facilitates soldering at the time of mounting on a printed board in a later step. Printing (marking) is performed on the package surface (Step S37). After a testing step (Step S38), the electronic component is completed (Step S39). An electronic component including the semiconductor device described in the above embodiment can achieve low power consumption and a small size.

Figure 24B:
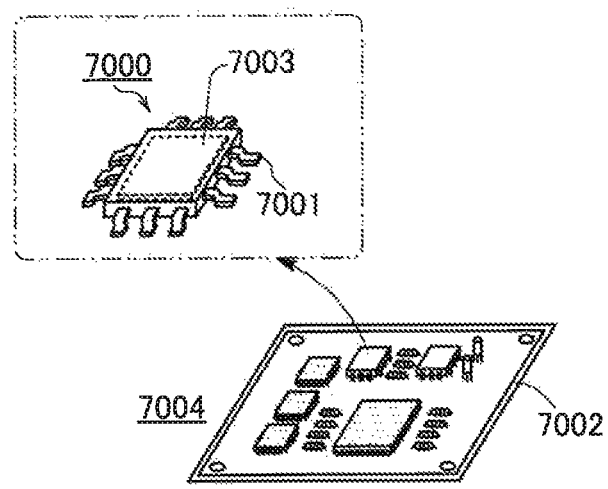

FIG. 24B is a perspective schematic view of the completed electronic component. As an example, FIG. 24B illustrates a quad flat package (QFP). In FIG. 24B, an electronic component 7000 includes a lead 7001 and a circuit portion 7003. The circuit portion 7003 includes, for example, the semiconductor device or the sensor device described in the above embodiment and a logic circuit. The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. The electronic component 7000 can be used as, for example, a random access memory that stores data or a processing unit that executes various kinds of processing, such as a CPU, an MCU, an FPGA, or a wireless IC. When an electronic device includes the electronic component 7000, the power consumption of the electronic device can be reduced, or a size reduction of the electronic device can be easily achieved.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electronic device can be used for display devices, personal computers (PC), and image reproducing devices provided with recording media (devices which reproduce the content of recording media such as DVDs, Blu-ray discs, flash memories, and HDDs and have display portions for displaying images). Other examples of an electronic device that can be equipped with the semiconductor device of one embodiment of the present invention include cellular phones, game machines including portable game machines, portable data terminals, e-book readers, cameras (e.g., video cameras and digital still cameras), wearable display devices (e.g., head mounted display devices, goggle-type display devices, glasses-type display devices, armband-type display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

A portable game machine 900 in FIG. 25A includes a housing 901, a housing 902, a display portion 903, a display portion 904, a microphone 905, a speaker 906, an operation key 907, a stylus 908, and the like.

A portable information terminal 910 in FIG. 25B includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and the angle between the housings 911 and 912 can be changed with the joint 915. Images displayed on the display portion 913 may be switched depending on the angle between the housings 911 and 912 at the joint 915. A display device with a touch panel may be used as the display portion 913 and/or the display portion 914.

A laptop 920 in FIG. 25C includes a housing 921, a display portion 922, a keyboard 923, a pointing device 924, and the like.

An electric refrigerator-freezer 930 in FIG. 25D includes a housing 931, a refrigerator door 932, a freezer door 933, and the like.

A video camera 940 in FIG. 25E includes a housing 941, a housing 942, a display portion 943, an operation key 944, a lens 945, a joint 946, and the like. The operation key 944 and the lens 945 are provided in the housing 941, and the display portion 943 is provided in the housing 942. The housings 941 and 942 are connected to each other with the joint 946, and the angle between the housings 941 and 942 can be changed with the joint 946. The direction of an image displayed on the display portion 943 may be changed and display/non-display of an image may be switched depending on the angle between the housings 941 and 942, for example.

A motor vehicle 950 in FIG. 25F includes a car body 951, wheels 952, a dashboard 953, lights 954, and the like.

The structures and methods described in this embodiment can be combined with any of the structures and methods described in the other embodiments as appropriate.

Embodiment 7

In this embodiment, application examples of the semiconductor device of one embodiment of the present invention will be described.

The semiconductor device of one embodiment of the present invention can acquire a predetermined physical or chemical quantity as described in the above embodiment. Thus, biological information of a person, an animal, or the like that carries the semiconductor device can be continuously acquired anywhere and anytime.

In the case where a person carries the semiconductor device, for example, possible methods include attachment to a body surface and implantation in the human body; an appropriate method may be selected in consideration of the physical or chemical quantity to be acquired. FIGS. 26A to 26E illustrate specific application examples of the semiconductor device of the present invention.

Figure 26A:
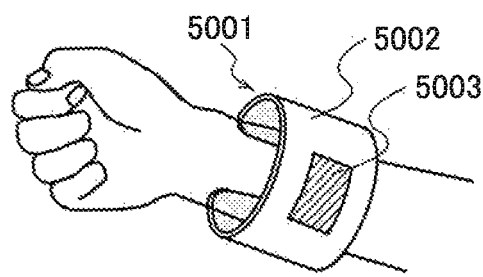
FIGS. 26A to 26E each illustrate an embodiment of the present invention.

FIG. 26A illustrates a bangle-type electronic device 5001, and a semiconductor device 5003 is provided in a housing 5002. When the electronic device 5001 is worn on the wrist or arm such that the semiconductor device 5003 is in contact therewith, biological information such as body temperature or blood pressure can be acquired from the wrist or arm. Note that the electronic device 5001 can also be worn on the waist or leg. Furthermore, a belt or the like can be used instead of the housing 5002. The biological information acquired by the semiconductor device 5003 can be read out by a reader/writer or the like.

Figure 26B:
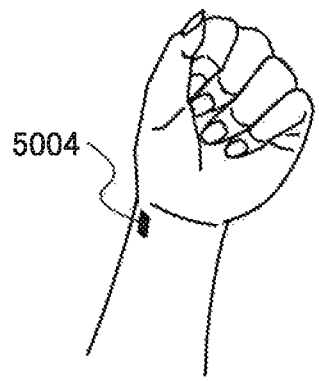
Figure 26C:
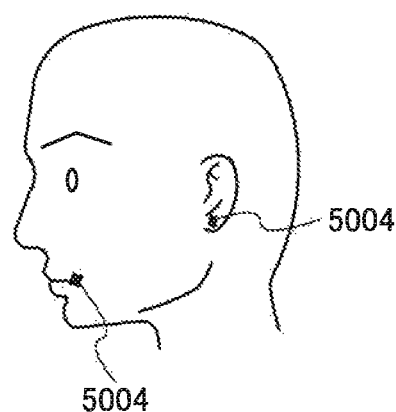

The semiconductor device can also be implanted in the body. FIG. 26B illustrates an application example in the case where a semiconductor device 5004 is implanted in the wrist. In this case, the user can carry the semiconductor device 5004 without using a housing or a belt, which saves time and effort for attaching/detaching it. Without being limited to the wrist, the semiconductor device 5004 can be implanted in any part of the human body, such as in the mouth or earlobe (FIG. 26C).

Figure 26D:
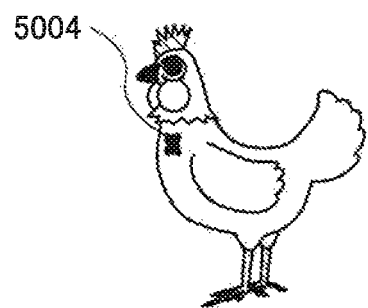

As illustrated in FIG. 26D, the semiconductor device 5004 can be attached to or implanted in an animal. Biological information of the animal acquired by the semiconductor device 5004 is read out regularly, whereby the health condition of the animal can be monitored and managed. In this case, it is possible to manage a plurality of animals simultaneously with identification numbers stored in the semiconductor devices 5004 in advance.

Figure 26E:
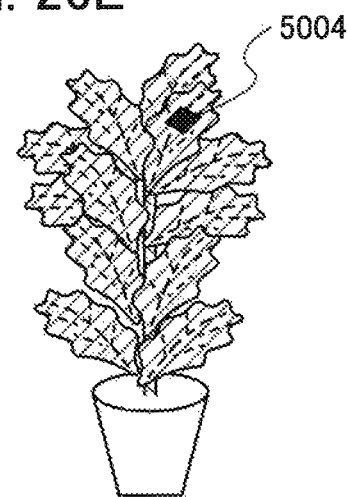

As illustrated in FIG. 26E, the semiconductor device 5004 can be attached to or implanted in a plant. Biological information of the plant acquired by the semiconductor device 5004 is read out regularly, whereby the flowering time, the shipping time, or the like can be expected from the information. When the semiconductor device 5004 includes an element for detecting light, information on sunshine duration can be obtained. When the semiconductor device 5004 includes a solar cell, the semiconductor device 5004 can operate with power obtained by conversion of light from the outside.

Figure 27:
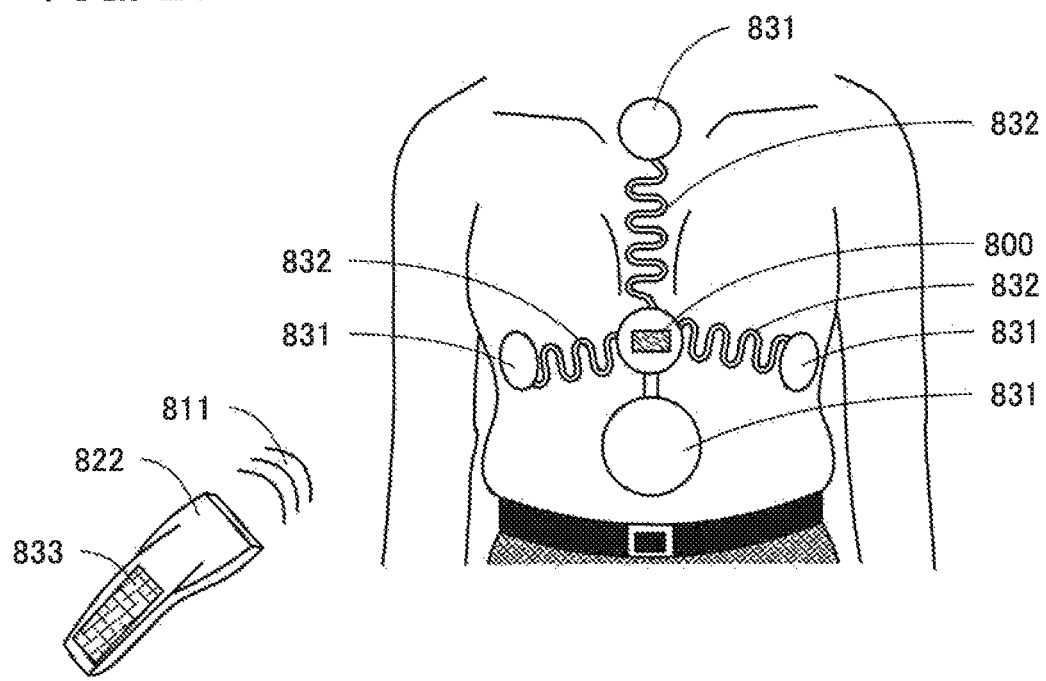
FIG. 27 illustrates an embodiment of the present invention.

Another application example of the semiconductor device of one embodiment of the present invention will be described using the schematic view in FIG. 27. For example, a wireless sensor 800 is attached to a human body with the use of a bond pad or the like, and a radio signal 811 is sent from an interrogator 822. Having received the radio signal 811, the wireless sensor 800 can obtain information such as biological information by supplying a signal to an electrode 831 or the like attached to the human body through a wiring 832, and send the information. The obtained information can be checked on a display portion 833 of the interrogator 822.

In this manner, the semiconductor device of one embodiment of the present invention is attached to or implanted in living things such as persons, animals and plants, whereby biological information of individual living things can be easily acquired.

Applications of one embodiment of the present invention are not limited to the above examples. The semiconductor device of one embodiment of the present invention can be used for various electronic devices such as thermometers, hygrometers, sphygmomanometers, weight scales, display devices, personal computers, image reproducing devices provided with recording media (typically, devices which reproduce the content of recording media such as digital versatile discs (DVDs) and have displays for displaying the reproduced images), cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices.

This embodiment can be implemented in combination with any of the other embodiments as appropriate.

Embodiment 8

In this embodiment, application examples of the wireless sensor including the semiconductor device described in the above embodiment will be described with reference to FIGS. 28A to 28C and FIGS. 29A and 29B.

Figure 28A:
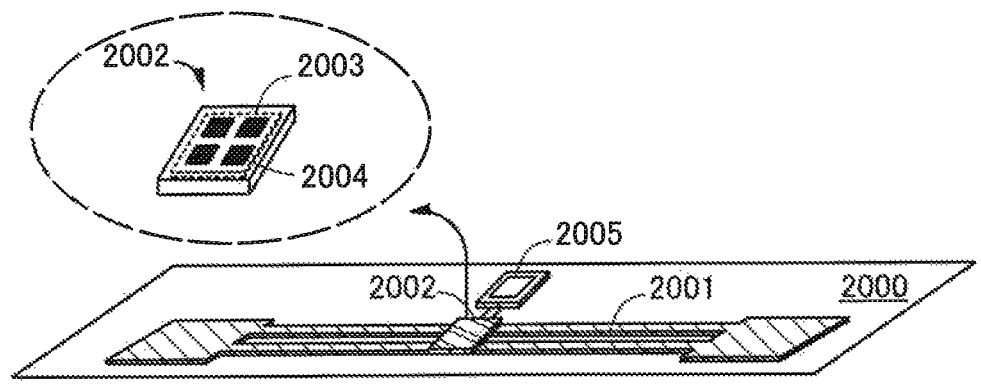
FIGS. 28A to 28C illustrate an embodiment of the present invention.

FIG. 28A is a schematic view of a wireless sensor. As illustrated in FIG. 28A, a wireless sensor 2000 includes an antenna 2001, an integrated circuit portion 2002, and a sensor circuit 2005.

The antenna 2001 may have a size and a shape suitable for the application in the range under the radio law. For example, a dipole antenna, a patch antenna, a loop antenna, or a Yagi antenna can be used.

The integrated circuit portion 2002 includes a circuit 2003 including a Si transistor and an OS transistor and a terminal portion 2004 for connection to the antenna. The circuit 2003 is formed through a pre-process for forming the Si transistor and the OS transistor. The terminal portion 2004 is formed through a post-process for forming a chip in a dicing step and a bonding step. The integrated circuit portion 2002 is also referred to as a semiconductor package or an IC package. Note that the sensor circuit 2005 is provided in or externally attached to the integral circuit portion 2002.

The sensor circuit 2005 has a function of outputting a variety of information such as thermal or electromagnetic information as analog data. Depending on the size, the sensor circuit 2005 may be provided outside the wireless sensor 2000.

Figure 28B:

In FIG. 28B, which is a schematic view of the wireless sensor 2000 in FIG. 28A, the wireless sensor 2000 receives a radio signal 2011. The wireless sensor 2000 generates power in response to the radio signal 2011 transmitted from the outside. The sensor circuit 2005 and the integrated circuit portion 2002 operate with the power generated in the wireless sensor 2000.

Figure 28C:
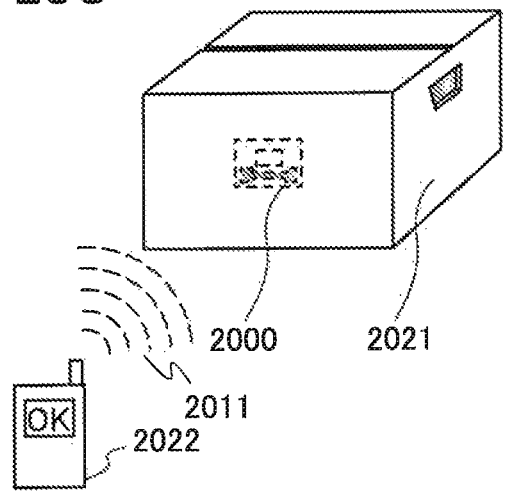

An application form of such a wireless sensor can be described using the schematic view in FIG. 28C. For example, the radio signal 2011 is sent from an external interrogator 2022 to the wireless sensor 2000 attached to or provided inside an item 2021. Having received the radio signal 2011, the wireless sensor 2000 can obtain information such as temperature with the use of the sensor without touching the item 2021 and send the information to the interrogator 2022.

Figure 29A:
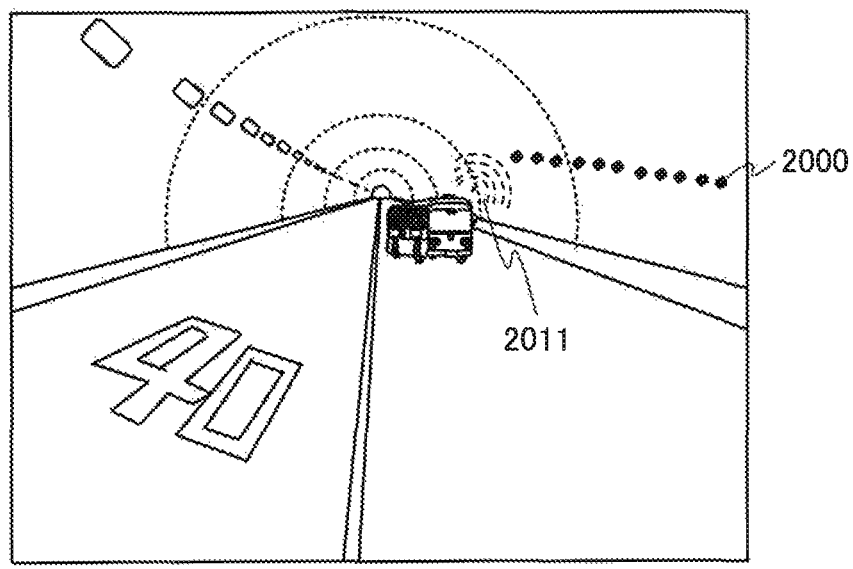
FIGS. 29A and 29B each illustrate an embodiment of the present invention.

Another application form of the wireless sensor can be described using the schematic view in FIG. 29A. For example, the radio signal 2011 is sent from the outside to the wireless sensor 2000 embedded in a tunnel wall surface. Having received the radio signal 2011, the wireless sensor 2000 can obtain information on the tunnel wall surface with the use of the sensor and send the information. Thus, the wireless sensor 2000 can obtain information on the tunnel wall surface without directly touching the tunnel wall surface.

Figure 29B:
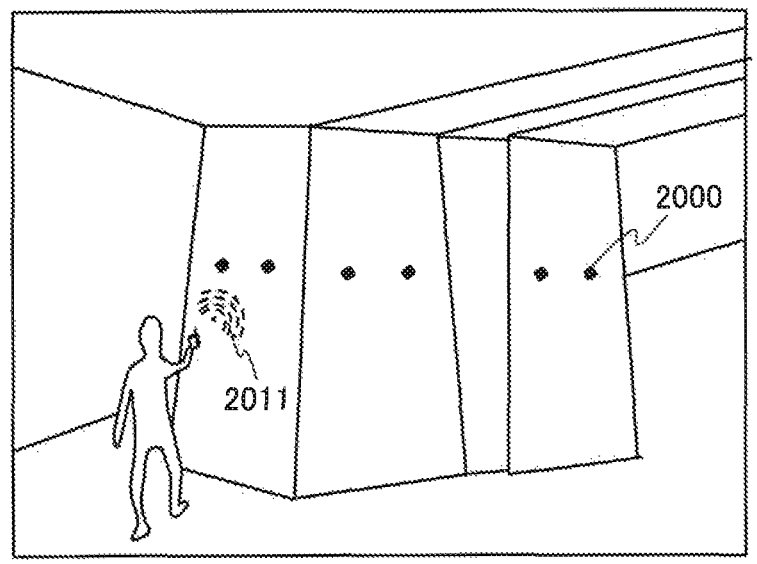

Another application form of the wireless sensor can be described using the schematic view in FIG. 29B. For example, the radio signal 2011 is sent from the outside to the wireless sensor 2000 embedded in a surface of a pillar of a bridge. Having received the radio signal 2011, the wireless sensor 2000 can obtain information sent from the pillar of the bridge with the use of the sensor and send the information. Thus, the wireless sensor 2000 can obtain information sent from the pillar of the bridge without directly touching the pillar.

This embodiment can be combined with any of the other embodiments as appropriate.

This application is based on Japanese Patent Application serial no. 2014-255693 filed with Japan Patent Office on Dec. 18, 2014, the entire contents of which are hereby incorporated by reference.

What is claimed is:

1. A semiconductor device comprising:
   a sensor portion;
   a memory portion; and
   a control portion,
   wherein the sensor portion is configured to acquire data,
   wherein the memory portion is configured to store the data, and output the data to the control portion when an amount of data stored in the memory portion reaches a reference value, wherein the memory portion comprises a memory circuit,
wherein the memory circuit comprises a counter, and
wherein the counter is configured to count a number of sets of the data stored in the memory portion.

2. The semiconductor device according to claim 1,
wherein the memory portion comprises a switch circuit,
wherein the switch circuit is electrically connected to a power supply line and the memory circuit, and
wherein the memory circuit is brought into a resting state when the switch circuit is turned off.

3. The semiconductor device according to claim 1, wherein the control portion comprises a power management unit and a central processing unit.

4. The semiconductor device according to claim 1, wherein the memory portion comprises a transistor that comprises a channel formation region comprising an oxide semiconductor.

5. An electronic device comprising the semiconductor device according to claim 1, wherein the electronic device comprises at least one of a lens, a display portion, and an operation key.

6. A semiconductor device comprising:
a sensor portion;
a memory portion;
a control portion; and
a battery,
wherein the sensor portion is configured to acquire data,
wherein the memory portion is configured to store the data, and output the data to the control portion when an amount of data stored in the memory portion reaches a reference value,
wherein the battery is configured to supply power to the control portion in accordance with a signal output from the memory portion,
wherein the memory portion comprises a memory circuit,
wherein the memory circuit comprises a counter, and
wherein the counter is configured to count a number of sets of the data stored in the memory portion.

7. The semiconductor device according to claim 6,
wherein the memory portion comprises a switch circuit,
wherein the switch circuit is electrically connected to a power supply line and the memory circuit, and
wherein the memory circuit is brought into a resting state when the switch circuit is turned off.

8. The semiconductor device according to claim 6, wherein the control portion comprises a power management unit and a central processing unit.

9. The semiconductor device according to claim 6, wherein the memory portion comprises a transistor that comprises a channel formation region comprising an oxide semiconductor.

10. An electronic device comprising the semiconductor device according to claim 6, wherein the electronic device comprises at least one of a lens, a display portion, and an operation key.

* * * * *